United States Patent
Ripley et al.

(10) Patent No.: US 9,712,197 B2
(45) Date of Patent: Jul. 18, 2017

(54) TUNABLE NOTCH FILTER AND CONTOUR TUNING CIRCUIT

(71) Applicant: Skyworks Solutions, Inc., Woburn, MA (US)

(72) Inventors: David Steven Ripley, Marion, IA (US); Edward F. Lawrence, Marion, IA (US); Joshua Kawika Ellis, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/247,639

(22) Filed: Aug. 25, 2016

(65) Prior Publication Data

US 2017/0063412 A1 Mar. 2, 2017

Related U.S. Application Data

(60) Provisional application No. 62/211,557, filed on Aug. 28, 2015, provisional application No. 62/213,546, filed on Sep. 2, 2015.

(51) Int. Cl.
| | |
|---|---|
| *H04B 1/04* | (2006.01) |
| *H03H 7/01* | (2006.01) |
| *H03H 7/46* | (2006.01) |
| *H04B 1/10* | (2006.01) |

(52) U.S. Cl.
CPC ... *H04B 1/1036* (2013.01); *H04B 2001/0408* (2013.01)

(58) Field of Classification Search
CPC .......... H04B 1/10; H04B 1/1036; H04B 1/04; H04B 1/0458; H04B 1/0475; H03H 7/01; H03H 7/0123; H03H 7/46; H03H 7/468
See application file for complete search history.

(56) References Cited

U.S. PATENT DOCUMENTS

| | | |
|---|---|---|
| 8,982,007 B2 | 3/2015 | Davidson |
| 9,002,309 B2 | 4/2015 | Sahota et al. |
| 9,118,376 B2 | 8/2015 | Khlat et al. |
| 9,178,493 B1 | 11/2015 | Nobbe |
| 9,190,699 B2 * | 11/2015 | Granger-Jones .......... H01P 1/15 |
| 2009/0117871 A1 | 5/2009 | Burgener et al. |
| 2009/0295501 A1 | 12/2009 | Hayashi et al. |

(Continued)

OTHER PUBLICATIONS

PCT Written Opinion of Nov. 24, 2016 for International Patent Application No. PCT/US2016/048792, filed Aug. 25, 2016. 8 pages.

(Continued)

*Primary Examiner* — Blane Jackson
(74) *Attorney, Agent, or Firm* — Knobbe, Martens, Olson & Bear, LLP

(57) ABSTRACT

Aspects of this disclosure relate tuning an impedance presented to a common port of a multi-throw switch and a tunable notch filter coupled to the common port. The impedance presented to the common port can be tuned based on an impedance associated with a throw of the multi-throw switch that is activated. According to embodiments of this disclosure, a shunt inductor in parallel with a tunable capacitance circuit can tune the impedance presented to the common port of the multi-throw switch. In certain embodiments, the tunable notch filter includes a series LC circuit in parallel with a tunable impedance circuit.

20 Claims, 31 Drawing Sheets

(56) References Cited

U.S. PATENT DOCUMENTS

| | | |
|---|---|---|
| 2011/0105055 A1 | 5/2011 | Ilkov |
| 2011/0175687 A1 | 7/2011 | Morris, III |
| 2011/0241797 A1 | 10/2011 | Shana'a et al. |
| 2011/0294443 A1 | 12/2011 | Nohra et al. |
| 2012/0013398 A1 | 1/2012 | Dabiri et al. |
| 2012/0302188 A1 | 11/2012 | Sahota et al. |
| 2013/0109434 A1 | 5/2013 | Dupuy et al. |
| 2013/0154761 A1* | 6/2013 | Ilkov .................... H03H 7/465 333/101 |
| 2013/0207872 A1 | 8/2013 | Bakalski |
| 2013/0241666 A1 | 9/2013 | Granger-Jones et al. |
| 2013/0250819 A1 | 9/2013 | Khlat et al. |
| 2013/0322309 A1 | 12/2013 | Smith |
| 2014/0028368 A1 | 1/2014 | Khlat |
| 2014/0055210 A1 | 2/2014 | Black et al. |
| 2014/0104132 A1 | 4/2014 | Bakalski et al. |
| 2014/0112213 A1 | 4/2014 | Norholm et al. |
| 2014/0120968 A1 | 5/2014 | Mahmood |
| 2014/0167878 A1 | 6/2014 | Lee |
| 2014/0273887 A1 | 9/2014 | Black et al. |
| 2014/0285286 A1* | 9/2014 | Bojer ................... H03H 7/0153 333/174 |
| 2015/0091776 A1 | 4/2015 | Gaynor et al. |
| 2015/0214995 A1 | 7/2015 | Kanemaru |
| 2015/0236671 A1 | 8/2015 | Smith et al. |
| 2016/0126990 A1 | 5/2016 | Leipold et al. |

OTHER PUBLICATIONS

PCT International Search Report of Nov. 24, 2016 for International Patent Application No. PCT/US2016/048792, filed Aug. 25, 2016. 3 pages.

\* cited by examiner

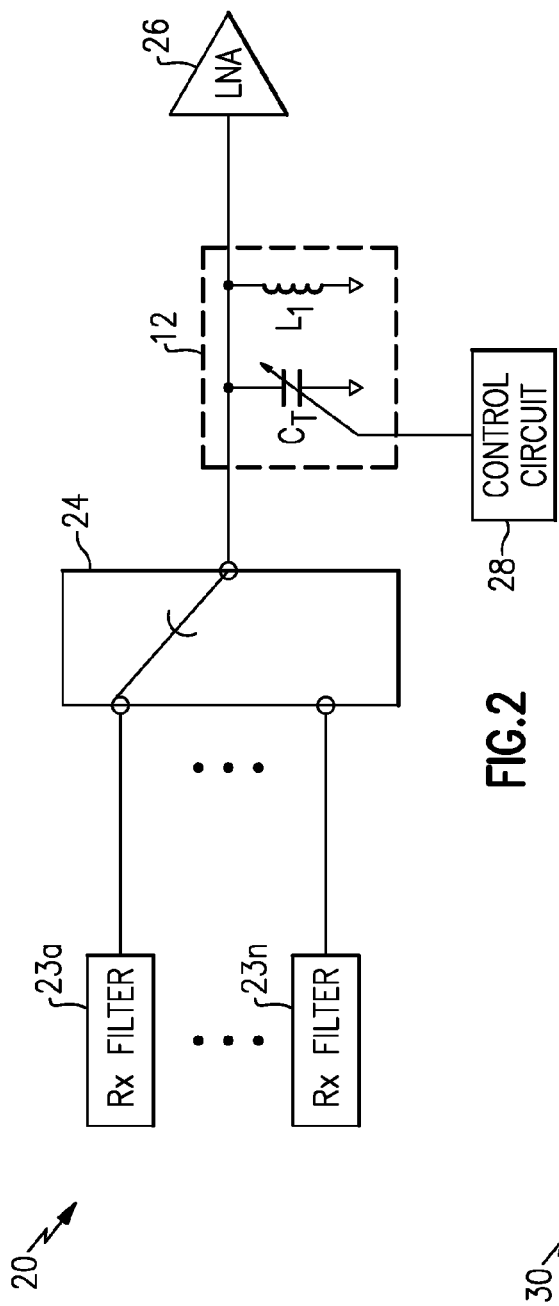
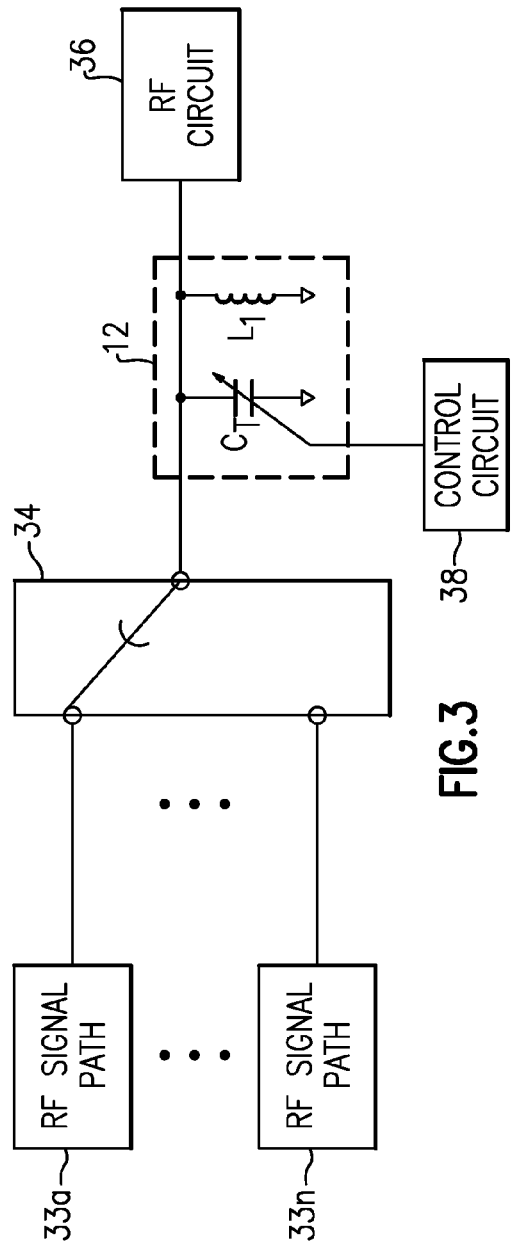
FIG.2
FIG.3

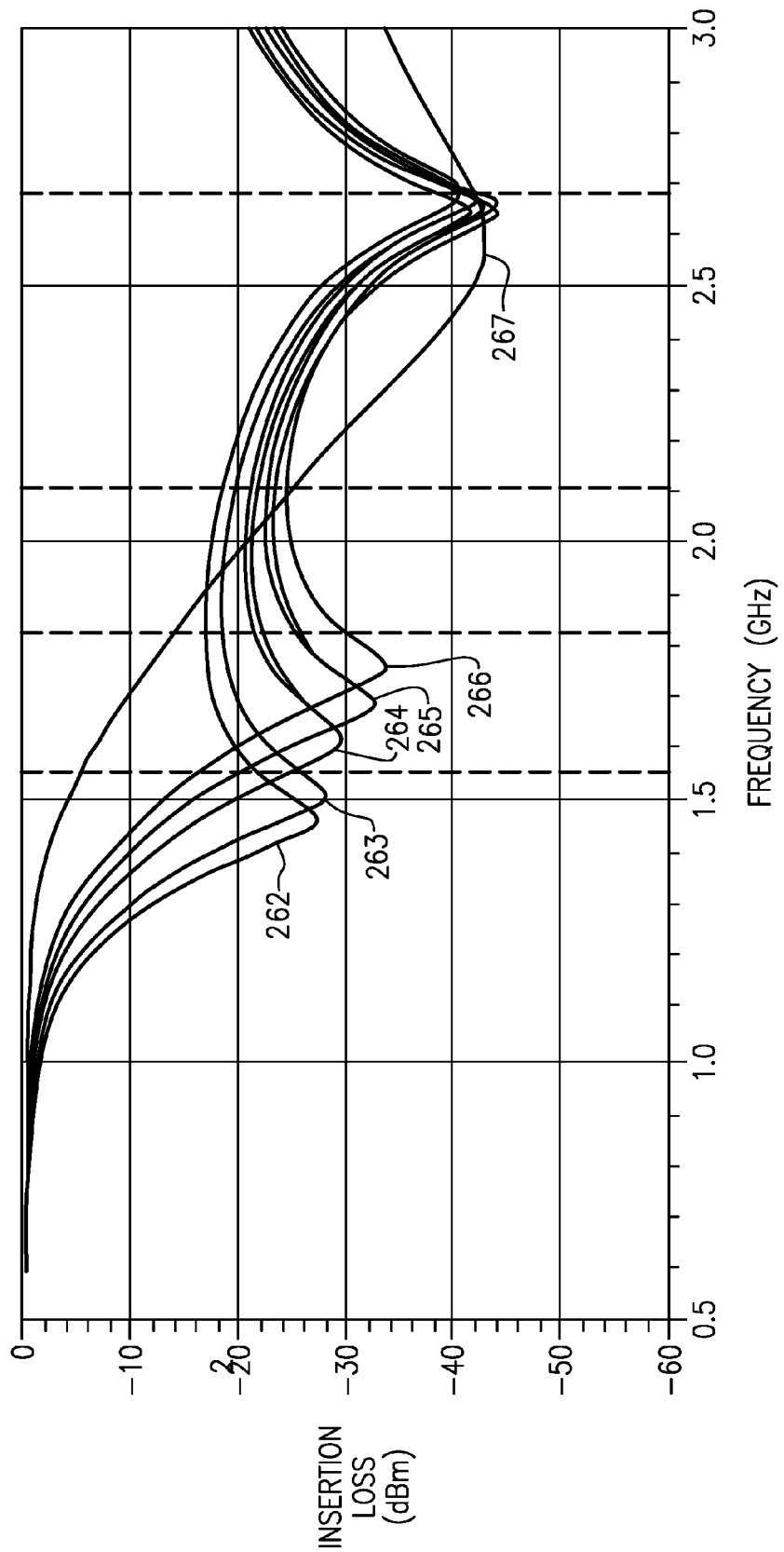

TUNABLE NOTCH FILTER AND CONTOUR TUNING CIRCUIT

CROSS REFERENCE TO PRIORITY APPLICATIONS

This application claims the benefit of priority of U.S. Provisional Patent Application No. 62/211,557, filed Aug. 28, 2015 and titled "TUNABLE NOTCH FILTER," the disclosure of which is hereby incorporated by reference in its entirety herein. This application also claims the benefit of priority of U.S. Provisional Patent Application No. 62/213, 546, filed Sep. 2, 2015 and titled "TUNABLE ANTENNA FILTER," the disclosure of which is hereby incorporated by reference in its entirety herein.

BACKGROUND

Technical Field

Embodiments of this disclosure relate to electronic systems and, in particular, to radio frequency systems.

Description of Related Technology

A radio frequency (RF) telecommunications system can transmit and/or receive RF signals that meet demands of high density, high speed operation. Wireless communication devices, such as mobile phones, can include RF systems and transmit and receive signals in a cellular network. RF systems can include RF circuitry such as filters, RF amplifiers, and RF switches arranged to process RF signals.

RF systems can process signals associated with multiple frequency bands. To support the proliferation of frequency bands, there can be a number of different signal paths associated with different frequency bands in an RF system. Such RF systems can include RF circuitry between an antenna and a transceiver. The RF circuitry can include filters, RF amplifiers, and RF switches arranged to process signals associated with various frequency bands. The RF circuitry can be arranged such that RF signals associated with different frequency bands are processed in a manner that is tailored to a specific frequency band. For instance, RF signals within different frequency bands can be filtered in a manner that is tailored so as to reject frequencies outside of their respective frequency bands. Alternatively or additionally, the RF circuitry can be arranged such that RF signals associated with different signal paths are processed in a manner that is tailored to a specific signal path.

Carrier aggregation in the cellular networks has been a driver for significant improvement in transmit harmonic levels such that a transmitter of a mobile phone may not significantly regrade receiver signals. It can be desirable to implement filtering without significantly degrading insertion loss to prevent the transmitter from degrading receiver signals.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a radio frequency circuit that includes an antenna switch having multiple throws, a tunable circuit, and a tunable notch filter. The tunable circuit is configured to adjust an effective shunt impedance in a signal path from the antenna switch to an antenna port in association with a state of the antenna switch changing. The tunable notch filter is coupled in series between the antenna switch and the antenna port. The tunable notch filter is configured to filter a radio frequency signal propagating between the antenna switch and the antenna port.

The tunable notch filter can be tuned so as to have a frequency response with a notch at a second harmonic frequency of the radio frequency signal. The tunable notch filter can include a series circuit in parallel with a tunable capacitance circuit. The tunable capacitance circuit and the antenna switch can be integrated on a common semiconductor die. The series LC circuit can be inductive at frequencies above a resonant frequency of the series LC circuit so as to create a parallel resonance with the tunable capacitance circuit. The radio frequency can further include a control circuit configured to control the tunable capacitance circuit of the tunable notch filter such that an effective capacitance in parallel with the series LC circuit corresponds to a frequency of the radio frequency signal.

The tunable circuit can include a shunt inductor in parallel with a tunable capacitance circuit. The radio frequency circuit can further include a control circuit configured to control the tunable circuit so as to provide a first effective shunt impedance when a first throw of the antenna switch is active and to provide a second effective impedance when a second throw of the antenna switch is active.

The radio frequency circuit can further include a control circuit configured to set a state of the tunable circuit based on an impedance associated with a trace arranged to route from a duplexer to a throw of the antenna switch that is activated. Alternatively or additionally, the radio frequency circuit can include a trim and control circuit including non-volatile memory storing trim data. The trim and control circuit configured to set a state of the tunable notch filter based at least partly on the trim data. The antenna switch can have at least 8 throws, for example.

Another aspect of this disclosure is packaged module that includes a multi-throw switch, a tunable circuit, and a tunable notch filter. The multi-throw switch includes input/output ports and a common port. The multi-throw switch is configured to electrically connect a selected one of the input/output ports to the common port. The tunable circuit is configured to adjust an effective shunt impedance coupled to the common port in association with a state of the antenna switch changing. The tunable notch filter is coupled in series in a radio frequency signal path associated with the common port. The multi-throw switch, the tunable circuit, and the tunable notch filter are included within a common package.

The tunable circuit can include a shunt inductor in parallel with a tunable capacitance circuit. The tunable notch filter can include a series LC circuit in parallel with a tunable capacitance circuit. The tunable notch filter can provide rejection at a second harmonic of a radio frequency signal propagating between the common port and the tunable notch filter.

The packaged module can further include a trim and control circuit including memory arranged to store trim data. The trim and control circuit can set a state of the tunable notch filter based on the trim data.

The packaged module can further include a power amplifier included within the common package.

Another aspect of this disclosure is a wireless communication device that includes an antenna configured to receive a radio frequency signal, an antenna switch, a tunable circuit, and a tunable notch filter. The antenna switch is configured to electrically couple a first radio frequency signal path to the antenna in a first state and to electrically couple a second radio frequency signal path to the antenna in a second state. The tunable circuit is configured to adjust an effective shunt impedance in a signal path from the antenna switch to the antenna in association with a state of the antenna switch changing. The tunable notch filter is coupled in series between the antenna switch and the antenna.

The wires communication device can be a mobile phone, such as a smart phone. The tunable circuit can be configurable into at least 8 states.

Another aspect of this disclosure is a radio frequency system that includes a multi-throw switch configured to provide a radio frequency signal, a shunt inductor, and a tunable capacitance circuit. The multi-throw switch has at least a first throw, a second throw, and a common port. The shunt inductor and the tunable capacitance circuit are coupled to the common port. The tunable capacitance circuit is configured to provide a first effective capacitance in parallel with the shunt inductor when the first throw is active and to provide a second effective capacitance in parallel with the shunt inductor when the second throw is active.

The radio frequency system can be arranged such that the radio frequency signal propagates between the common port of the multi-throw switch and an antenna port. The radio frequency system can further include a tunable notch filter electrically coupled between the common port and the antenna port. The tunable notch filter can include a series LC circuit in parallel with a second tunable capacitance circuit. The radio frequency system can further include a harmonic filter in series with the tunable notch filter.

The radio frequency system can further include a control circuit configured to set a state of the tunable capacitance circuit. The control circuit can set the state of the tunable capacitance circuit based at least partly on a characteristic of a throw of the multi-throw switch that is activated. The characteristic can be an impedance associated with the throw that is activated.

The multi-throw switch and the tunable capacitance circuit are integrated on a common semiconductor die. The multi-throw switch can include at least 8 throws. The first throw and the second throw of the multi-throw switch can be associated with different frequency bands. The tunable capacitance circuit can include series circuits each including a capacitor in series with a switch, and each of the series circuits are in parallel with the shunt inductor.

Another aspect of this disclosure is a packaged module that includes a multi-throw switch, an antenna port, a shunt inductor coupled in a signal path between the multi-throw switch and the antenna port, and a tunable capacitance circuit configured to provide different effective capacitances in parallel with the shunt inductor when different throws of the multi-throw switch are active. The tunable capacitance circuit, the shunt inductor, and the multi-throw switch are enclosed within a common package.

The packaged module can further include a control circuit configured to set a state of the tunable capacitance circuit to match an impedance associated with a throw of the multi-throw switch that is activated. The packaged module can further include a tunable notch filter electrically coupled between the multi-throw switch and the antenna port. The packaged module can further include a power amplifier enclosed within the common package. Different throws of the multi-throw switch can be associated with different respective frequency bands.

Another aspect of this disclosure is a method of tuning an impedance at a common port of a multi-throw switch. The method includes adjusting an effective capacitance in parallel with a shunt inductor coupled to the common port of the multi-throw switch in association with a state of the multi-throw switch changing.

Adjusting the effective impedance can include tuning a switch on to couple capacitor in parallel with the shunt inductor. The shunt inductor and the tunable capacitor can be coupled to a node is a signal path between the common port and an antenna port.

Another aspect of this disclosure is a wireless communication device that includes an antenna configured to transmit a radio frequency signal, an antenna switch configured to electrically couple a first radio frequency signal path to the antenna in a first state and to electrically couple a second radio frequency signal path to the antenna in a second state, and a tunable capacitance circuit in parallel with a shunt inductor coupled between the antenna switch and the antenna. The tunable capacitance circuit is configured to adjust an effective capacitance in parallel with the shunt inductor in association with a state of the antenna switch changing.

The wireless communication device can be a mobile phone. The tunable capacitance circuit can be configurable into at least 8 states.

Another aspect of this disclosure is a radio frequency system that includes a multi-throw switch configured to selectively electrically connect a radio frequency (RF) signal path to a common node of the multi-throw switch and a tunable filter electrically coupled between the common node and a voltage reference, such as a ground potential. The tunable filter is coupled to a node is a signal path between the common node and an antenna port. The tunable filter includes a tunable impedance circuit.

The tunable impedance circuit can be a tunable capacitance circuit. The tunable impedance circuit can be in parallel with a shunt inductor.

The radio frequency system can include a control circuit configured to set a state of the tunable impedance circuit based at least partly on which throw of the multi-throw switch is activated. The control circuit can set the state of the tunable impedance circuit based at least partly on a characteristic of an input of a throw of the multi-throw switch that is activated. The characteristic can be an impedance associated with the input of the throw that is activated.

The radio frequency system can include a tunable notch filter electrically coupled between the tunable filter and the antenna port. Tunable notch filter can includes a series LC circuit in parallel with a tunable capacitance circuit. The radio frequency system can include a harmonic filter electrically coupled between the tunable filter and the tunable notch filter. The harmonic filter can be an elliptical filter.

The tunable filter and the multi-throw switch can be included in an antenna switch module. In the antenna switch module, a package can enclose the multi-throw switch and the tunable filter. The packaged can also include a power amplifier. The multi-throw switch and at least a portion of the tunable filter can be integrated on a common die.

The common node of the multi-throw switch can be electrically connected to multiple throws of the multi-throw switch and each of the multiple throws can be electrically connected to a different RF signal path. The common node of the multi-throw switch can be electrically connected to each throw of the multi-throw switch. Different throws of the multi-throw switch can be associated with different respective frequency bands. Each throw of the multi-throw switch can include a shunt arm and a switch arm. The multi-throw switch can include at least 8 throws. The multi-throw switch can include a single pole.

Another aspect of this disclosure is a radio frequency system that includes a multi-throw switch, an antenna port, and a tunable circuit coupled to anode between the multi-throw switch and the antenna port. The tunable circuit includes a shunt inductor in parallel with a tunable capacitance circuit.

The radio frequency system can include a control circuit configured to set a state of the tunable capacitance circuit based at least partly on which throw of the multi-throw switch is activated. The control circuit can set the state of the tunable capacitance circuit based at least partly on a characteristic of an input of a throw of the multi-throw switch that is activated. The characteristic can be an impedance associated with the input of the throw that is activated.

The radio frequency system can include a tunable notch filter electrically coupled between the tunable circuit and the antenna port. The tunable notch filter can include a series LC circuit in parallel with a tunable capacitance circuit. The radio frequency system can include a harmonic filter electrically coupled between the tunable circuit and the tunable notch filter. The harmonic filter can be an elliptical filter.

An antenna switch module can include the multi-throw switch and the tunable filter within a common package. The multi-throw switch and at least a portion of the tunable circuit can be integrated on a common die, such as a semiconductor-on-insulator die. A power amplifier can be enclosed within the common package.

Different throws of the multi-throw switch can be associated with different respective frequency bands. Each throw of the multi-throw switch can include a shunt arm and a switch arm. The multi-throw switch can include at least 8 throws. The multi-throw switch can include a single pole.

Another aspect of this disclosure is a radio frequency system that includes an antenna switch having multiple throws, a low pass filter in a signal path between the antenna switch and an antenna port, and a tunable notch filter in the signal path between the antenna switch and the antenna port. The tunable notch filter includes a series LC circuit in parallel with a tunable impedance circuit. The series LC circuit is coupled in series between the antenna switch and the antenna port.

The tunable notch filter can provide a notch at a second harmonic frequency of a radio frequency signal propagating between the antenna switch and the antenna port. A radio frequency signal propagating between the antenna switch and the antenna port can have a power of at least 15 decibel-milliwatts. The series LC circuit can be inductive at frequencies above a resonant frequency of the series LC circuit. The series LC circuit can create a parallel resonance with the tunable impedance circuit to provide a notch in a frequency response of the tunable notch filter. The series LC circuit can effectively short the tunable impedance element at a frequency of a radio frequency signal propagating between the antenna switch and the antenna port.

The radio frequency system can further include a control circuit configured to control the tunable impedance circuit such that the impedance in parallel with the series LC circuit corresponds to a frequency of a radio frequency signal propagating between the antenna switch and the antenna port. The radio frequency system can include a control circuit configured to control the tunable impedance circuit so as to provide an impedance in parallel with the series LC circuit corresponding to a throw of the antenna switch that is activated.

The tunable impedance circuit can include a tunable capacitance circuit. The tunable capacitance circuit can include switches implemented on a silicon-on-insulator die on which the antenna switch is implemented. The tunable capacitance circuit can include a plurality of capacitors each in series with a respective switch.

The low pass filter can be an elliptical filter. The low pass filter can provide a short at a frequency of about 5 GHz. The low pass filter can provide a frequency trap at a third harmonic of a radio frequency signal being provided from the antenna switch to the antenna port.

The antenna switch can have at least 8 throws, for example. The antenna switch can have at least two poles in certain implementations.

The radio frequency system can further include a trim and control circuit including non-volatile memory storing trim data. The trim and control circuit can set a state of the tunable impedance circuit based at least partly on the trim data. According to certain implementations, non-volatile memory of the trim and control circuit includes fuse elements.

Another aspect of this disclosure is a packaged module that includes a multi-throw switch and a tunable notch filter. The multi-throw switch includes input/output ports and a common port. The multi-throw switch is configured to electrically connect a selected one of the input/output ports to the common port. The tunable notch filter includes a series LC circuit in parallel with a tunable impedance circuit. The tunable notch filter is coupled in series in a radio frequency signal path associated with the common port. The multi-throw switch and the tunable notch filter are enclosed within a common package.

The packaged module can further include a low pass filter in series with the tunable notch filter between the multi-throw switch and an antenna port. The tunable notch filter can provide rejection at a second harmonic of a carrier. The packaged module can further include a power amplifier included within the common package in some implementations. The packaged module can be a component for a mobile device.

The packaged module can further include a trim and control circuit including memory arranged to store trim data. The trim and control circuit can set a state of the tunable filter based at least partly on the trim data. The trim and control circuit can set the state of the tunable capacitance circuit based at least partly on adding trim data associated with a process trim state and data associated with notch tuning states. The trim data can represent a process variation associated with a fixed portion of the tunable notch filter.

Another aspect of this disclosure is a wireless communication device that includes an antenna, an antenna switch, and a tunable notch filter. The antenna is configured to transmit a radio frequency signal. The antenna switch is configured to electrically couple a first radio frequency signal path to the antenna in a first state and to electrically couple a second radio frequency signal path to the antenna in a second state. The tunable notch filter is coupled in series between the antenna switch and the antenna. The tunable notch filter includes a series LC circuit in parallel with a tunable impedance circuit.

The radio frequency signal can be carrier aggregated signal. The wireless communication device can be a smart phone. The radio frequency signal transmitted by the antenna can be filtered by the tunable notch filter and a low pass filter in series with the tunable notch filter.

Another aspect of this disclosure is a method of tuning a tunable notch filter that includes a series LC circuit in parallel with a tunable capacitance circuit. The method includes providing tuning data to the tunable capacitance to set a notch in a frequency response of the tunable filter at a first frequency. The method further includes adjusting the tuning data provided to the tunable capacitance circuit to move the notch in the frequency response of the tunable filter to a second frequency.

The method can include providing a radio frequency signal to the tunable notch filter by way of a multi-throw switch. The tunable notch filter can be in a signal path between the multi-throw switch and an antenna. In some other implementations, the tunable notch filter can be coupled between an output of a power amplifier and a common port of a multi-throw switch.

The tunable notch filter can suppress a second harmonic of a radio frequency signal being filtered by the tunable notch filter. A multi-throw switch can provide radio frequency signals in different frequency bands to the tunable notch filter. The first frequency can correspond to a second harmonic of a first radio frequency signal provided by the multi-throw switch and the second frequency can correspond to a second harmonic of a second radio frequency signal provided by the multi-throw switch.

The method can include adding trim data representative of a process variation of the series LC circuit with notch tuning data to generate the tuning data. The method can include accessing the trim data from non-volatile memory.

Another aspect of this disclosure is a packaged module that includes a trim circuit including memory to store trim data, a tunable filter in a radio frequency signal path, and a control circuit configured to set a state of the tunable filter based on the trim data and data indicative of a desired characteristic of the tunable filter. The trim circuit, the tunable filter, and the control circuit are included within a common package.

The radio frequency signal path can be between an antenna switch module and an antenna port.

The tunable filter can include a series LC circuit in parallel with a tunable capacitance circuit. The trim data can represent a process variation associated with the series LC circuit. The tunable filter can be a tunable notch filter and the desired characteristic of the tunable filter is a notch. The tunable notch filter can provide second harmonic rejection of a carrier.

The trim data can represent a process variation associated with a fixed portion of the tunable filter. The memory of the trim circuit can include non-volatile memory. For instance, the memory of the trim circuit can includes fuse elements.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 15/247,742, titled "CONTOUR TUNING CIRCUIT," filed on even date herewith, the entire disclosure of which is hereby incorporated by reference herein. The present disclosure relates to U.S. patent application Ser. No. 15/247,616, titled "TUNABLE NOTCH FILTER," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 2 is a schematic diagram of another radio frequency system including a signal path to a low noise amplifier according to an embodiment.

FIG. 3 is a schematic diagram of a radio frequency system with a contour tuning circuit according to another embodiment.

FIG. 19 is a graph showing plots of insertion loss versus frequency for a tunable antenna filter according to an embodiment.

DETAILED DESCRIPTION OF CERTAIN EMBODIMENTS

Figure 1A:
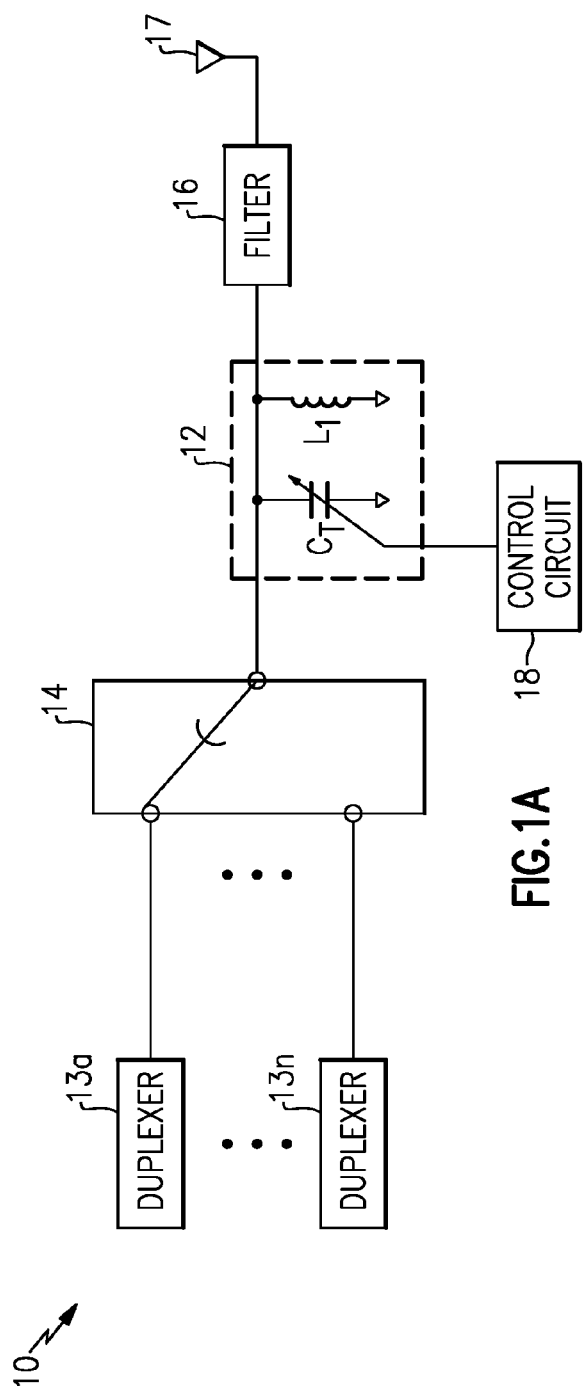
FIG. 1A is a schematic diagram of a radio frequency system including a signal path to an antenna according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or symbols can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

Contour Tuning Circuit

Current cellular phones and other mobile devices may incorporate a number of operating bands to support the proliferation of frequency bands over the world. Each separate frequency band can involve particular filtering to reject out-of-band transmit energy of the transmitter and/or to reject relatively large signal interferers in receive path(s). These filters are often implemented by surface acoustic wave (SAW) or bulk acoustic wave (BAW), such as film bulk acoustic resonator (FBAR), technology. Such filters can include passive components for tuning. These passive components can include one or more shunt inductors to tune out the shunt capacitance of the filter. Current solutions can include about 8 to 16 separate filters, each having a dedicated passive component for tuning. The separate filters can each have dedicated tuning, which can be expensive to implement and/or consume physical area in a limited amount of space. Aspects of this disclosure relate to implementing tuning at a common node of an antenna switch such that some or all of the tuning of separate passive components can be eliminated and merged into a common tunable element.

Some previous systems included a separate passive tuning network for a signal path associated with each band of a plurality of bands. Space constraints limited the optimization of such tuning networks in various implementations, thereby resulting in sub-optimal tuning and increased insertion loss.

Aspects of this disclosure relate to a contour tuning circuit electrically connected to a common node of a multi-throw antenna switch. The contour tuning circuit can be a tunable filter that provides adjustable impedance matching. A common filter network can be integrated within an antenna switch element. The common filter network can include a shunt inductor in parallel with a tunable capacitance circuit at the common node of the multi-throw antenna switch. The tunable capacitance circuit at the common node of the multi-throw antenna switch can adjust an impedance presented at the common node based on parasitics of the interface to throws of the multi-throw antenna switch and/or filter characteristics associated with a selected throw of the multi-throw switch that is activated. This can adjust impedance presented to a filter associated with a selected throw of the multi-throw switch that is activated as desired.

In certain embodiments, an impedance at a common port of a multi-throw switch can be tuned by adjusting an effective capacitance in parallel with a shunt inductor coupled to the common port of the multi-throw switch in association with a state of the multi-throw switch changing. This adjustment can include tuning a switch on to couple a capacitor in parallel with the shunt inductor. The shunt inductor and the tunable capacitor can be coupled to a node is a signal path between the common port and an antenna port.

The contour tuning circuits discussed herein can provide tunability such that a software interface can be used to tune each band rather than manually determining an impedance match for each band. This can reduce the time for determining respective states of the contour tuning circuit associated with each band. The contour tuning circuits discussed herein can consolidate most or all of the tuning elements into a common tuning element of the contour tuning circuit. This can reduce the physical size and/or cost of an electronic component and/or an electronic system that includes the contour tuning circuits.

An antenna switch can selectively electrically couple a radio frequency signal path to an antenna. The antenna switch can include a multi-throw switch having respective throws coupled different duplexers. The antenna switch can selectively electrically connect a particular duplexer to the antenna.

The antenna switch can be designed for a 50 Ohm interface. Routing of traces between duplexers and the antenna switch can add a parasitic capacitance in signal paths between respective duplexers and the antenna switch. The duplexers can also contribute to the parasitic capacitance. Traces between the duplexers and the antenna switch can be implemented on or in a packaging substrate, such as a laminate substrate. The traces between the duplexers and the antenna switch can introduce different amounts of parasitic capacitance.

One approach to mitigating the parasitic capacitance of the traces between the duplexers and the antenna switch is to match out such parasitic capacitances with a shunt inductance at an output of each duplexer. However, this approach can add cost and insertion loss.

Aspects of this disclosure relate to absorbing the routing capacitance of the trances into a module that includes the antenna switch such that a 50 Ohm interface is presented at the duplexer impedance plane. Through the use of a tunable capacitance circuit within the module, the impedance at a duplexer can be programmed such that transmit and receive impedance contours can be enhanced and/or optimized. According to certain embodiments, a single shunt inductance can be electrically coupled to a common node of the antenna switch. This shunt inductance can be in parallel with the tunable capacitance circuit. The shunt inductance and the tunable capacitance circuit can match out parasitics of routing between duplexers and an antenna switch.

FIG. 1A is a schematic diagram of a radio frequency (RF) system 10 according to an embodiment. RF systems discussed herein can be configured to process radio frequency signals having a frequency in a range from about 300 kHz to 300 GHz, such as in a range from about 450 MHz to 6 GHz. As illustrated, the RF system 10 includes a contour tuning circuit 12, duplexers 13a to 13n, an antenna switch 14, a filter 16, an antenna 17 arranged to transmit and receive RF signals, and a control circuit 18.

A tunable circuit can be coupled to a common port of a multi-throw switch and adjust impedance at the multi-throw switch. Such a tunable circuit can be referred to as a contour tuning circuit. The contour tuning circuit can provide tunable filtering by providing impedance matching that is adjustable. In FIG. 1A, the contour tuning circuit 12 can adjust an impedance presented at a common port the antenna switch 14 to enhance and/or optimize impedance contours at the duplexers 13a to 13n. The contour tuning circuit 12 can be integrated with the antenna switch 14 in a module. Such a module can be referred to as an antenna switch module. The contour tuning circuit 12 includes a shunt inductor L1 in parallel with a tunable impedance circuit. The tunable impedance circuit can be a capacitance circuit $C_T$ as illustrated. According to some other embodiments, the tunable impedance circuit can be any other suitable tunable impedance circuit. The contour tuning circuit 12 is coupled to a common port of the antenna switch 14. The common port of the antenna switch 14 can be referred to as a common node of the antenna switch 14. The contour tuning circuit 12 can adjust an impedance presented at a selected duplexer of the duplexers 13a to 13n that is electrically connected to the contour tuning circuit 12 by way of the antenna switch 14. This can enhance and/or optimize transmit and receive impedance contours at the selected duplexer.

The tunable capacitance circuit $C_T$ can adjust an effective capacitance that is in parallel with the shunt inductor $L_1$ to provide impedance tuning associated with the selected duplexer. The tunable capacitance circuit $C_T$ can be arranged to provide a first effective capacitance in parallel with the shunt inductor $L_1$ when a first throw of the antenna switch 14 is active and to present a second effective capacitance in parallel with the shunt inductor $L_1$ when a second throw of the antenna switch 14 is active.

The shunt inductor $L_1$ can have an inductance so as to provide a desired impedance in combination with the tunable capacitance circuit $C_T$. The inductance of the shunt inductor $L_1$ can be selected so as to absorb a significant amount of capacitance of the routing between the duplexers 13a to 13n and the antenna switch 14. In certain embodiments, the shunt inductor $L_1$ can have an inductance in a range from about 4 nH to 12 nH. For instance, the shunt inductor $L_1$ can have an inductance in a range from about 5 nH to 7 nH in some applications. In some other applications, the shunt inductor $L_1$ can have an inductance in a range from about 9 nH to 11 nH.

While the contour tuning circuit 12 shown in FIG. 1A includes a shunt inductor $L_1$ in parallel with a tunable capacitance circuit $C_T$, other suitable contour tuning circuit topologies can be implemented in accordance with any of the principles and advantages discussed herein. Other contour tuning circuit topologies can include any other suitable passive impedance network that includes passive impedance elements in series and/or parallel with each other. For instance, the illustrated shunt inductor $L_1$ can be implemented by an LC circuit or an RL, circuit in certain applications. As another example, the illustrated tunable capacitance circuit $C_T$ can be implemented by a tunable LC circuit or a tunable RC circuit in some applications. As one more example, a contour tuning circuit can include an RC circuit, an LC circuit, an RL circuit, or an RLC circuit with any suitable combination of series and/or parallel passive impedance elements to implement contour tuning in accordance with any of the principles and advantages discussed herein.

The duplexers 13a to 13n can provide any suitable duplexing functionality. Each of the duplexers 13a to 13n can provide transmit filtering and receive filtering for a particular frequency band. Any suitable number of duplexers 13a to 13n can be implemented in the RF system 10. Each of the duplexers 13a to 13n can be coupled to a throw of the antenna switch 14.

The antenna switch 14 has multiple throws. The antenna switch 14 can include 8 or more throws in certain embodiments. For instance, the antenna switch 14 can include 10 to 12 throws in some embodiments. The antenna switch 14 includes a common port. The antenna switch 14 also includes a plurality of input/output (I/O) ports coupled to respective duplexers 13a to 13n. An I/O port can serve as an input port, an output port, or an input and output port. For instance, an I/O port can serve as an input of the antenna switch 14 for a transmission path and an output of the antenna switch 14 for a receive path. The antenna switch 14 can electrically connect a selected I/O port to the common port. This can electrically connect a selected duplexer to the antenna 17. For instance, FIG. 1A illustrates a first I/O port I/O associated with a first duplexer 13a electrically connected to the common port, which is electrically connected to the antenna 17 by way of the filter 16.

The filter 16 is in a signal path between the common port of the antenna switch module 14 and the antenna 19. The filter 16 can provide any suitable filtering, in certain embodiments, the filter 16 includes a low pass filter. According to some embodiments, the filter 16 can include an elliptic filter and a tunable notch filter.

The control circuit 18 can tune the tunable capacitance circuit $C_T$ of the such that a desired impedance is in parallel with the series LC circuit. For instance, the control circuit 18 can tune the tunable capacitance circuit $C_T$ so as to provide an impedance at the common port of the antenna switch 14 for a selected I/O port of the antenna switch 14. The control circuit 18 can set a state of the tunable capacitance circuit $C_T$ in accordance with any of the suitable principles and advantages discussed herein.

Figure 1B:
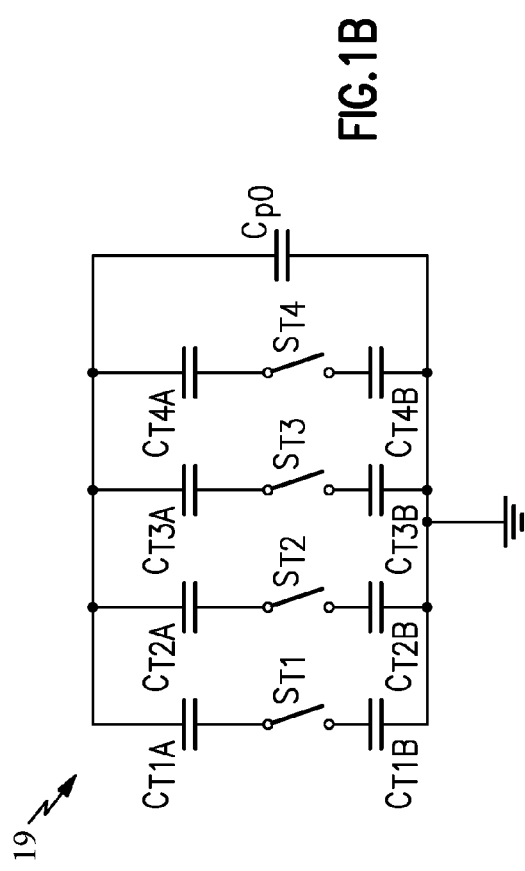
FIG. 1B is a schematic diagram of an illustrative tunable capacitance circuit according to an embodiment.

FIG. 1B is a schematic diagram of an illustrative tunable capacitance circuit 19 according to an embodiment. The tunable capacitance circuit 19 is an example of the tunable capacitance circuit $C_T$ of FIG. 1A. The illustrated tunable capacitance circuit 19 includes a fixed capacitor $C_{P0}$ in parallel with a plurality of series circuits. Each of the series circuits includes a capacitor in series with a switch. As shown in FIG. 1B, the series circuits include a first capacitor $C_{T1A}$ to $C_{T4A}$ in series with a switch $S_{T1}$ to $S_{T4}$, respectively, and a second capacitor $C_{T1B}$ to $C_{T4B}$, respectively. The capacitors of the tunable capacitance circuit 19 can have any suitable capacitance values. According to certain implementations, the fixed capacitor $C_{P0}$ can have a capacitance that is approximately equal to the capacitance provided by a series circuit when its switch electrically connects capacitance in parallel with the fixed capacitor $C_{P0}$. The series circuits can provide binary weighted capacitances in parallel with the fixed capacitor $C_{P0}$ in some embodiments. The switches $S_{T1}$ to $S_{T4}$ can adjust the capacitance of the tunable capacitance circuit 19 by switching-in and/or switching-out respective capacitors to adjust an amount of capacitance coupled in parallel with the fixed capacitor $C_{P0}$.

In some other implementations, other suitable tunable capacitance circuits can be implemented. For instance, a tunable capacitance circuit can include one or more varactors, a tunable microelectromechanical systems (MEMS) capacitor, or any other suitable variable capacitance circuit.

Any of principles and advantages of the contour tuning circuits discussed herein can be implemented in any suitable application that could benefit from a contour tuning circuit, such as applications in which an impedance at a common port of a multi-throw switch can be adjusted based on which selected signal path connected to a multi-throw switch is coupled to the common port of the multi-throw switch. For instance, a contour tuning circuit can be coupled between a common port of a multi-throw switch and a low noise amplifier. Such a contour tuning circuit can be arranged to provide an impedance tuning associated with routing of different signal paths from receive filters to a multi-throw switch. A contour tuning circuit implemented in a receive signal path should not add insertion loss to any transmit signal path. FIGS. 2 and 3 illustrate example radio frequency systems in which a contour tuning circuit is implemented. Any combination of features of the contour tuning circuits discussed herein can be implemented in connection with any suitable principles and advantages discussed with reference to the radio frequency systems of FIGS. 2 and/or 3.

FIG. 2 is a schematic diagram of a radio frequency system 20 according to an embodiment. As illustrated, the RF system 20 includes a contour tuning circuit 12, receive filters 23a to 23n, a receive switch 24, a low noise amplifier 26, and a control circuit 28. The contour tuning circuit 12 of FIG. 2 is in a signal path between the common port of the receive switch 24 and the low noise amplifier 26. The receive switch 26 can be a multi-throw switch arranged to electrically couple a selected receive filter to the low noise amplifier 26. Different receive filters 23a to 23n can be arranged for processing RF signals within different frequency bands. For instance, the receive filters 23a to 23n can be bandpass filters with different pass bands. The receive filters 23a to 23n can be implemented in duplexers, for example.

The control circuit 28 of FIG. 2 can set the state of the contour tuning circuit 12 to correspond to a radio frequency signal path being coupled to the low noise amplifier 26. This can provide impedance tuning and account for different impedances corresponding to the different routing from the receive filters 23a to the 23n to the receive switch 24. The tunability of the contour tuning circuit 12 can enable tuning for desirable impedance matching for a plurality of different receive filters using a common tuning circuit.

FIG. 3 is a schematic diagram of a radio frequency system 30 with a contour tuning circuit 12 according to another embodiment. As illustrated, the RF system 30 includes a contour tuning circuit 12, RF signal paths 33a to 33n, a multi-throw switch 34, an RF circuit 36, and a control circuit 38. The RF signal paths 33a to 33n can include any suitable RF signal paths. The RF signal paths 33a to 33n can include, for example, duplexers, receive filters, transmit filters, RF amplifiers such as power amplifiers, or the like. The multi-throw switch 34 can be any suitable multi-throw switch. The multi-throw switch 34 can be, for example, an antenna switch, a receive switch, or any other suitable RF switch. The RF circuit 36 can be a filter arranged to filter RF signals, an RF amplifier such as a low noise amplifier, an RF switch, or any other suitable RF circuit. The control circuit 38 can set the state of the contour tuning circuit 12 to correspond to a radio frequency signal path being coupled to the RF circuit 36. This can provide impedance tuning and account for different impedances corresponding to the different routing from the RF signal paths 33a to the 23n to the multi-throw switch 34. The tunability of the contour tuning circuit 12 can enable tuning for desirable impedance matching for a plurality of different receive filters using a common tuning circuit.

As discussed above, an antenna switch can be designed for a 50 Ohm interface and routing of traces between duplexers and the antenna switch can add different parasitic capacitances in respective signal paths. A contour tuning circuit can be tuned to enhance and/or optimize impedance matching. More details will now be provided to regarding implementing contour tuning between a common port of an antenna switch and an antenna port.

Figure 4A:
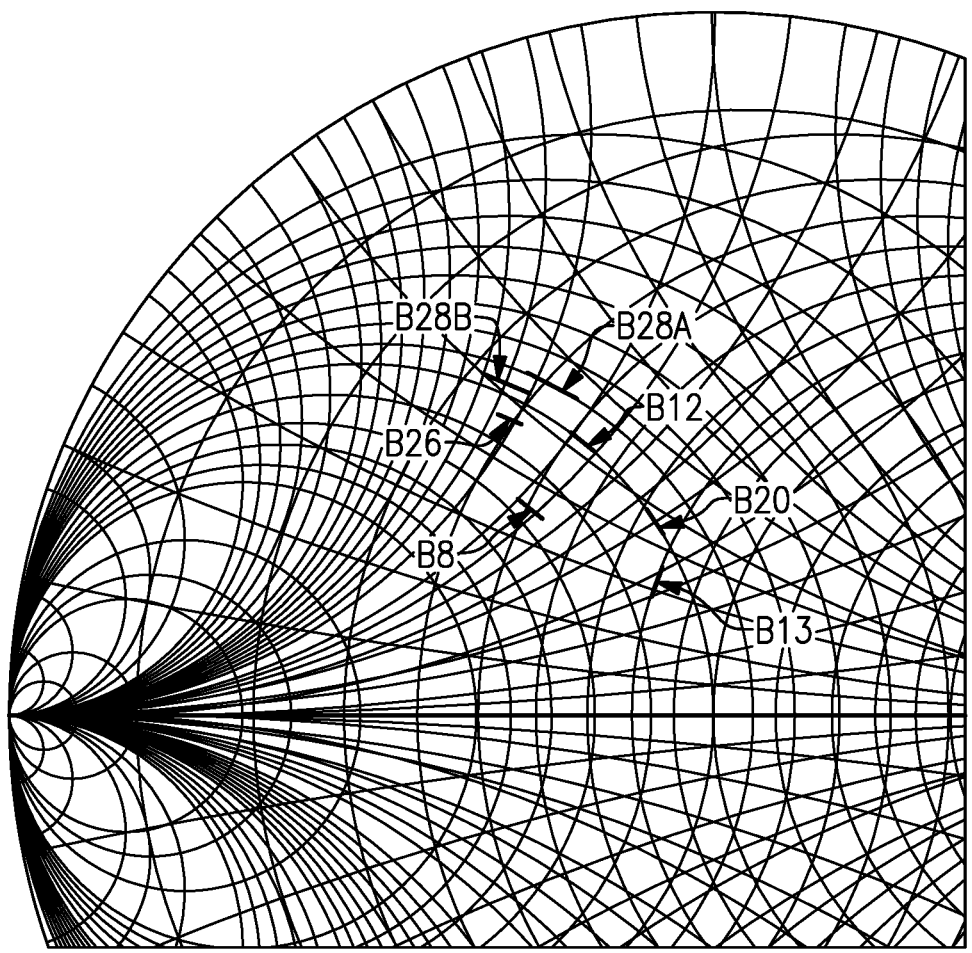
FIG. 4A is a Smith chart showing target duplexer antenna impedances according to an embodiment.

FIG. 4A is a Smith chart showing target duplexer antenna impedances according to an embodiment. The target duplexer antenna impedances can represent design targets. As shown in FIG. 4A, the target impedances are shown for signal paths for the following frequency bands: Band 8, Band 12, Band 13, Band 20, Band 26, Band 28A, and Band 28B.

Impedance matching at a duplexer antenna interface can involve a highly inductive impedance. The highly inductive impedance can be implemented by a shunt inductor. However, relatively long signal routes (e.g., conductive traces on a packaging substrate) can create capacitive parasitic impedances.

Figure 4B:
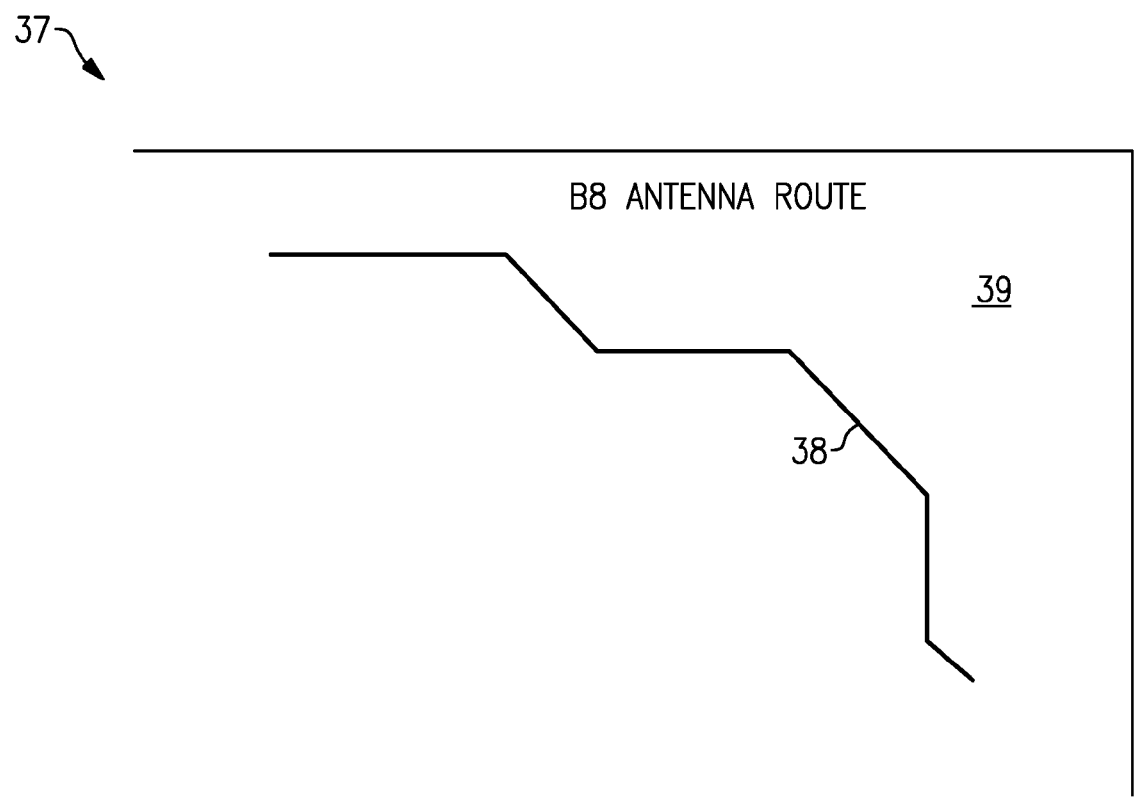
FIG. 4B illustrates a portion of a module with a trace on a packaging substrate.

FIG. 4B illustrates a portion of a module 37 with a trace 38 on a packaging substrate 39. The trace 38 is an example interconnect between a duplexer and an antenna switch. The trace 38 can include the majority of routing from an RF signal path associated with a frequency band to an antenna. Accordingly, the trace 38 can be referred to as an antenna route. The illustrated trace 38 can be associated with Band 8 signal path to an antenna switch. The trace 38 can be relatively long and can have a parasitic capacitance that can be significant. Matching the parasitic capacitance associated with the trace 38 could involve a series inductance of up to about 3 nH in some implementations. This value of inductance can require a relatively large amount of die area. Accordingly, a contour tuning circuit that can match parasitic capacitance of traces to the antenna switch without a relatively large series inductance can be desirable. The contour tuning circuits discussed herein can advantageously be used to implement impedance matching of parasitic capacitance without a series inductance in certain applications.

Table 1 provides example capacitances for the trace impedances for signal paths associated with different frequency bands. The capacitances can be parasitic capacitances of traces between a duplexer associated with respective frequency band and an I/O port of an antenna switch. The capacitance value for Band 8 can be the capacitance value associated with the trace 38 of FIG. 4B, for example. The parasitic capacitances of traces can range from about 0.5 pF to about 2.0 pF in certain implementations. These parasitic capacitances typically depend on a physical layout of a module. Some of the parasitic capacitances associated with different bands can be similar to each other and other parasitic capacitances associated with different bands can vary by about 1 pF or more in certain implementations.

TABLE 1

| Frequency Band | Antenna Trace Capacitance (pF) |
|---|---|
| B8 | 1.3 |
| B28B | 0.6 |
| B28A | 0.8 |
| B27 | 1.6 |
| B20 | 1.5 |
| B13 | 0.9 |
| B12 | 0.4 |
| B26 | 0.9 |

One way of matching the capacitance of traces associated with each band is to include a series inductor in a signal path between each duplexer and the antenna switch. Such a series inductor can have an inductance of up to about 3 nH in certain applications. However, such an inductor can be relatively large and/or relatively expensive to implement. The series inductor can be eliminated by absorbing routing capacitance into an antenna switch module, for example, using a contour tuning circuit in accordance with the principles and advantages discussed herein.

A harmonic filter integrated on an antenna switch module can incorporate a shunt input capacitance. Such a shunt capacitance can be modified to absorb the parasitic off state capacitance of the antenna switch of the antenna switch module. Accordingly, a capacitance and a physical size of this shunt capacitor can be decreased. Further modification of the shunt input capacitance of the harmonic filter can absorb the parasitic board capacitance and translate the harmonic filter input impedance to a duplexer interface.

In certain applications, the total capacitance to be absorbed is larger than a total harmonic filter input capacitance. Accordingly, a shunt inductance can be included at an interface between the antenna switch and the harmonic filter. This can enable more capacitance to be absorbed. Such a technique is also applicable to a medium band (MB) signal path and a high band (HB) signal path, even though such signal paths may not typically include a harmonic filter within an antenna switch module.

A compensation capacitance can be disposed at each antenna switch I/O port and a common switched capacitance array can be integrated in parallel with an input of a harmonic filter included in a signal path between the antenna switch and an antenna port.

Figure 5:
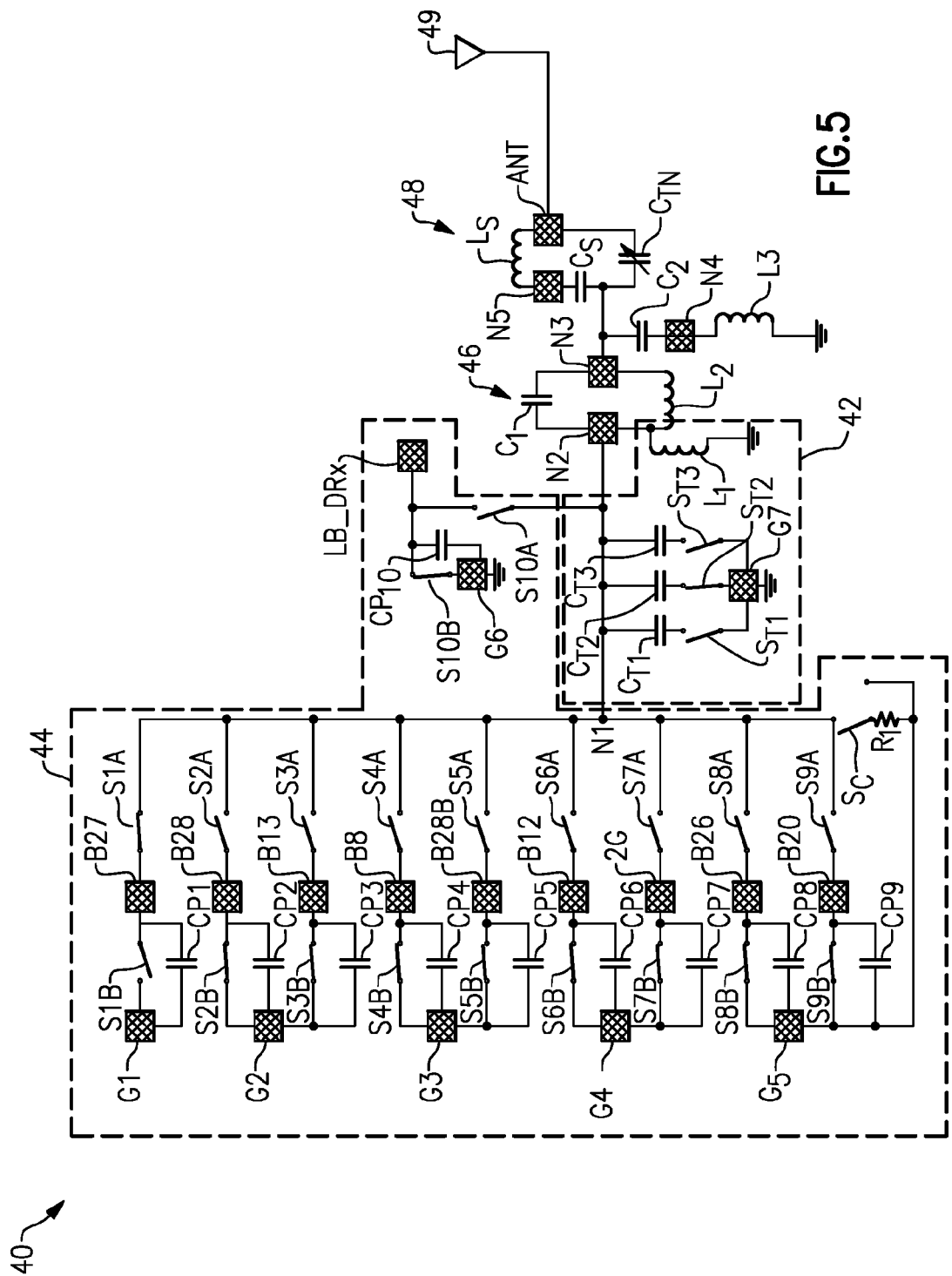
FIG. 5 is a schematic diagram of a radio frequency system with a contour tuning circuit according to an embodiment.

FIG. 5 is a schematic diagram of a radio frequency system 40 according to an embodiment. The illustrated radio frequency system 40 includes a contour tuning circuit 42, an antenna switch 44, antenna filters including an elliptic filter 46 and a tunable notch filter 48, and an antenna 49. The RF system 40 can implement a switching function to couple a selected signal path to the antenna 49. The RF system 40 can also filter signals propagating between the antenna switch 44 and the antenna 49. The RF system 40 can also provide contour tuning at a common node N1 of the antenna switch. The illustrated contour tuning circuit 42 is coupled between the common node N1 and a ground potential.

The illustrated antenna switch 44 is a multi-throw switch that includes 10 throws. Some or all of these throws can be associated with different frequency bands. As illustrated, each throw includes a switch arm S1A to S10A and a shunt arm S1B to S10B. When a selected throw is activated, its shunt art can be off and its switch arm can be on to electrically connect a signal path connected to an I/O port of the throw to a common node N1 of the antenna switch 44. For instance, as shown in FIG. 5, the first series switch S1A is on and the first shunt switch S1B is off. This can couple the common node N1 to an I/O port associated with the first throw. Accordingly, the first throw is activated in the state shown in FIG. 5. Inactive throws of the antenna switch can have their switch arms off and their shunt arms on. For instance, as shown in FIG. 5, the series switch S2A to S10A are off and the shunt switches S2B to S10B are off. This can shunt the inactive I/O ports to a ground potential. A control circuit (not illustrated) can control the series switches and the shunt switches of the antenna switch 44 such that the antenna switch 44 is in a desired state.

The antenna switch 44 includes capacitors CP1 to CP10 coupled to I/O ports of the antenna switch 44. The capacitors CP1 to Cp10 are in parallel with the shunt arms S1B to S10B, respectively. Accordingly, when a shunt arm is off, the capacitor in parallel with the shunt arm can provide a shunt capacitance at an I/O port of the antenna switch 44. This shunt capacitance can provide course compensation capacitance associated with a signal path coupled to a respective throw of the antenna switch 44.

The antenna switch 44 also includes a resistor R1 and a switch SC in series with the resistor R1. The switch SC can couple the common node N1 to ground by way of the resistor R1. This can couple the common node N1 to ground by way of resistor R1, for example, when all of the throws of the antenna switch 44 are inactive.

Some elements of the illustrated RF system 40 can be implemented on a semiconductor die, such as a silicon-on-insulator die, and other elements of the RF system 40 can be implemented external to the semiconductor die. For instance, capacitors and switches can be implemented on the semiconductor die and inductors can be implemented external to the semiconductor die. The semiconductor die includes contacts (e.g., pins, bumps, pads such as wire bond pads, or the like) to provide electrical connections between circuit elements on the semiconductor die and circuit elements external to the die. Any suitable electrical connector can be implemented between a contact of the semiconductor die and an element of the RF system 40 implemented external to the semiconductor die. For instance, an inductor can be electrically connected to a contact of the die by way of a conductive trace, a wire bond, the like, or any suitable combination thereof.

As illustrated in FIG. 5, the semiconductor die includes a plurality of ground contacts G1 to G7 to provide ground connections. Any suitable number of ground contacts can be implemented in some other implementations. FIG. 5 also illustrates contacts B27, B28, B13, B8, B28B, B12, 2G, B26, B20, and LB_DRx providing I/O ports for signal paths associated with different frequency bands. In particular, the illustrated contacts B27, B28, B13, B8, B28B, B12, 2G, B26, B20, and LB_DRx can be associated with Band 27, Band 28, Band 13, Band 8, Band 28B, Band 12, 2G, Band 26, Band 20, and Low Band Drive Receive signal paths. Any suitable number of contacts can provide RF signals associated with different signal paths. Such signal paths can be associated with any suitable frequency bands, signaling modes, power modes, the like, or any combination thereof. Contacts N2, N3, N4, N5, and ANT can couple capacitors or other circuit elements of a semiconductor die to a respective inductor implemented external to the semiconductor die. The contact ANT can serve as an antenna port.

The illustrated contour tuning circuit 42 includes a shunt inductor L1 and a tunable capacitance circuit. The tunable capacitance circuit and the shunt inductor L1 can together effectively provide a desired shunt impedance. The tunable capacitance circuit can tune a reactance provided for relatively high Q and/or relatively low loss. The tunable capacitance shown in FIG. 5 includes tuning capacitors CT1, CT2, and CT3 each in series with a switch ST1, ST2, and ST3, respectively. The tuning capacitors CT1, CT2, and CT3 can each be selected switched in or selectively switched out using switches ST1, ST2, and ST3, respectively. As shown in FIG. 5, switch ST2 is on and switches ST1 and ST3 are off In this state, tuning capacitor CT2 is coupled in parallel with the shunt inductor L1. The tuning capacitors can have capacitances in the range from about 0.1 pF to about 2 pF, such as in the range from about 0.25 pF to about 1 pF, in certain implementations. The tuning capacitors can have any suitable capacitances for implementing contour tuning in accordance with the principles and advantages discussed herein. With the tuning capacitors CT1, CT2, and CT3 and respective switches ST1, ST2, and ST3, the tunable capacitance circuit is configurable into 8 states. In some other implementations, a different number of capacitors or other tunable elements can be implemented. For instance, 4 different capacitors can be switched in and switched out to implement 16 different states of a tunable capacitance circuit. A control circuit, such as the control circuit 18 of FIG. 1A, can provide control signals to the switches ST1, ST2, and ST3 such that the tunable capacitance circuit provides a desired capacitance in parallel with the shunt inductor L1.

The elliptical filter 46 can function as a harmonic filter. The elliptical filter 46 can function as a low pass filter. An elliptical filter can exhibit equalized ripple responses in both the pass band and the stop band. Thus, the elliptical filter 46 can provide rejection relatively near and about the resonant frequency to create a stop band which can suppress undesired signals that may occur. An elliptical filter can be desirable for providing harmonic frequency traps while also providing relatively low insertion loss in the pass band. The illustrated elliptical filter 46 can provide a third harmonic frequency trap and has a notch at about 5 GHz.

The illustrated elliptical filter 46 includes a parallel LC circuit that includes a capacitor $C_1$ in parallel with an inductor $L_2$. In the embodiment of FIG. 5, the parallel LC circuit is coupled in series between the common port of the antenna switch 44 and the tunable notch filter 48. The parallel circuit can provide an open circuit at the third harmonic of an RF signal propagating between the common port of the antenna switch 44 and the antenna 49 and an impedance match at the fundamental frequency of the RF signal. The capacitance of the capacitor $C_1$ and the inductance of the inductor $L_2$ can be selected so as to achieve this functionality. As illustrated, the capacitor $C_1$ is electrically coupled in parallel with the inductor $L_2$ by way of contacts N2 and N3.

The illustrated elliptical filter 46 also includes a series LC shunt circuit. The series LC shunt circuit includes an inductor $L_3$ and a capacitor $C_2$. As illustrated, the capacitor $C_2$ is electrically connected to the inductor $L_3$ by way of contact N4. The capacitor C2 and the inductor L3 can provide a notch at approximately 5 GHz. This can filter out a Wi-Fi signal having a frequency of approximately 5 GHz. The capacitance of the capacitor $C_2$ and the inductance of the inductor $L_3$ can be selected so as to achieve a notch at 5 GHz. In some other embodiments, the series LC shunt circuit that includes the inductor $L_3$ and the capacitor $C_2$ can provide a notch at a different selected frequency.

The illustrated tunable notch tunable 48 can provide a notch in its frequency response at a selected frequency above the frequency of the carrier, such as a second harmonic frequency. The frequency at which harmonic rejection is provided can be tuned by adjusting the capacitance of the tunable capacitance circuit CTN. The inductance and capacitance values of the series LC circuit of the tunable notch filter can be selected to match a resonant frequency of a large signal carrier and provide an inductive effective impedance above the resonant frequency of the large signal carrier. The series LC circuit can be arranged to present a low impedance at the frequency of a large signal carrier. This can effectively short the tunable capacitance circuit CTN at the frequency of the large signal carrier. At frequencies above a resonant frequency of the series LC circuit of the tunable notch filter 48, the effective impedance of the series LC circuit can become inductive. This effective inductive impedance in parallel with the tunable capacitance circuit CTN can create a parallel resonance that can be tuned to a desired frequency for rejection by tuning the capacitance of the tunable capacitance circuit.

As shown in FIG. 5, the tunable notch filter 48 includes an inductor $L_S$, a capacitor $C_S$ in series with the inductor $L_S$, and a tunable capacitance circuit $C_{TN}$. As illustrated, the inductor $L_S$ has a first end electrically connected to the capacitor $C_S$ by way of contact N5 and a second end electrically connected to the tunable capacitance circuit $C_{TN}$ by way of the contact ANT, which can correspond to an antenna port. As shown in FIG. 5, the inductor $L_S$ is connected between a second terminal of the capacitor $C_S$ and a second terminal of the tunable capacitance circuit $C_{TN}$ by way of contacts N5 and ANT, respectively. The antenna 49 is also connected to the contact ANT in FIG. 5. The tunable capacitance circuit $C_{TN}$ can be implemented by any suitable tunable capacitance circuit.

The illustrated tunable notch filter 48 can provide second harmonic rejection. Implementing a series circuit, such as the series LC circuit formed by the inductor $L_S$ and the capacitor $C_S$, in parallel with a tunable capacitance circuit $C_{TN}$ that includes switches to switch-in and switch-out capacitance can limit the signal swing across the switches. For instance, less than about 1.4 Volts peak signal is present across switches of the tunable capacitance circuit $C_{TN}$ in certain embodiments. According to some embodiments, less than about 1 Volt peak signal is present across switches of the tunable capacitance circuit $C_{TN}$. By limiting the voltage swing across the switches of the tunable capacitance circuit $C_{TN}$, the harmonic floor of the system can be improved by preventing the switches from regenerating harmonics.

Figure 6:
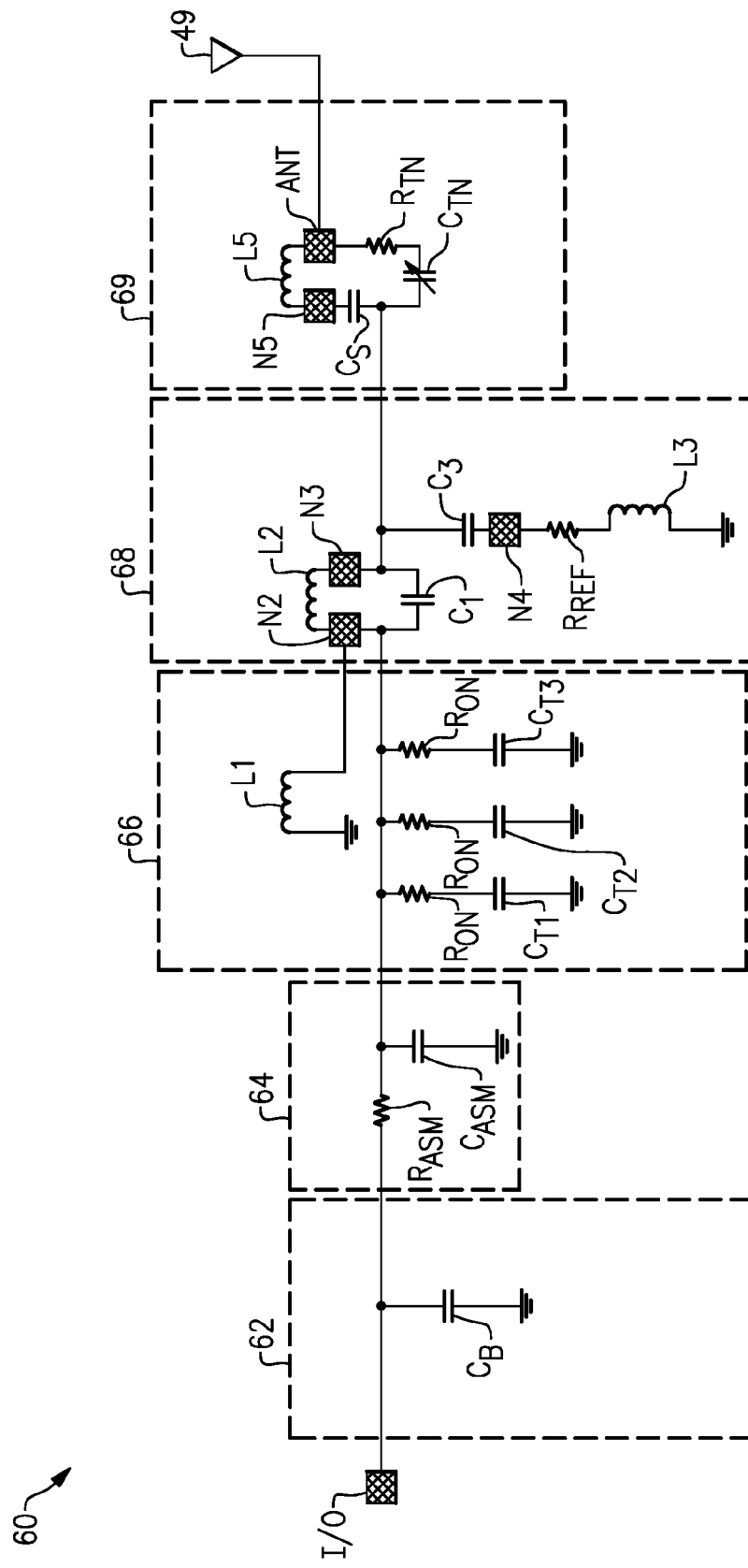
FIG. 6 is a schematic diagram of a model of the radio frequency system of FIG. 5 during operation.

FIG. 6 is a schematic diagram of a model 60 of the radio frequency system 40 of FIG. 5 during operation. The model 60 illustrates models of the circuits of the radio frequency system 40. FIG. 6 illustrates parasitics associated with switches or other elements in the illustrated filters and switch. As shown in FIG. 6, the impedance in a signal path between an I/O port I/O and the antenna 49 can include a shunt capacitance at an I/O port of an antenna switch, impedance associated with the antenna switch, impedance of the contour tuning circuit, and impedance of the filters coupled in series with the contour tuning circuit. With tuning of the contour tuning circuit, an impedance of about 50 Ohms can be presented at a duplexer port coupled to the antenna switch. The model 60 illustrates impedances that can implement the contour tuning in accordance with the principles and advantages discussed herein.

A shunt capacitance model 62 illustrates a shunt capacitor CB associated with an active throw of an antenna switch. The shunt capacitor CB can represent any one of the capacitors CP1 to CP10 shown in FIG. 5. For instance, the shunt capacitance CB can represent the capacitor CP3 when the antenna switch 44 of FIG. 5 is passing a Band 13 signal. In FIG. 6, the shunt capacitor CB is coupled to an I/O port of the antenna switch that is being electrically connected to the common port of the antenna switch. The shunt capacitor CB can provide course band compensation to compensate for trace capacitance in a signal path to the I/O port. The shunt capacitor CB can have a capacitance value corresponding to a value in Table 1 for a selected band in certain implementations. The capacitance value can be a selected value minus the value in Table 1 for the selected band, for example. The shunt capacitor CB can have a capacitance of about a few pico-farads minus the trace capacitance.

An antenna switch model 64 illustrates that the antenna switch can be modeled as a series resistance RASM and a parasitic capacitance CASM. The series resistance RASM can correspond to a resistance of a series switch of the antenna switch being on. The series resistance RASM can represent an on state any one of the series switches S1A to S10A shown in FIG. 5. For instance, the series resistance RASM can represent the resistance of series switch S5A in an on state when the antenna switch 44 of FIG. 5 is passing a Band 13 signal. The series resistance RASM can be in a range from about 2 Ohm to 5 Ohms, for example. The parasitic capacitance CASM of the antenna switch can represent off state capacitances of inactive throws and/or capacitance of the selected throw being active. For instance, the antenna switch can have around 10 throws that are inactive while a selected through is active and parasitic capacitance of the inactive throws (e.g., from shunt switches) can affect the signal path to the antenna 49. The parasitic capacitance CASM of the antenna switch can be on the order of about 1 pF, for example.

A contour tuning circuit model 66 illustrates that a tunable capacitance of the contour tuning circuit can be modeled as plurality of series RC circuits in parallel with each other in certain states. Each capacitor of the tunable capacitance circuit switched-in with the common port of the antenna switch can be modeled as a resistance RON of a switch in series with a tuning capacitor CT1 to CT3. FIG. 6 corresponds to a state in which 3 tuning capacitors CP1 to CT3 of a tunable capacitance circuit are electrically connected to the common port of the antenna switch. In other states, a different numbers of tuning capacitors can be electrically connected to the common port. The tuning capacitors can have any suitable capacitance values to implement the contour tuning discussed herein. For instance, in certain implementations the capacitances of tuning capacitors can be in a range from about 0.2 pF to 3.2 pF, for example. The on resistances RON of the switches of the tunable capacitance circuit can be around 5 Ohms, for example.

An elliptic filter model 66 illustrates parasitic resistance RREF. A tunable notch filter model 69 illustrates parasitic resistance RTN.

Figure 7:
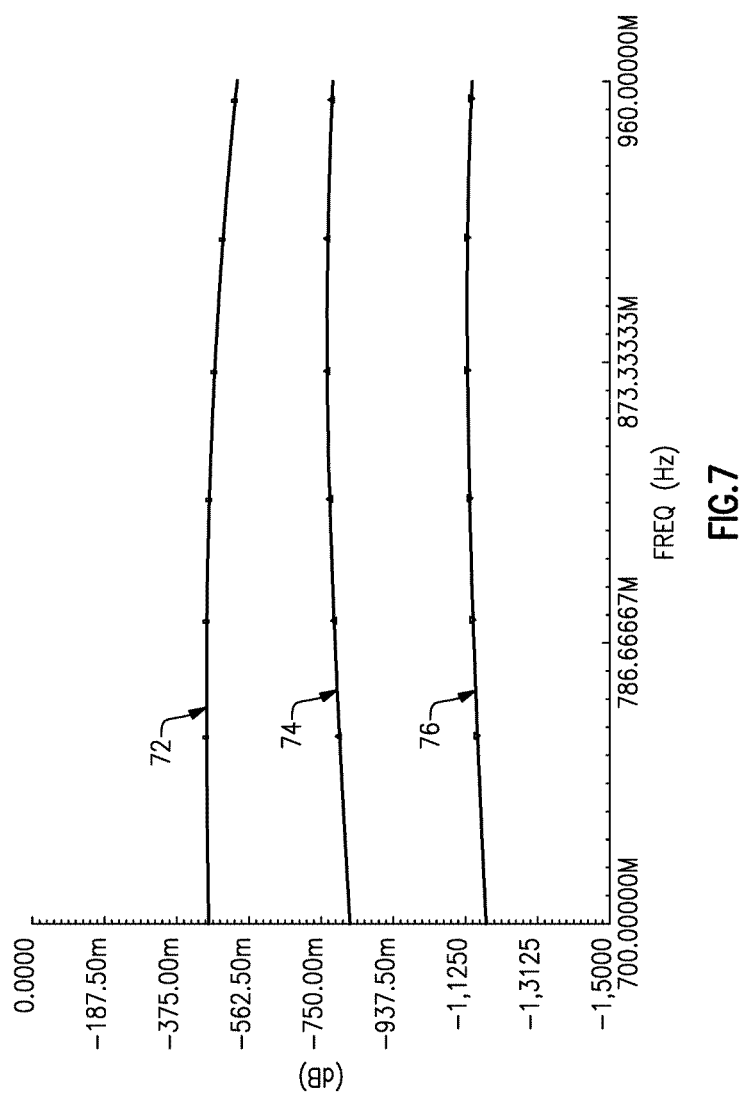
FIG. 7 is a graph that illustrates relationships of insertion loss over frequency for signal paths between a common port of an antenna switch and an antenna.

FIG. 7 is a graph that illustrates relationships of insertion loss over frequency for signal paths between a common port of an antenna switch and an antenna. A first curve 72 represents insertion loss associated with a notch filter. A second curve 74 represents insertion loss associated with the notch filter and a contour tuning circuit according to an embodiment. A third curve 76 represents insertion loss associated with the antenna switch, the notch filter, and a contour tuning circuit according to an embodiment. The curves in FIG. 7 indicate that there is about 0.25 dB of insertion loss associated with the contour tuning circuit.

Figure 8:
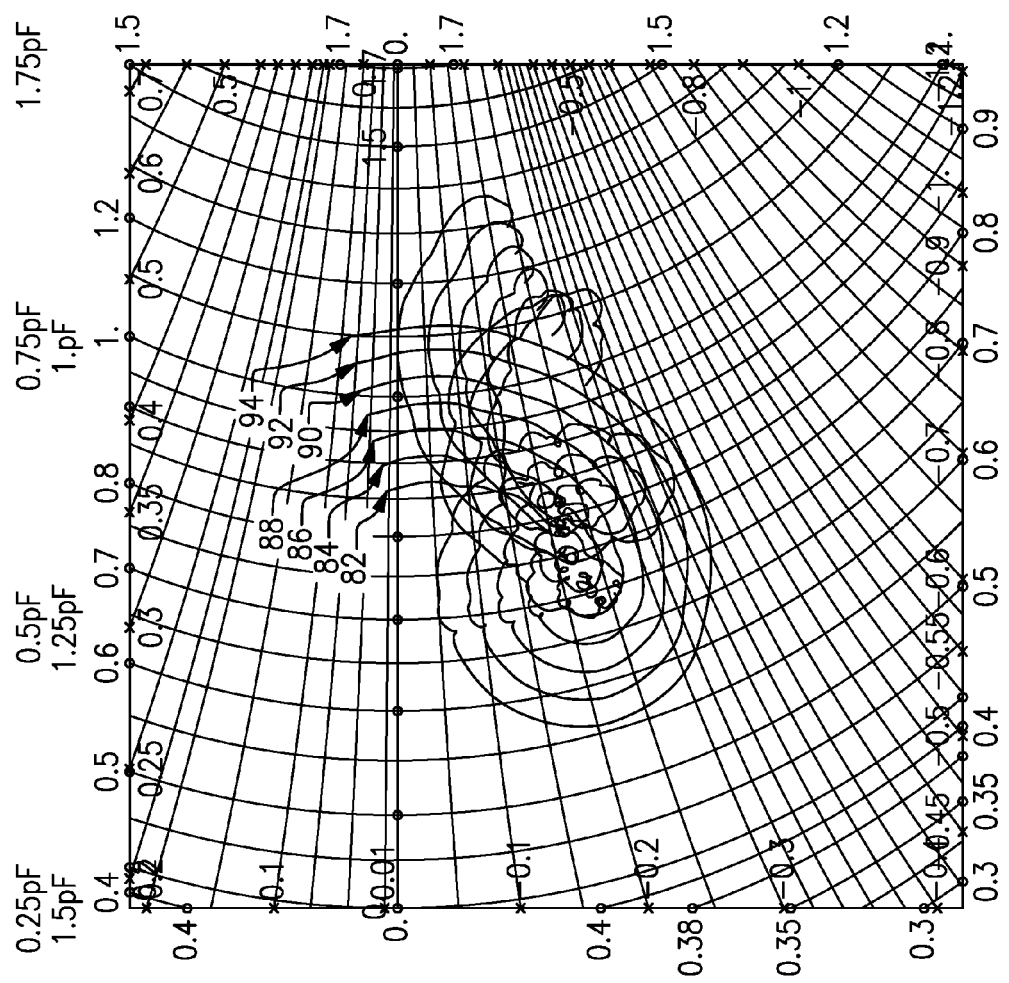
FIG. 8 is a Smith chart of transmit contour tune states of a tunable capacitance circuit according to an embodiment.

FIG. 8 is a Smith chart of transmit contour tune states of a tunable capacitance circuit according to an embodiment. The contour tune states are associated different states of the tunable capacitance circuit 19 of FIG. 1B implemented in the radio frequency system 40 of FIG. 4 for transmitting a signal in a particular frequency band. For example, the curves in the illustrated Smith Chart are for transmit Band 20. During calibration, each state of a tunable capacitance circuit can be tested. A lowest variation in impedance can be desired. Accordingly, the state of the tunable capacitance circuit of a contour tuning circuit corresponding to the innermost curve can be selected for the contour tuning circuit when a signal associated with the particular frequency band is being transmitted. For instance, in FIG. 8, the state associated with the curve 82 can be selected for the frequency band associated with this graph.

A state of tunable capacitance circuit of the contour tuning circuit (e.g., as shown in FIG. 5) can be set based at least partly on trim data. The trim data can be stored in non-volatile memory, such as fuse elements (e.g., fuses and/or anti-fuses). For instance, the tunable capacitance circuit can have 16 states in certain implementations. In such implementations, a control circuit can set the tunable capacitance circuit into one of the 16 states by adding data representing 8 trim states and 8 tuning state states. This can compensate for process variations, such as process variations associated with the shunt inductor L1 of the contour tuning circuit and/or process variations associated with one or more capacitors of the tunable capacitance circuit CT.

Figure 9:
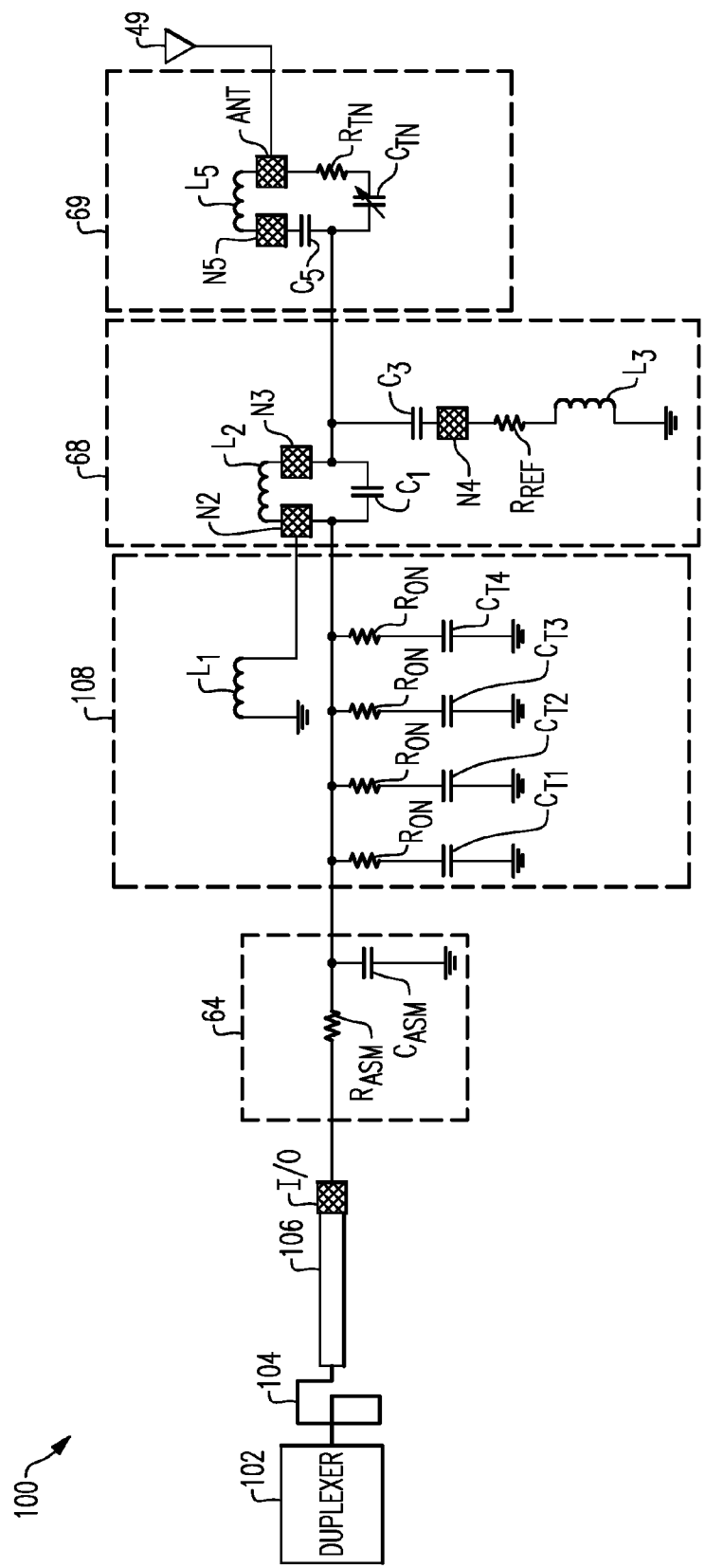
FIG. 9 is a schematic diagram of a model of a signal path between a duplexer and an antenna in accordance with an embodiment.
Figure 10:
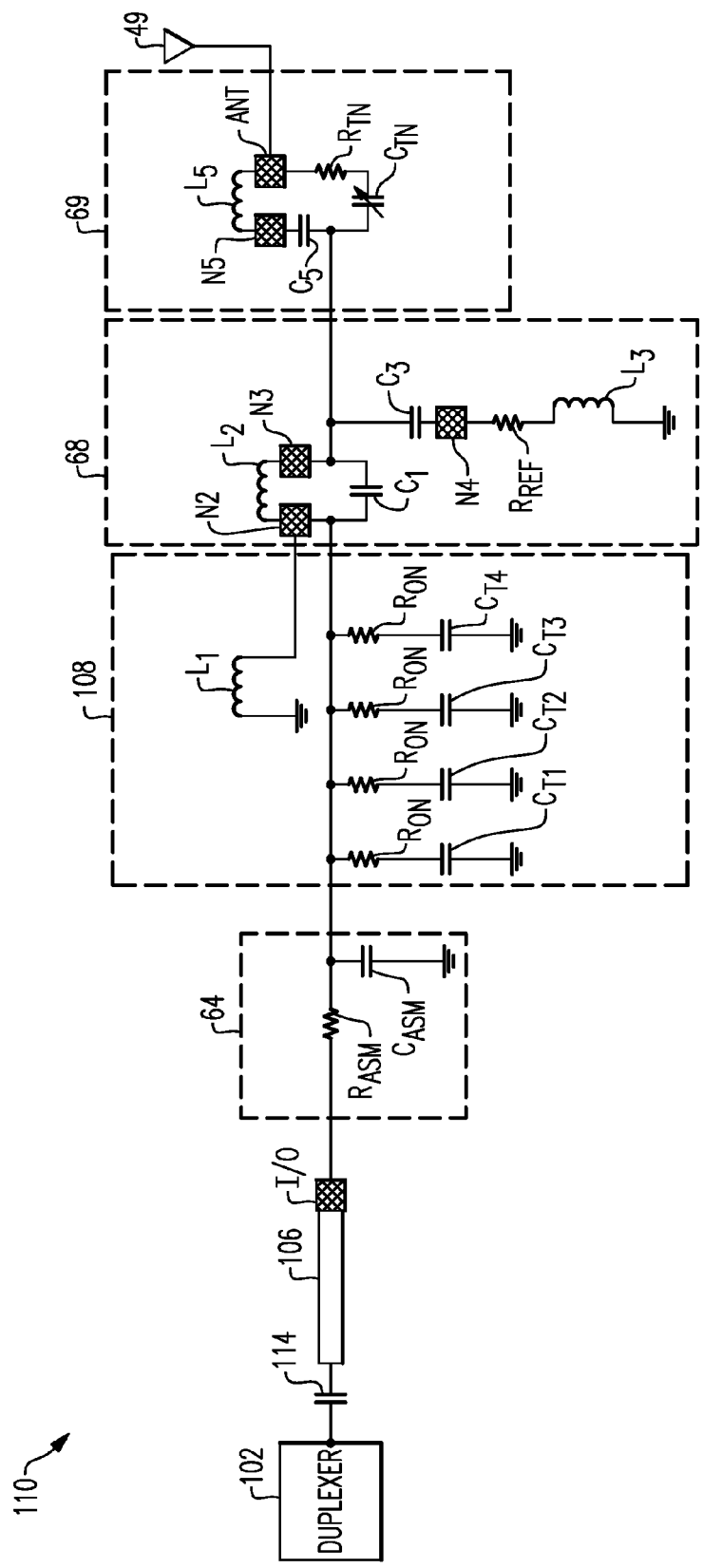
FIG. 10 is a schematic diagram of a model of a signal path between a duplexer and an antenna in accordance with another embodiment.

FIG. 9 is a schematic diagram of a model 100 of a signal path between a duplexer 102 and an antenna 49 in accordance with an embodiment. The model 100 is similar to the model 60 of FIG. 6, except that the model 100 includes additional elements and excludes the shunt capacitance model 62. As shown in FIG. 10, a duplexer 102 can be coupled to an I/O contact I/O of a semiconductor die that includes an antenna switch. FIG. 10 illustrates that the impedance in a signal path between the duplexer 102 and the antenna 49 can include impedance in a signal path between the duplexer and the I/O port I/O, impedance associated with the antenna switch, impedance of the contour tuning circuit, and impedance of the filters coupled in series with the contour tuning circuit. With tuning of the contour tuning circuit, an impedance of about 50 Ohms can be presented at a duplexer port coupled to the antenna switch.

The duplexer 1002 is coupled to the I/O contact I/O by way of a series inductor 104 and a trace route 106. The series inductor 104 can be implemented by a printable spiral inductor that can be implemented on a substrate, such as a laminate substrate. The inductance of the series inductor 104 can be reduced due to the contour tuning circuit coupled to a common port of the antenna switch and still provide similar impedance matching as a larger inductance series inductor without the contour tuning circuit. The trace routing 106 can present impedance to the signal path between the duplexer and the antenna switch. FIG. 1 above provides examples of such parasitic routing capacitance. The contour tuning circuit can match out impedance of the trace routing 106 of a selected signal path.

The contour tuning circuit model 108 of FIG. 10 also illustrates that a different number of tuning capacitors can be switched in parallel with the shunt inductor L1 than shown in model 66 of FIG. 6. In particular, the contour tuning circuit model 108 corresponds to 4 tuning capacitors CT1 to CT4 being coupled in parallel with the shunt inductor L1 by way of four respective switches.

FIG. 10 is a schematic diagram of a model 110 of a signal path between a duplexer 102 and an antenna 49 in accordance with another embodiment. The model 110 is similar to the model 100 of FIG. 10, except that the model 110 includes a series capacitor 114 in place of a series inductor 104. Accordingly, a series inductor can be eliminated from the signal path from the duplexer 102 to the antenna switch. The series capacitor 114 together with a contour tuning circuit can provide similar impedance matching as the series inductor and a contour tuning circuit corresponding to the model 100 of FIG. 10. The series capacitor 114 can be implemented at lower cost and/or reduce area relative to the series inductor 104.

Figure 11A:
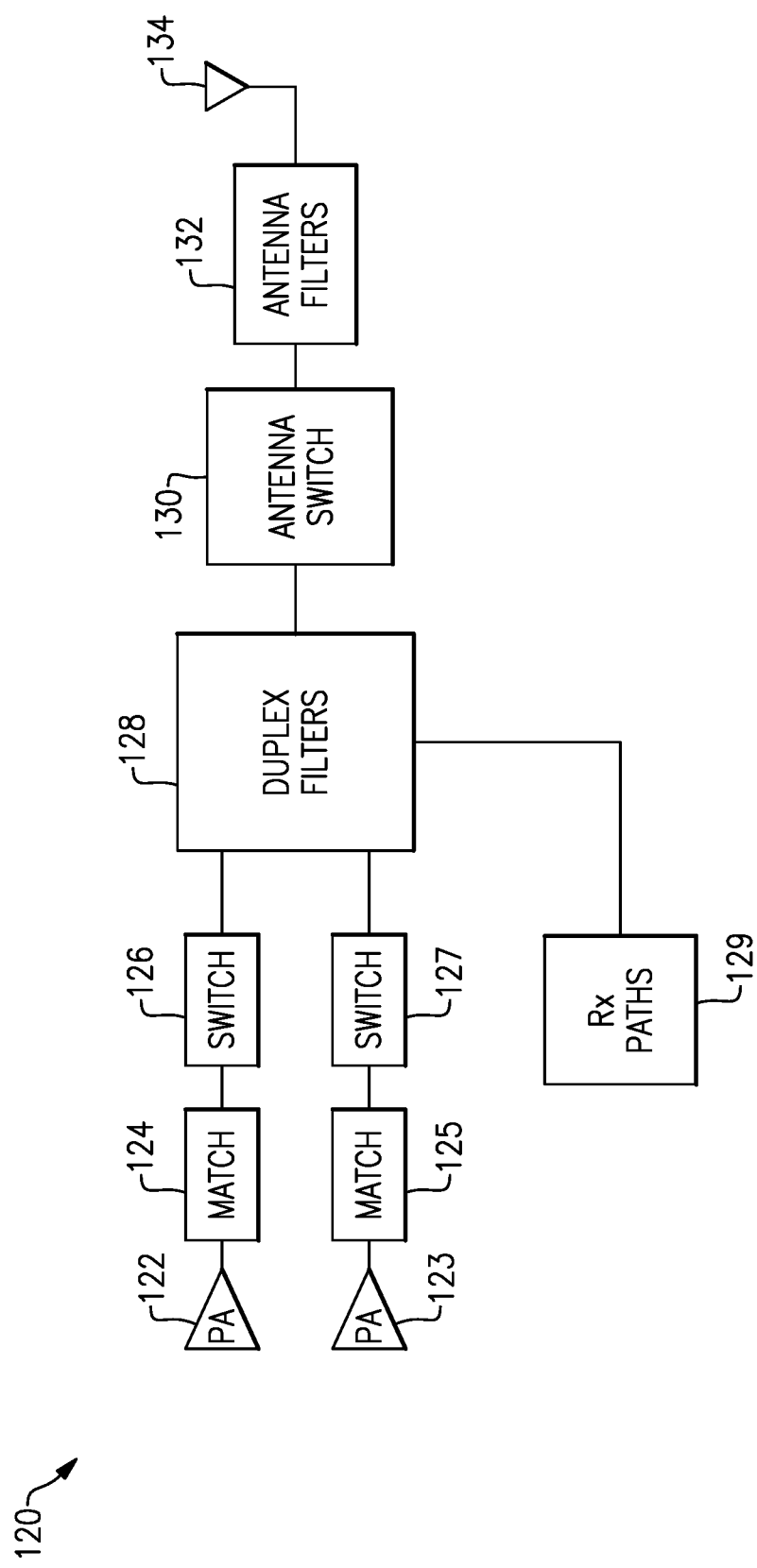
FIG. 11A is a schematic diagram of a radio frequency front end according to an embodiment.

FIG. 11A is a schematic diagram of an RF front end 120 according to an embodiment. An RF front end can include circuitry coupled between a baseband processor and an antenna. For instance, an RF front end can include circuitry coupled between a mixer and an antenna. An RF front end can be coupled between a transceiver and an antenna. The RF front end 120 can include one or more contour tuning circuits in accordance with the any principles and advantages discussed herein.

As illustrated, the RF front end 120 includes power amplifiers 122 and 123, matching networks 124 and 125, RF switches 126 and 127, duplex filters 128, receive signal paths 129, an antenna switch 130, antenna filters 132, and antenna 134. The first power amplifier 122 and the second power amplifier 123 can be associated with different frequency bands and/or different triodes of operation. Each of these power amplifiers can amplify RF signals. Matching networks 124 and 125 provide impedance matching for outputs of power amplifiers 122 and 123, respectively, to reduce reflections and to improve signal quality.

The RF switch 126 can electrically connect the output of the first power amplifier 122 to a selected transmit filter of the duplex filters 128. Similarly, the RF switch 127 can electrically connect the output of the second power amplifier 123 to a selected transmit filter of the duplex filters 128. The RF switch 126 and/or the RF switch 127 can be a multi-throw switch.

The receive paths 129 can include a low noise amplifier and a multi-throw switch to electrically connect the low noise amplifier to a selected receive filter of the duplex filers 128.

An antenna switch 130 can be coupled between the duplex filters 128 and antenna filters 132. The antenna switch 130 can include a multi-throw switch to electrically couple a selected duplexer in the duplex filters 128 to the antenna 134. The duplex filters 128 can include a plurality of duplexers. Each of these duplexers can include a transmit filter and a receive filter. The antenna filters 132 are coupled between the duplex filters 128 and the antenna 134. The antenna 134 can be an antenna of a mobile device, such as a mobile phone.

The antenna filters 132 can filter radio frequency signals propagating between the antenna switch 130 and the antenna 134. The antenna filters 132 can include a contour tuning circuit in accordance with any of the principles and advantages discussed herein. For instance, routing between the duplex filters 128 and the antenna switch 130 can vary from signal path to signal path. The antenna filters 132 can include a tunable filter arranged to filter a radio frequency signal propagating between a switch and an antenna port. The tunable filter can include a contour tuning circuit. A contour tuning circuit can present an impedance to provide impedance matching associated with routing of a signal path selected by the antenna switch 130. The antenna filters 132 can be integrated into an antenna switch module that includes the antenna switch 130 in certain embodiments. The antenna filters can include any suitable filter arranged to filter RF signals propagating between the antenna switch and the antenna 134. The antenna filters can include a harmonic filter and a tunable notch filter in certain embodiments. The tunable notch filter can be tuned so as to provide a notch at a second harmonic of a signal propagating between the antenna switch 130 and the antenna 134.

Figure 11B:
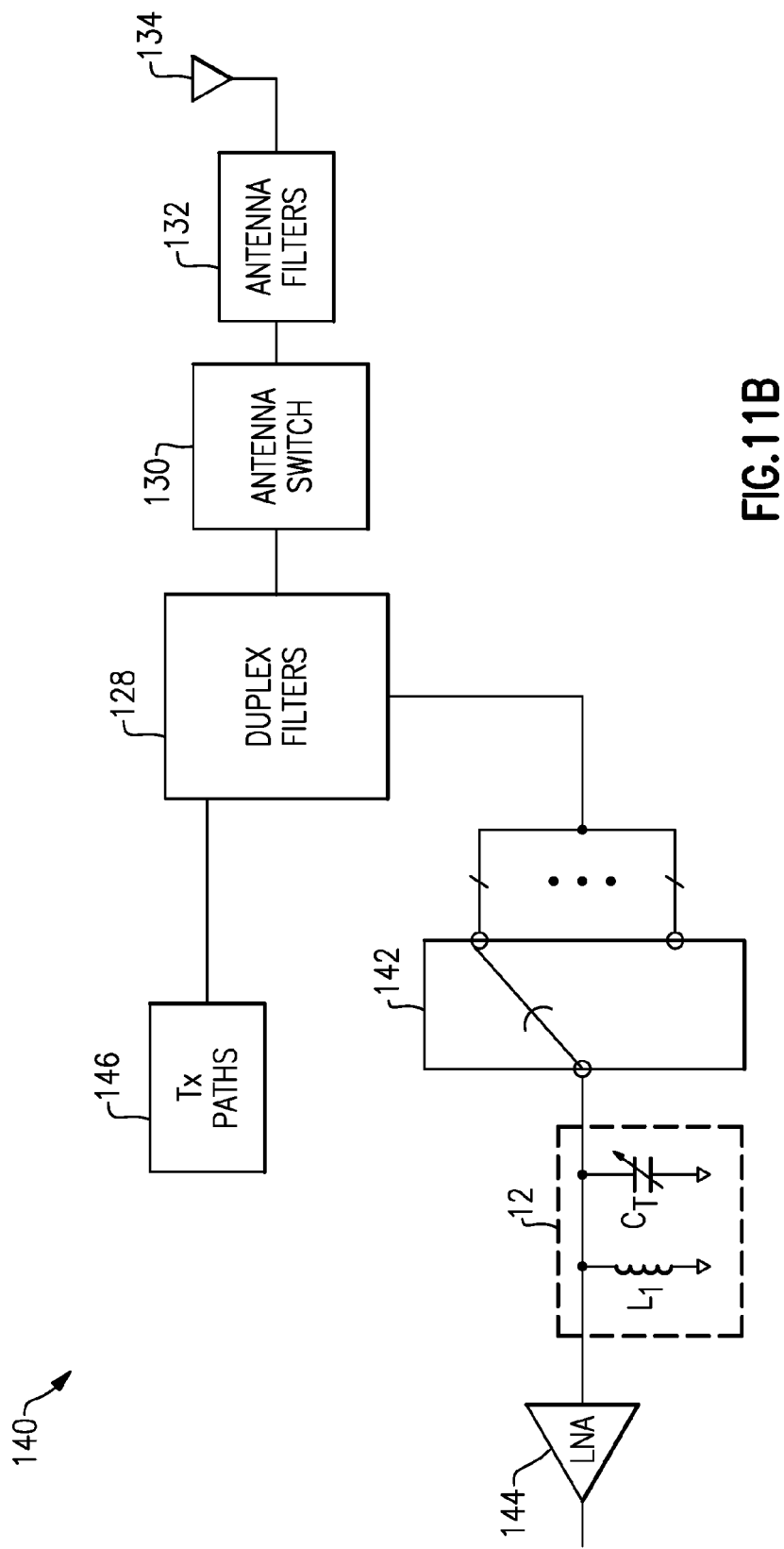
FIG. 11B is a schematic diagram of a radio frequency front end according to another embodiment.

FIG. 11B is a schematic diagram of an RF front end 140 according to an embodiment. The RF front end 140 is like the RF front end 120 except that the RF front end 140 illustrates more detail of a receive paths and less detail of transmit paths. FIG. 11B shows that transmit paths 146 are in communication with the duplex filters 128. The receive paths in FIG. 11B are similar to RF signal paths shown in FIG. 2. As shown in FIG. 11B, the duplex filters 128 can be coupled to a receive switch 142. The illustrated receive switch 142 is a multi-throw switch with different throws connected to different respective duplexers of the duplexer filters 128. A contour tuning circuit 12 is coupled to a in a signal path between a common port of the receive switch 142 and a low noise amplifier 144. The contour tuning circuit 142 can implement any suitable combination of features of the contour tuning circuits discussed herein. The transmit paths 146 can include one or more power amplifiers. The transmit paths 146 can implement any suitable combination of features of the transmit paths of the RF front end 120 of FIG. 11A. In some embodiments, the transmit paths 146 can include a power amplifier and a multi-throw switch configured to couple an output of the power amplifier to a selected signal path for processing.

Figure 12:
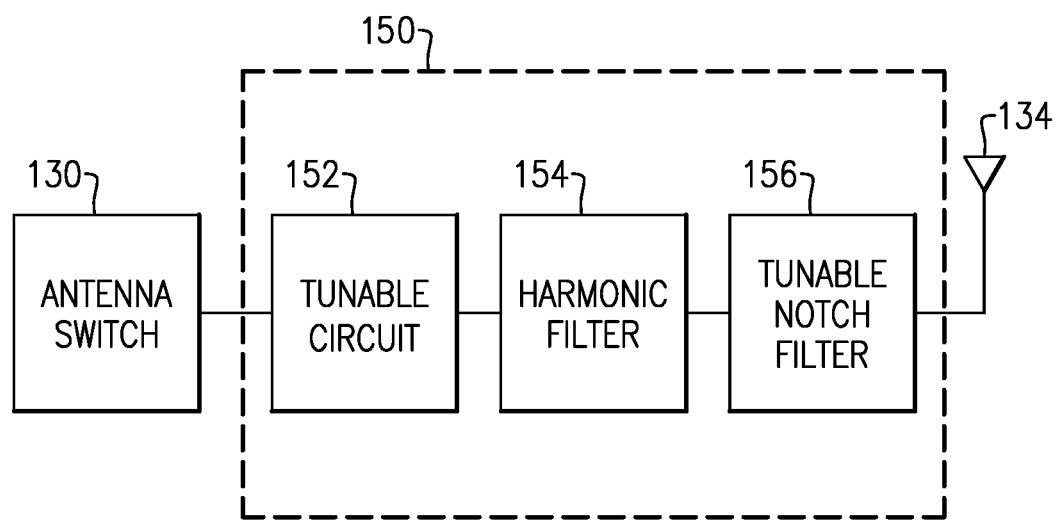
FIG. 12 is a schematic block diagram showing more details of antenna filters according to an embodiment.

FIG. 12 is a schematic block diagram showing more details of antenna filters according to an embodiment. The antenna filters 150 of FIG. 12 are an example of the antenna filters 132 of FIG. 11A and/or FIG. 11B. One or more filters can be electrically coupled between the contour tuning circuit 152 and the antenna 134. As shown in FIG. 12, a harmonic filter 154 and a tunable notch filter 156 can be electrically coupled between the contour tuning circuit 152 and the antenna 134. The harmonic filter 154 and the notch filter 156 can reduce and/or eliminate harmonic distortion from signals propagating between the antenna switch 130 and the antenna 134. The harmonic filter 154 can implement one or more features of the elliptic filter 46 of FIG. 5, for example. In some other implementations, the harmonic filter 154 can implement any suitable harmonic filtering. The tunable notch filter 156 can implement one or more features of the tunable notch filter 48 of FIG. 5, for example. In some other implementations, the tunable notch filter 156 can implement a static notch filter or any other suitable notch filter.

Figure 13:
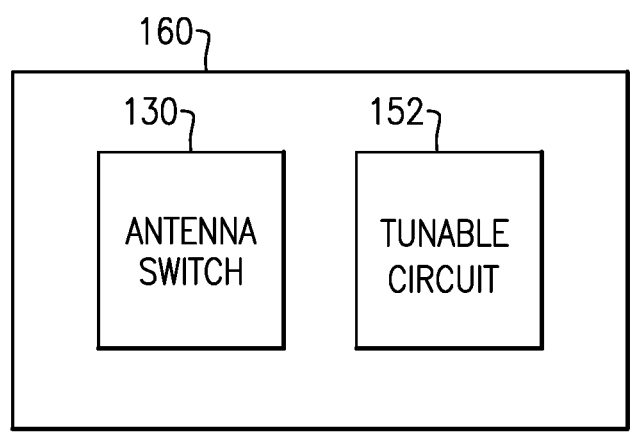
FIG. 13 is a schematic block diagram of a module according to an embodiment.

FIG. 13 is a schematic block diagram of a module 160 according to an embodiment. The illustrated module 160 includes an antenna switch 130 and a contour tuning circuit 152. The module 160 can be referred to as an antenna switch module. In the module 160, a contour tuning circuit in accordance with any of the principles and advantages discussed herein can be integrated with an antenna switch 130 within a common package. The contour tuning circuit 152 can be on the same packaging substrate as the antenna switch 130. Some or all of the circuitry of the contour tuning circuit 152 can be integrated on the same die as the antenna switch 130.

Figure 14:
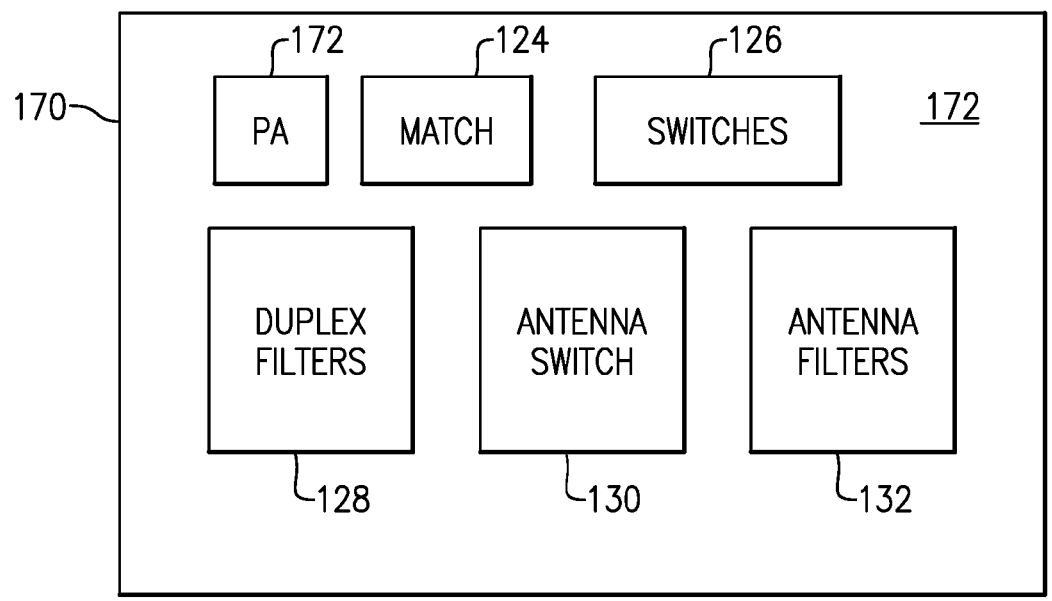
FIG. 14 is a schematic block diagram of a module according to another embodiment.

FIG. 14 is a schematic block diagram of a module 170 according to an embodiment. The illustrated module 170 includes a packaging substrate 172 on which a power amplifier 122, a matching network 124, a switch (e.g., a band select switch) 126, duplex filters 128, an antenna switch 130, and antenna filters 132 that include a contour tuning circuit are arranged. The illustrated elements can be enclosed within a common package. In some other embodiments, the antenna filters 132 can be implemented in a module and packaged with one or more of the illustrated elements of FIG. 14. Switches of the antenna switch 130 and/or of embodiments of the contour tuning circuit of the antenna filters 132 can be implemented in semiconductor-on-insulator technology such as silicon-on-insulator technology. The packaging substrate can be a laminate substrate in certain embodiments.

Figure 15:
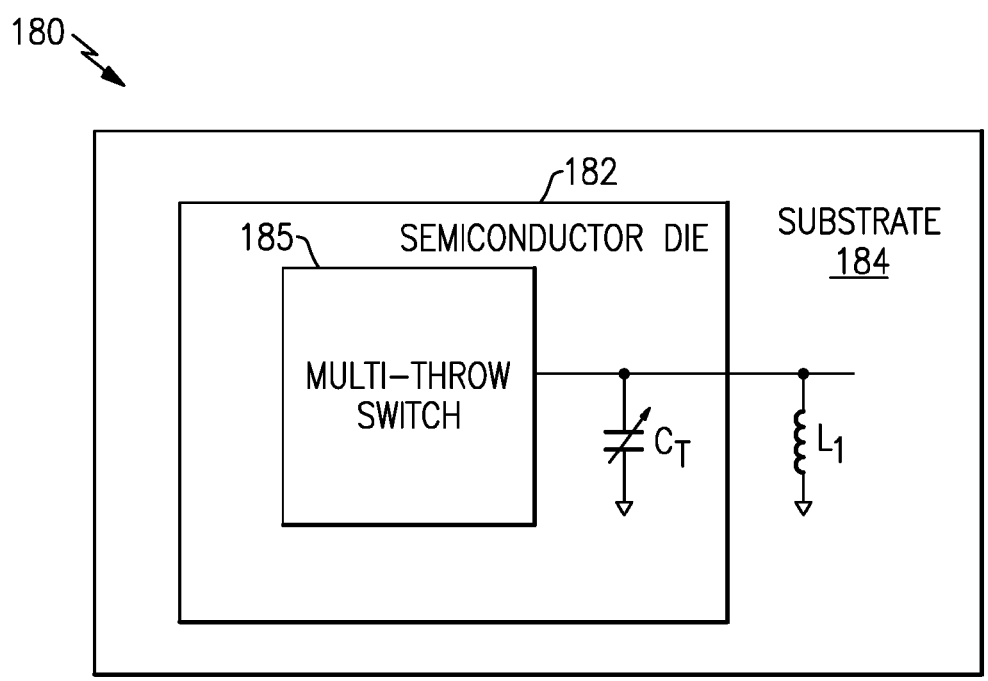
FIG. 15 is a schematic diagram of a packaged module according to an embodiment.

FIG. 15 is a schematic diagram of a packaged module 180 according to an embodiment. Aspects of this disclosure can be implemented in the packaged module 180. The packaged module 180 includes a semiconductor die 182 and a shunt inductor $L_1$ on a packaging substrate 184 enclosed within a common package. The packaged module 180 can include one or more other passive components on the packaging substrate in certain implementations. Some such packaged modules can be multi-chip modules. The semiconductor die 182 can be manufactured using any suitable process technology. As one example, the semiconductor die 182 can be a semiconductor-on-insulator die, such as a silicon-on-insulator die.

As shown in FIG. 15, the packaged module 180 includes the semiconductor die 182 and the shunt inductor $L_1$ on the packaging substrate 184. The semiconductor die 182 can include a multi-throw switch 185 and the tunable capacitance circuit $C_T$. The multi-throw switch 185 can be arranged, for example, as an antenna switch or as a select switch arranged to couple a selected receive filter to a low noise amplifier. The shunt inductor $L_1$ can be implemented as a spiral trace on the packaging substrate 184 or in any other suitable manner to provide a desired inductance. The packaging substrate 184 can be a laminate substrate, for example.

Tunable Notch Filter

Carrier Aggregation in cellular networks has been a driver for significant improvement in transmit harmonic levels such that a transmitter of a mobile device, such as a smart phone, may not significantly degrade the sensitivity of the receiver of the mobile device in certain applications. In an effort to avoid degrading insertion loss and implement additional filtering, it can be desirable to have a filter with tunable characteristics that can target higher rejection during specific operating modes. However, tuned elements of such a filter can regenerate harmonics in a large signal environment. This can limit the effective harmonic floor of the electronic system. This disclosure provides a tunable filter with a tuned network that can significantly reduce the large signal amplitude presented to the tuned element and cause the harmonic floor of the filter to be improved.

Some previous systems included fixed filter responses and would trade insertion loss for improved rejection. Other tunable filters having tuning elements with limited dynamic range can provide a small signal solution, but such tunable filters can have degraded performance for large signals, such as signals provided to an antenna for wireless transmission. A large signal can be a signal having a power of at least 15 decibel-milliwatts (dBm). In some instances, a large signal can have a power of at least 20 dBm.

Aspects of this disclosure relate to a tunable filter with a series/parallel resonant network that is tuned such that a series resonance circuit is arranged in parallel with a tuning element. The series resonance circuit can be a series LC circuit. The inductance and capacitance vales of the series resonant circuit can be selected to match a resonant frequency of a large signal carrier and provide an inductive effective impedance above the resonant frequency of the large signal carrier. The series resonance circuit can be arranged to present a low impedance at the frequency of a large signal carrier. This can effectively short the tuning element at the frequency of the large signal carrier. Accordingly, a relatively low voltage swing can be present across the tuning element. At frequencies above a resonant frequency of a series resonance circuit of the tunable filter, the effective impedance of the series resonance circuit can become inductive. This effective inductive impedance in parallel with the tuning element can create a parallel resonance that can be tuned to a desired frequency for rejection by tuning the tuning element. The tuning element can be, for example, a tunable capacitance circuit. The tunable filter can provide, for example, rejection at a second harmonic of a large signal carrier.

In certain embodiments, a tunable filter in accordance with the principles and advantages discussed herein can be coupled in series in a signal path between an antenna switch and an antenna port. The tunable filter can be in series with a low pass filter between the antenna switch and the antenna port. The tunable filter can be a tunable notch filter. The tunable filter can include a series LC circuit in parallel with a tunable impedance circuit, such as a tunable capacitance circuit. The impedance of the tunable impedance circuit can be adjusted such that the tunable filter provides a desired characteristic for a signal being provided from the antenna switch module to the antenna port. For instance, the antenna switch module can include a multi-throw switch and, depending on a frequency band associated with a throw of the multi-throw switch that is activated, the tunable impedance circuit can be set to a state that results in rejection of a second harmonic associated with the frequency band of the activated throw of the multi-throw switch.

According to some other embodiments, a tunable filter in accordance with the principles and advantages discussed herein can be implemented to filter an output of a power amplifier. In such embodiments, the tunable filter can reduce harmonics in signals amplified by the power amplifier.

Advantageously, the tunable filters discuss herein can provide tunability in a large signal environment. Insertion loss to a desired carrier can be relatively low due to relatively high quality factor (Q) series resonance (e.g., a Q of greater than 20), while 20 dB or more of rejection can be introduced at frequencies above the frequency of a large signal carrier in certain embodiments. The tunable filters discussed herein can address difficulties in suppressing harmonics in carrier aggregation applications.

Figure 16:
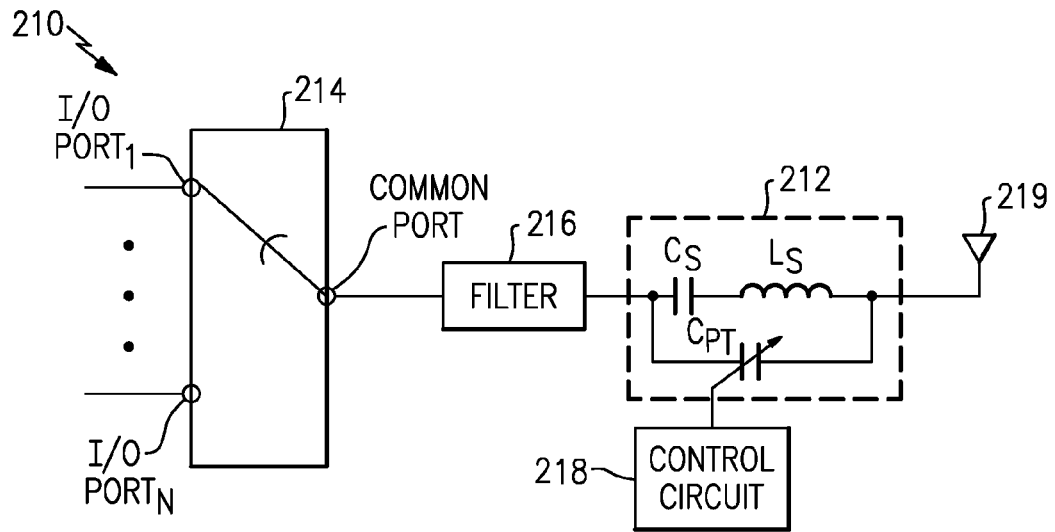
FIG. 16 is a schematic diagram of a radio frequency system that includes a tunable notch filter according to an embodiment.

FIG. 16 is a schematic diagram of a radio frequency (RF) system 210 that includes a tunable notch filter 212 according to an embodiment. RF systems discussed herein can be configured to process radio frequency signals having a frequency in a range from about 30 kHz to 300 GHz, such as in a range from about 450 MHz to 6 GHz. As illustrated, the RF system 210 includes a tunable notch filter 212, an antenna switch 214, a filter 216, a control circuit 218, and an antenna 219 arranged to transmit and receive RF signals. An antenna switch module can include the antenna switch 214 and control circuitry associated with the antenna switch 214. The antenna switch module can include the tunable notch filter 212 integrated with the antenna switch 214. The tunable notch filter 212 and the antenna switch 214 can be included within a common package. The antenna switch 214 and at least a portion of the tunable filter 212 can be implemented on a common semiconductor die.

The antenna switch 214 has multiple throws. The antenna switch 214 can in 8 or more throws in certain embodiments. For instance, the antenna switch 214 can include 10 to 12 throws in some embodiments. The antenna switch 214 includes a plurality of input/output (I/O) ports I/O PORT$_1$ to I/O PORT$_N$ and a common port COMMON PORT. An I/O port can serve as an input port, an output port, or an input and output port. For instance, an I/O port can serve as an input of the antenna switch 214 for a transmission path and an output of the antenna switch 214 for a receive path. The antenna switch 214 can electrically connect a selected I/O port to the common port. For instance, FIG. 16 illustrates a first I/O port I/O PORT$_1$ electrically connected to the common port COMMON PORT. The antenna switch 214 can activate a throw to electrically connect an I/O port to the common port.

The filter 216 is in a signal path between the common port of the antenna switch 214 and the antenna 219. The filter 216 can provide any suitable filtering. In certain embodiments, the filter 216 is a low pass filter.

As illustrated in FIG. 16, the tunable notch filter 212 is in series with the filter 216 in the signal path between the common port of the antenna switch 214 and the antenna 219. The illustrated tunable notch filter 212 includes a series resonant circuit in parallel with a tunable impedance circuit. As illustrated, the series resonant circuit is a series LC circuit that includes a capacitor $C_S$ in series with an inductor $L_S$. The tunable impedance circuit can be a tunable capacitance circuit $C_{PT}$. The series LC circuit can effectively short the tunable impedance circuit at a frequency of a radio frequency signal propagating between the common port of the antenna switch 214 and the antenna 219. The series LC circuit can be inductive at frequencies above a resonant frequency of the series LC circuit, and the series LC circuit can create a parallel resonance with the tunable impedance circuit to provide a notch of the tunable notch filter 212. The tunable notch filter 212 can provide a notch at a harmonic, such as a second harmonic, of the radio frequency signal propagating between the common port of the antenna switch 214 and the antenna 219.

While the tunable notch filter 212 shown in FIG. 16 includes a series LC circuit in parallel with a tunable capacitance circuit, other suitable tunable notch filter topologies are possible. Other tunable notch filter circuit topologies can include any other suitable passive impedance network that includes passive impedance elements in series and/or parallel with each other. For instance, the illustrated tunable capacitance circuit $C_{PT}$ can be implemented by a tunable LC circuit or a tunable RC circuit in certain applications.

The antenna switch 214 can be configurable into states in which a selected throw is activated to electrically connect a selected I/O port to the common port. The other throws can be deactivated while the selected throw is activated. In different states of the antenna switch 214, different I/O ports are electrically connected to the common port of the antenna switch 214. Two or more different I/O ports can be associated with different frequency bands. The control circuit 218 can tune the tunable impedance circuit such that a desired impedance is in parallel with the series LC circuit. For instance, the control circuit 218 can tune the tunable impedance circuit so as to provide a notch for a frequency band associated with an I/O port of the antenna switch 214 that is selected.

Figure 17A:
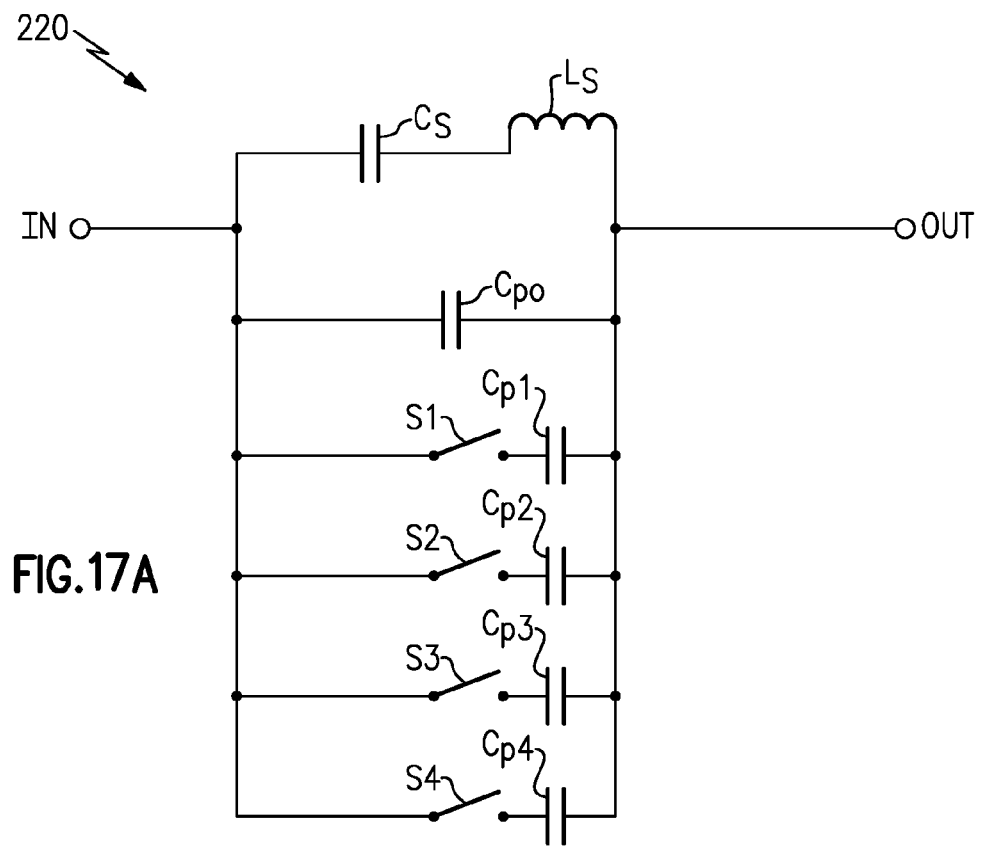
FIG. 17A is a schematic diagram of a tunable notch filter according to an embodiment.

FIG. 17A is a schematic diagram of a tunable notch filter 220 according to an embodiment. The tunable notch filter 220 is an example of the tunable notch filter 212 of FIG. 16. As illustrated, the tunable notch filter 220 includes a series LC circuit in parallel with a tunable capacitance circuit. The series LC circuit includes a capacitor $C_S$ in series with an inductor $L_S$ between an input port IN and an output port OUT. The tunable notch filter 220 can filter signals propagating from the input port IN to the output port OUT and/or signals propagating from the output port OUT to the input port IN. The tunable capacitance circuit includes a plurality of switches S1 to S4 each in series with a respective capacitor $C_{P1}$ to $C_{P1}$. The switches S1 to S4 can adjust the capacitance of the tunable capacitance circuit by switching-in and/or switching-out respective capacitors $C_{P1}$ to $C_{P4}$ to adjust an amount of capacitance coupled in parallel with a fixed capacitor $C_{P0}$ that is in parallel with the series LC circuit. In some other embodiments, switches can be implemented on opposing sides of a capacitor of the tunable capacitance circuit.

Figure 17B:
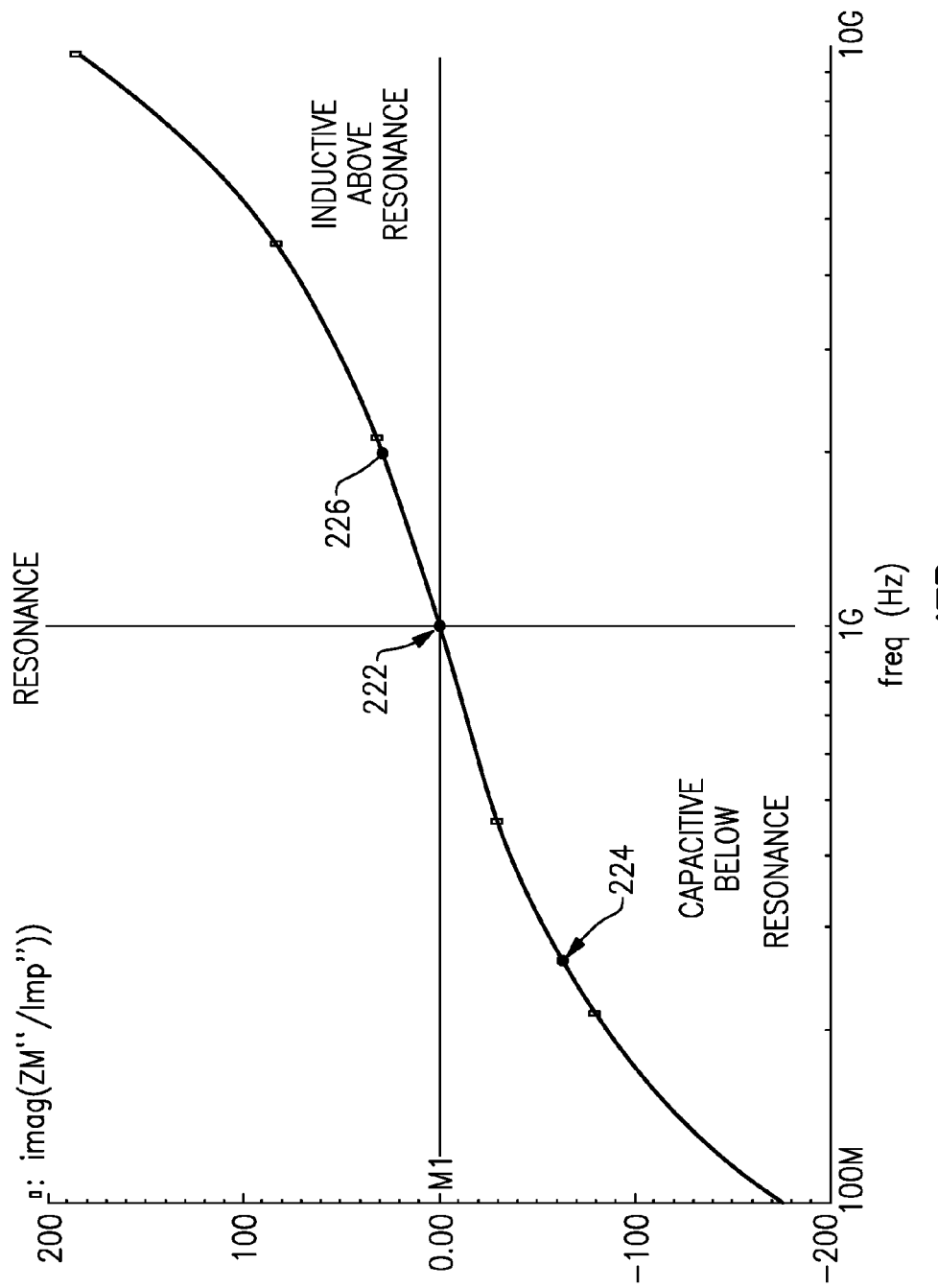
FIG. 17B is a graph showing a relationship of impedance versus frequency for the notch filter of FIG. 17A.

FIG. 17B is a graph showing a relationship of impedance versus frequency for the notch filter 220 of FIG. 17A. The graph of FIG. 17B plots the impedance of the series LC circuit of the tunable notch filter 220 over frequency. This graph shows that the series LC circuit can resonate at a frequency located at point 222 corresponding to a frequency of a carrier. This can effectively short the input port IN of the tunable notch filter 220 to the output port OUT of the tunable notch filter 220 at the frequency of the carrier. In the graph of FIG. 17B, the resonant frequency of the series LC circuit is about 1 GHz. The capacitance of the capacitor Cs and the inductance of the inductor Ls can be selected such that the series LC circuit can have any suitable resonant frequency. According to certain implementations, the resonant frequency of the series LC circuit can be in a range from about 700 MHz to 900 MHz. In some implementations, the capacitance of the capacitor $C_S$ can be in a range from around 7 pF to 10 pF and the inductance of the inductor $L_S$ can be in a range from around 2 nH to 4 nH.

As shown in FIG. 17B, at points on the illustrated curve below the resonant frequency of the series LC circuit (e.g., at point 224), the impedance of the series LC circuit can be capacitive. As also shown in FIG. 17B, at points on the illustrated curve above the resonant frequency of the series LC circuit (e.g., at point 226 at a second harmonic of the resonant frequency), the impedance of the series LC circuit can be inductive. For example, at point 226, the effective inductance of the series LC circuit can be around a few nanohenries.

Figure 17C:
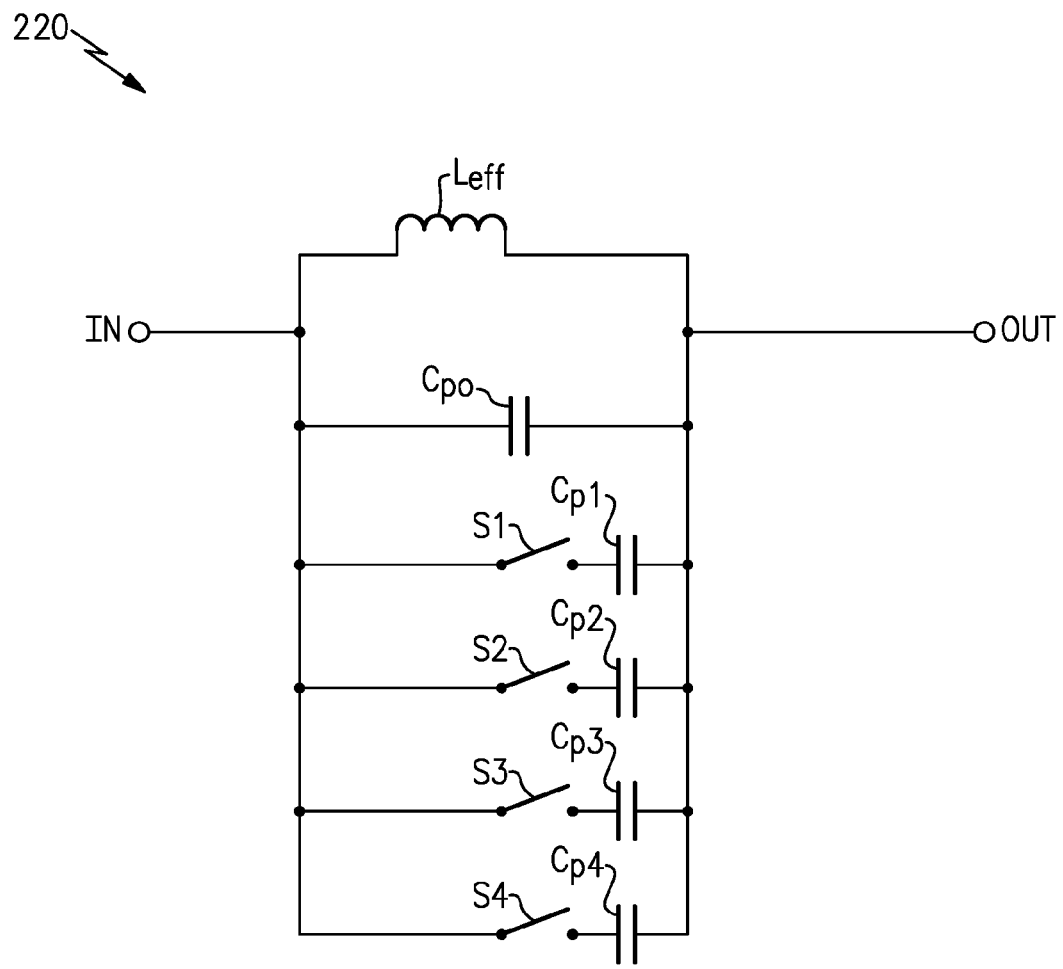
FIG. 17C is schematic diagram illustrating that a series LC circuit of the notch filter of FIG. 17A is inductive at a relatively high frequency.

FIG. 17C is a schematic diagram illustrating that a series LC circuit of the notch filter of FIG. 17A is inductive at a frequency above the resonant frequency of the series LC circuit. As shown in FIG. 17B, the series LC circuit of the tunable notch filter 220 of FIG. 17A can have an inductive impedance at frequencies above the resonant frequency of the series LC circuit (e.g., at point 226 on the graph of FIG. 17B). FIG. 17C illustrates that the series LC circuit of the notch filter can behave as an inductance $L_{EFF}$ at frequencies above the resonant frequency of the series LC circuit.

Figure 17D:
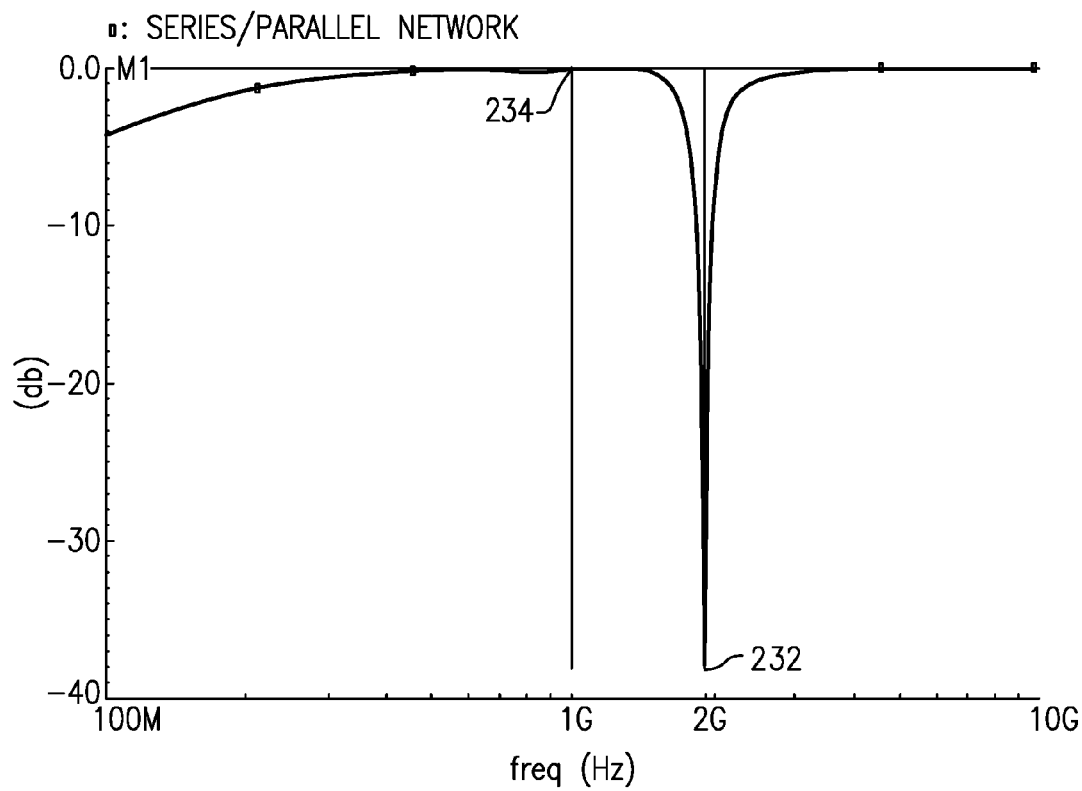
FIG. 17D is a graph illustrating a relationship of impedance versus frequency associated with the tunable notch filter of FIG. 17C.

In the tunable notch filter 220, the tunable capacitance circuit in parallel with the series LC circuit can provide harmonic rejection. The frequency at which harmonic rejection is provided can be tuned by adjusting the capacitance of the tunable capacitance circuit. FIG. 17D is a graph illustrating a relationship of impedance versus frequency associated with the tunable notch filter of FIG. 17C. The impedance in this graph represents a series/parallel frequency response of the tunable notch filter. FIG. 17D shows that the tunable notch filter 220 can provide rejection at second harmonic of a carrier and that there is a low loss at the frequency of the carrier. In particular, at point 232 of the illustrated curve, a parallel resonance of the inductive impedance $L_{EFF}$ of the series LC circuit and a tuned capacitance provide rejection. The frequency at which harmonic rejection is provided can be at a second harmonic of a carrier, for example. Additionally, at point 234 on the illustrated curve, a low loss can be achieved at the frequency of the carrier.

Figure 17E:
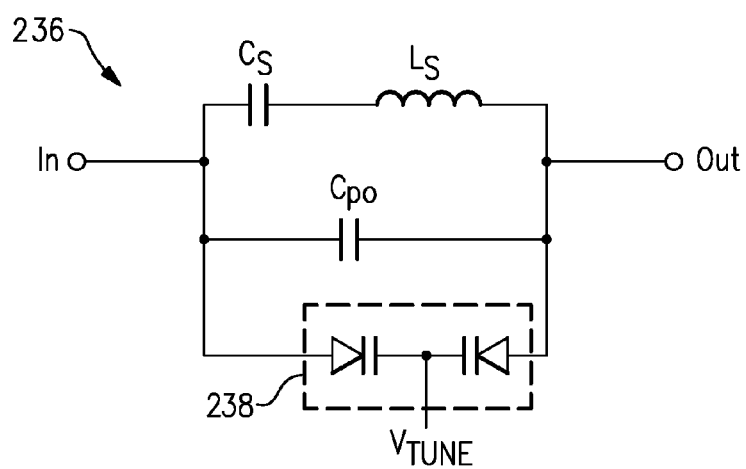
FIG. 17E is a schematic diagram of a tunable notch filter according to another embodiment.

FIG. 17E is a schematic diagram of a tunable notch filter 236 according to another embodiment. The tunable notch filter 236 is an example of the tunable notch filter 212 of FIG. 16. As shown in FIG. 17E, the tunable notch filter 236 includes a tunable capacitance circuit 238 that includes varactors. A tuning voltage $V_{TUNE}$ can be applied to the varactors to adjust capacitance in with parallel with a series LC circuit. Varactors can have a higher Q factor than some other tunable capacitance circuits. A servo loop can be implemented in connection with a varactor based tunable capacitance circuit to compensate for temperature dependence of varactors. In some other embodiments, a tunable capacitance circuit can include a different number of varactors, a tunable microelectromechanical systems (MEMS) capacitor, or any other suitable variable capacitance circuit.

Figure 18A:
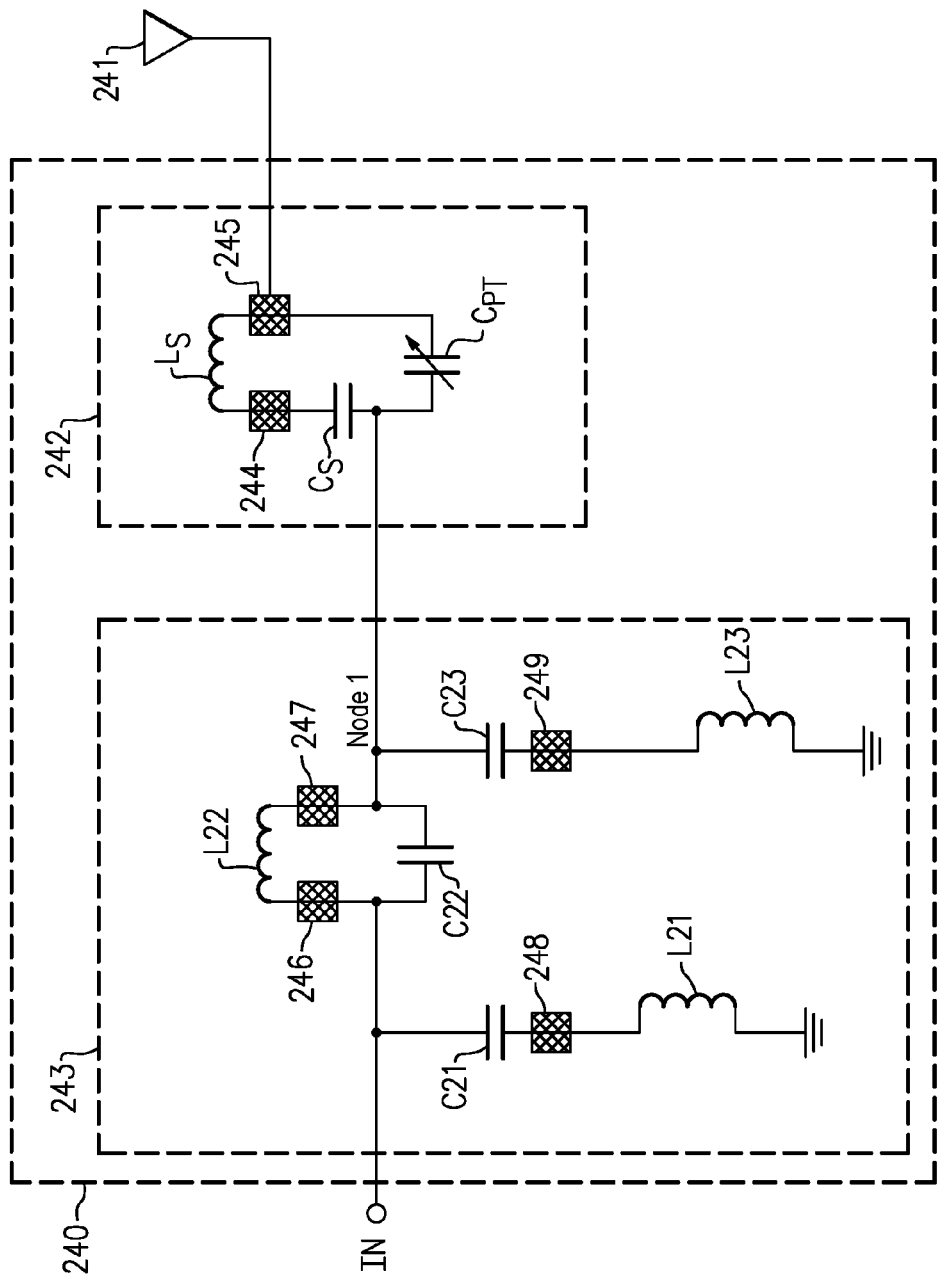
FIG. 18A is a schematic diagram of antenna filters including a tunable antenna filter according to an embodiment.

FIG. 18A is a schematic diagram of an antenna filter assembly 240 that includes a tunable notch filter 242 according to an embodiment. The antenna filter assembly 240 can be coupled between an antenna switch and an antenna 241. The tunable notch filter 242 is an example of the tunable notch filter 212 of FIG. 16. Any of the principles and advantages of the tunable notch filter 242 can be implemented in connection with any of the tunable notch filters discussed herein. The illustrated antenna filter assembly 240 includes the tunable notch filter 242 and a low pass filter (LH) 243.

Some elements of the illustrated antenna filter assembly 240 can be implemented on a semiconductor die, such as a silicon-on-insulator die, and other elements of the antenna filter assembly 240 can be implemented external to the semiconductor die. For instance, capacitors and switches can be implemented on the semiconductor die and inductors can be implemented external to the semiconductor die. The semiconductor die includes contacts (e.g., pins, bumps, pads such as wire bond pads, or the like) to provide electrical connections between circuit elements on the semiconductor die and circuit elements external to the die. As illustrated in FIG. 18A, the semiconductor die includes contacts 244 and 245 associated with the tunable notch filter 242 and contacts 246, 247, 248, and 249 associated with the LPF 43. Any suitable electrical connector can be implemented between a contact of the semiconductor die and an element of the antenna filter assembly 240 implemented external to the semiconductor die. For instance, an inductor can be electrically connected to a contact of the die by way of a conductive trace, a wire bond, the like, or any suitable combination thereof.

The illustrated LPF 243 is arranged as an elliptical filter. An elliptical filter can exhibit equalized ripple responses in both the pass band and the stop band, and can thus provide rejection relatively near and about the resonant frequency to create a stop band which can suppress undesired signals that may occur. An elliptical filter can be desirable for providing harmonic frequency traps while also providing relatively low insertion loss in the pass band. The illustrated LPF 243 can operate as an elliptical filter to provide a third harmonic frequency trap and has a notch at about 5 GHz.

The LPF 243 includes an inductor L21 and a capacitor C21 connected between the I/O port I/O and ground. The inductor L21 and the capacitor C21 are electrically connected by way of the contact 248. The inductor L21 and the capacitor C21 can have impedances selected so as to absorb an off state capacitance associated with an antenna switch. The capacitance of the capacitor C21 of the LPF 243 can be in parallel with parasitic capacitance of a multi-throw switch of an antenna switch module. Accordingly, the capacitance of C21 can be reduced b e amount corresponding to a parasitic capacitance of the multi-throw switch of the antenna switch module. By arranging C21 in parallel with parasitic capacitance of the multi-throw switch, the physical size of C21 can be reduced. Series capacitors can be used to implement one or more of the capacitors in the antenna filter assembly 240. This can limit voltage across a particular capacitor.

The LPF 243 also includes a parallel LC circuit that includes a capacitor C2 in parallel with an inductor L22. The parallel LC circuit is coupled in series between the I/O port I/O and the tunable notch filter 242. The parallel LC circuit can provide an open circuit at the third harmonic of an RF signal propagating between the I/O port I/O and the antenna 241 and an impedance match at the fundamental frequency of the RF signal. The capacitance of the capacitor C22 and the inductance of the inductor L22 can be selected so as to achieve this functionality. As illustrated, the capacitor C22 is electrically coupled in parallel with the inductor by way of contacts 246 and 247.

The LPF 243 also includes an inductor L23 and a capacitor C23 connected between an internal node Node 1 and ground. The capacitor C23 is electrically connected to the inductor L23 by way of contact 249. The capacitor C23 and the inductor L23 can provide a notch at approximately 5 GHz. This can filter out a Wi-Fi signal having a frequency of approximately 5 GHz. The capacitance of the capacitor C23 and the inductance of the inductor L23 can be selected so as to achieve a notch at 5 GHz. In some other embodiments, the series LC circuit that includes the inductor L23 and the capacitor C23 can provide a notch at a different selected frequency.

As shown in FIG. 18A, the tunable notch filter 242 includes an inductor $L_S$, a capacitor $C_S$ in series with the inductor $L_S$, and a tunable capacitance circuit $C_{PT}$. As illustrated, the series inductor L22 has a first end electrically connected to the capacitor $C_S$ by way of contact 244 and a second end electrically connected to the tunable capacitance circuit $C_{PT}$ by way of the contact 245. A first terminal of the series capacitor $C_S$ and a first terminal of the tunable capacitance circuit $C_T$ are connected to the internal node Node 1 in FIG. 18A. As shown in FIG. 18A, the series inductor $L_S$ is connected between a second terminal of the series capacitor $C_S$ and a second terminal of the tunable capacitance circuit $C_{PT}$ by way of contacts 244 and 245, respectively. The antenna 241 is also connected to the contact 245 in FIG. 18A. The tunable capacitance circuit $C_{PT}$ can be implemented in accordance with any of the principles and advantages of any of the tunable capacitance circuits discussed herein, such as the tunable capacitance circuit of FIG. 17A.

The illustrated tunable notch filter 242 can provide second harmonic rejection. Implementing a series LC circuit, such as the series LC circuit formed by the series inductor $L_S$ and the series capacitor $C_S$, in parallel with a tunable capacitance circuit $C_{PT}$ can limit the signal swing across tuning switches of the tunable capacitance circuit $C_{PT}$. For instance, less than about 1.4 Volts peak signal is present across switches of the tunable capacitance circuit $C_{PT}$ in certain embodiments. According to some embodiments, less than about 1 Volt peak signal is present across switches of the tunable capacitance circuit $C_{PT}$. Switches of the tunable capacitance circuit $C_{PT}$ can regenerate harmonics in a large signal environment and limit the effective harmonic floor of the system. By limiting the voltage swing across the switches of the tunable capacitance circuit $C_{PT}$, the harmonic floor of the system can be improved.

Figure 18B:
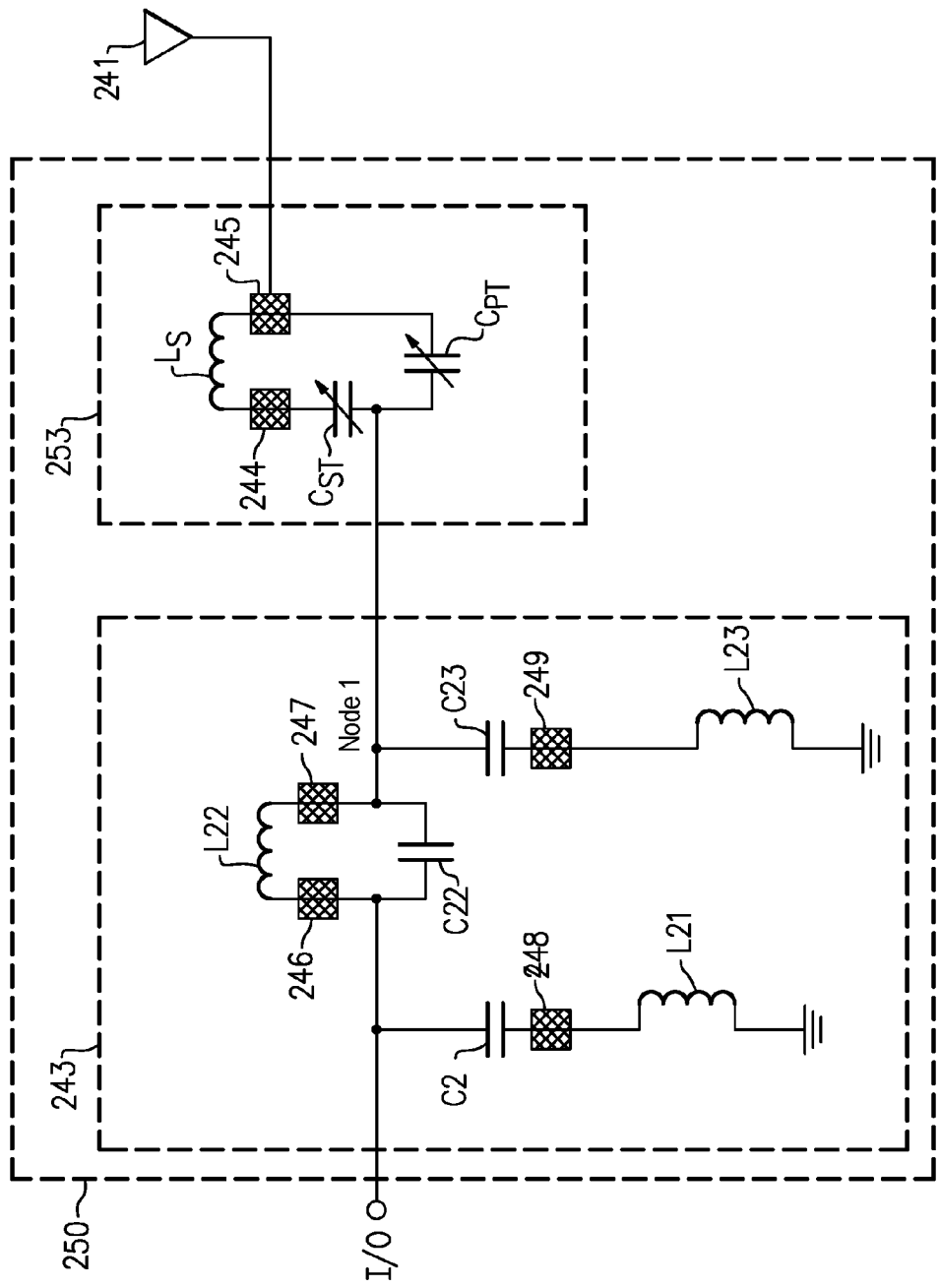
FIG. 18B is a schematic diagram of antenna filters including a tunable antenna filter according to another embodiment.

FIG. 18B is a schematic diagram of an antenna filter assembly 250 including a tunable antenna filter 253 according to another embodiment. The filter assembly 250 is like the filter assembly 240 except that the series capacitor $C_S$ of the tunable notch filter 242 of FIG. 18A is replaced by a tunable capacitance circuit $C_{ST}$ in the tunable notch filter 253 of FIG. 18B. With the tunable capacitance circuit $C_{ST}$, the tunable notch filter 253 can adjust a frequency at which the series LC circuit that includes the tunable capacitance circuit $C_{ST}$ and the inductor $L_S$ resonates. This can also adjust the frequency at which the series LC circuit behaves as an inductive impedance instead of a capacitive impedance. In certain embodiments, the tunable capacitance circuit $C_{ST}$ can be implemented such that it adds less than about 0.5 dB of insertion loss relative to the capacitor $C_S$ of FIG. 18A. The tunable capacitance circuit $C_{ST}$ can be implemented in accordance with any of the principles and advantages of any of the tunable capacitance circuits discussed herein.

FIG. 19 is a graph showing plots of insertion loss versus frequency for a tunable antenna filter according to an embodiment. This graph includes curves corresponding to selected antenna switch module signal paths illustrating insertion loss associated with states of the tunable notch filter 242 of FIG. 18A. A notch at the second harmonic can be tuned by adjusting capacitance in a tunable capacitance circuit that is in parallel with a series LC circuit based on a selected antenna switch module signal path. Any suitable control circuit, such as the control circuit 218 of FIG. 16, can tune the tunable capacitance circuit. The curve 262 corresponds to Long Term Evolution (LTE) Band 12 and has a notch at a frequency between 1.4 GHz and 1.5 GHz. The curve 263 can correspond to LTE Band 13 and has a notch around 1.5 GHz. Curves 264, 265 and 266 correspond to LTE Bands 26, 20, 8, respectively, and have notches at the second harmonics for respective frequency bands. Curve 267 corresponds to LBDIV.

Figure 20:
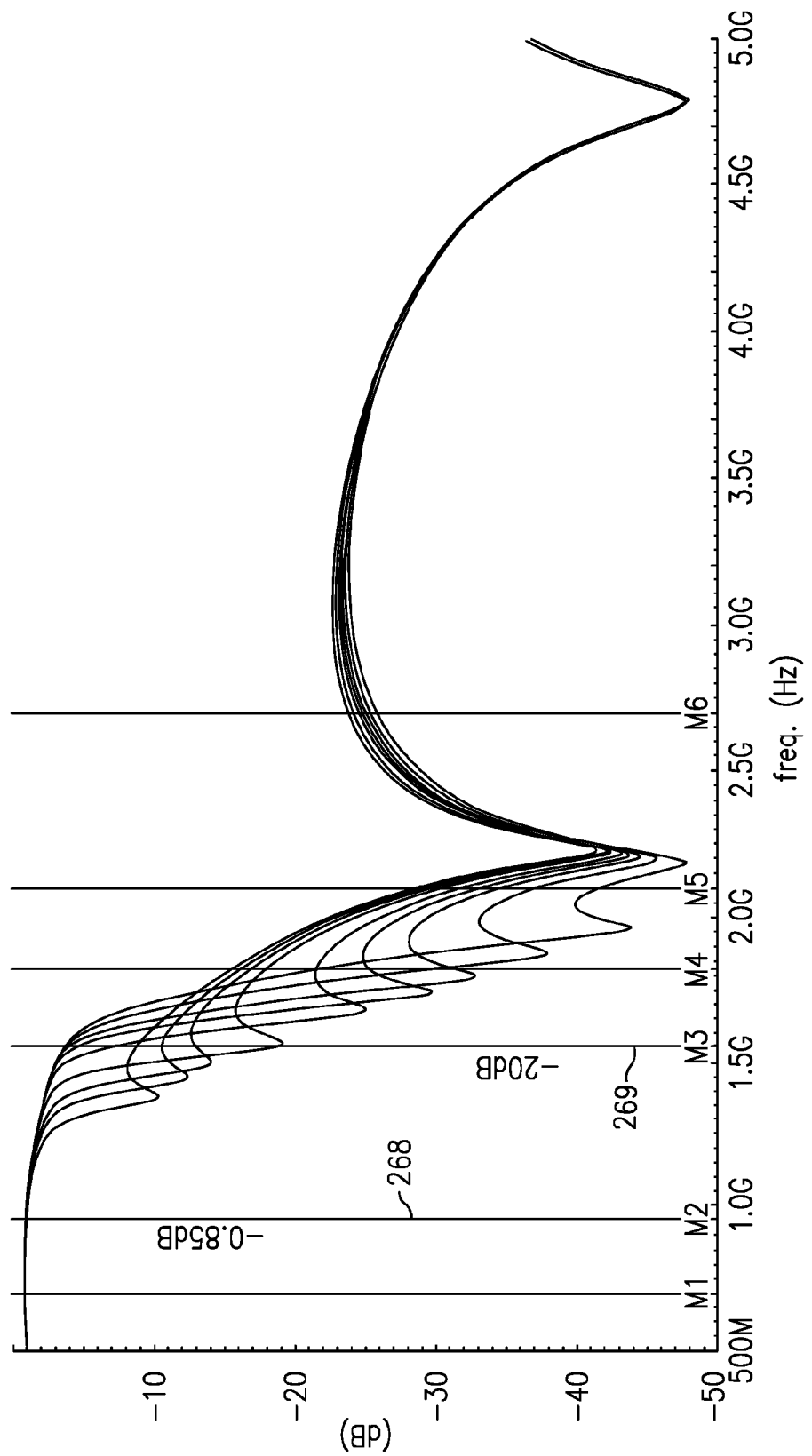
FIG. 20 is a graph showing plots of filter response versus frequency for a tunable antenna filter according to an embodiment.

FIG. 20 is a graph showing plots of filter response versus frequency for a tunable antenna filter according to an embodiment. This graph shows curves illustrating frequency responses of states of the tunable notch filter 242 of FIG. 18A. These curves indicate that notch depth decreases as the notch frequency gets closer to the passband. The edge of the passband can be indicated by the vertical line 268 at frequency M2. An example of notch depth is shown by vertical line 269 at frequency M3 where the notch depth has approximately −20 dB of attenuation. As shown in FIG. 20, the tunable notch filter 242 can have more than 20 dB of rejection for notches at frequencies above 1.5 GHz.

Figure 21:
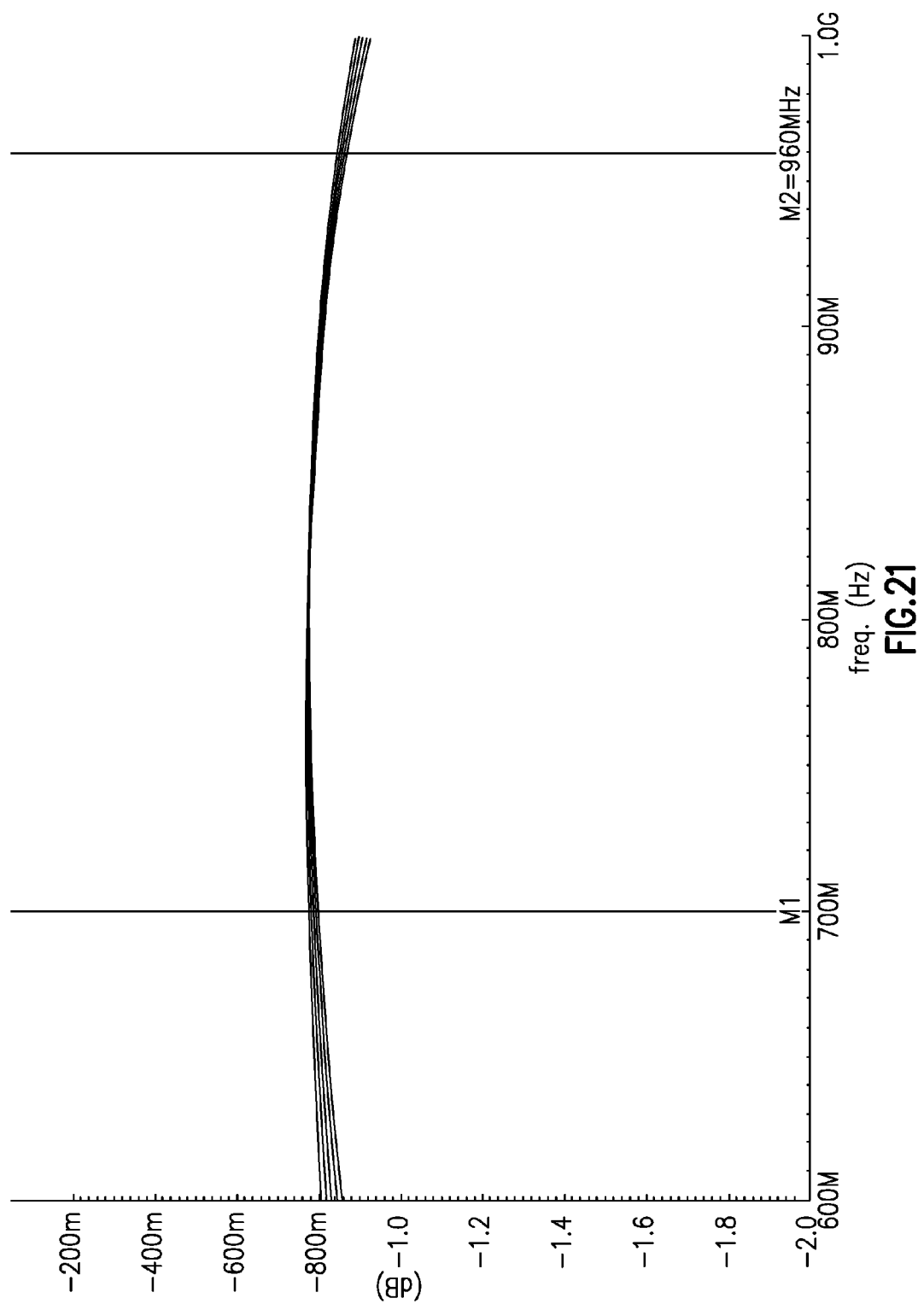
FIG. 21 is a graph showing plots of insertion loss versus frequency for an antenna switch and a tunable antenna filter according to an embodiment.

FIG. 21 is a graph showing plots of insertion loss versus frequency for an antenna switch and a tunable antenna filter according to an embodiment. This graph plots insertion loss versus frequency for an antenna switch module and the antenna filter assembly 240 of FIG. 18A. The plots indicate that there is less than 1 dB of insertion loss at 960 MHz independent of the state of the tunable notch filter.

The series LC circuit of tunable notch filters discussed herein can experience process variations. The capacitance of the capacitor $C_S$ of the series LC circuit can vary from die to die. Alternatively or additionally, the inductance of the inductor $L_S$ of the series LC circuit can vary from module to module. Process variations can degrade the effectiveness of a tunable notch filter. To reduce such degradation, trimming can be implemented. Accordingly, a state of tunable impedance circuit of any of the tunable notch filters discussed herein can be set based at least partly on trim data.

Figure 22:
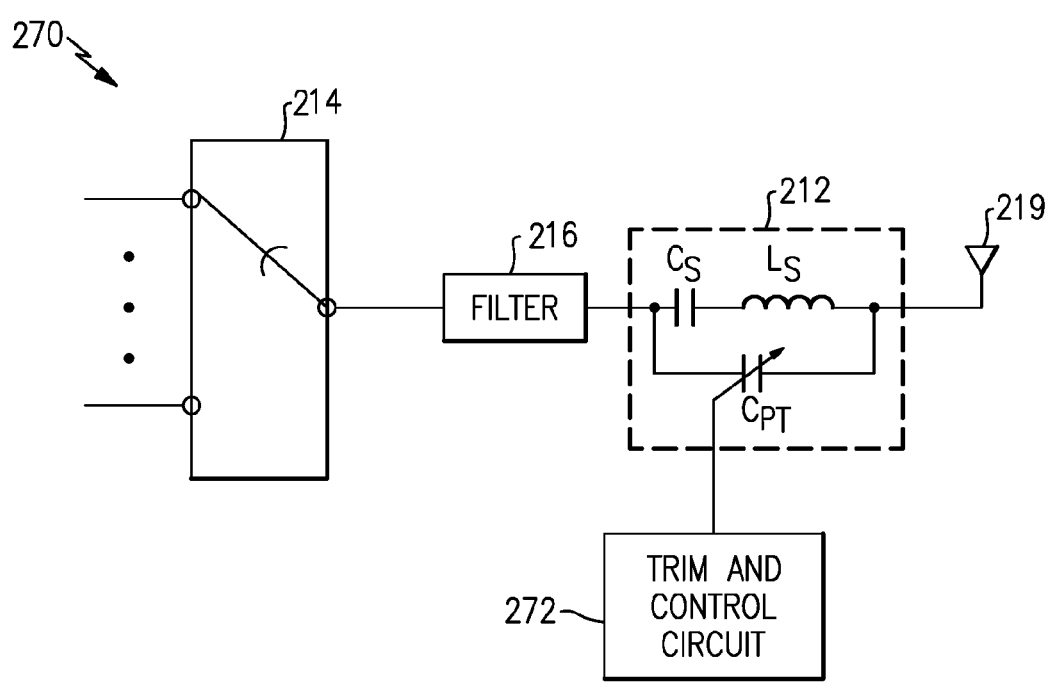
FIG. 22 is a schematic diagram of a radio frequency system that includes a tunable notch filter and a trim and control circuit according to an embodiment.

FIG. 22 is a schematic diagram of a radio frequency system 270 that includes a tunable notch filter 212 and a trim and control circuit 272 according to an embodiment. The radio frequency system 270 is like the radio frequency system 210 of FIG. 16 except that the control circuit 218 of FIG. 16 is replaced by a trim and control circuit 272 in FIG. 22. The trim and control circuit 272 can implement any of the functions for controlling a tunable impedance circuit, such as a tunable capacitance circuit, discussed herein. The trim and control circuit 272 can use trim data to set the state of a tunable impedance circuit. The trim data can represent a process variation associated with one or more circuit elements of the tunable notch filter 212. For instance, the trim data can represent process variation(s) associated with the capacitor $C_S$ and/or the series inductor $L_S$ of the tunable notch filter 212. The trim data can be used to shift a frequency response of the tunable notch filter so as to compensate for a process variation of one or more circuit elements of the tunable notch filter 212. For instance, using the trim data, the trim and control circuit 272 can compensate for process variations of the series LC circuit of the tunable notch filter 212.

Figure 23:
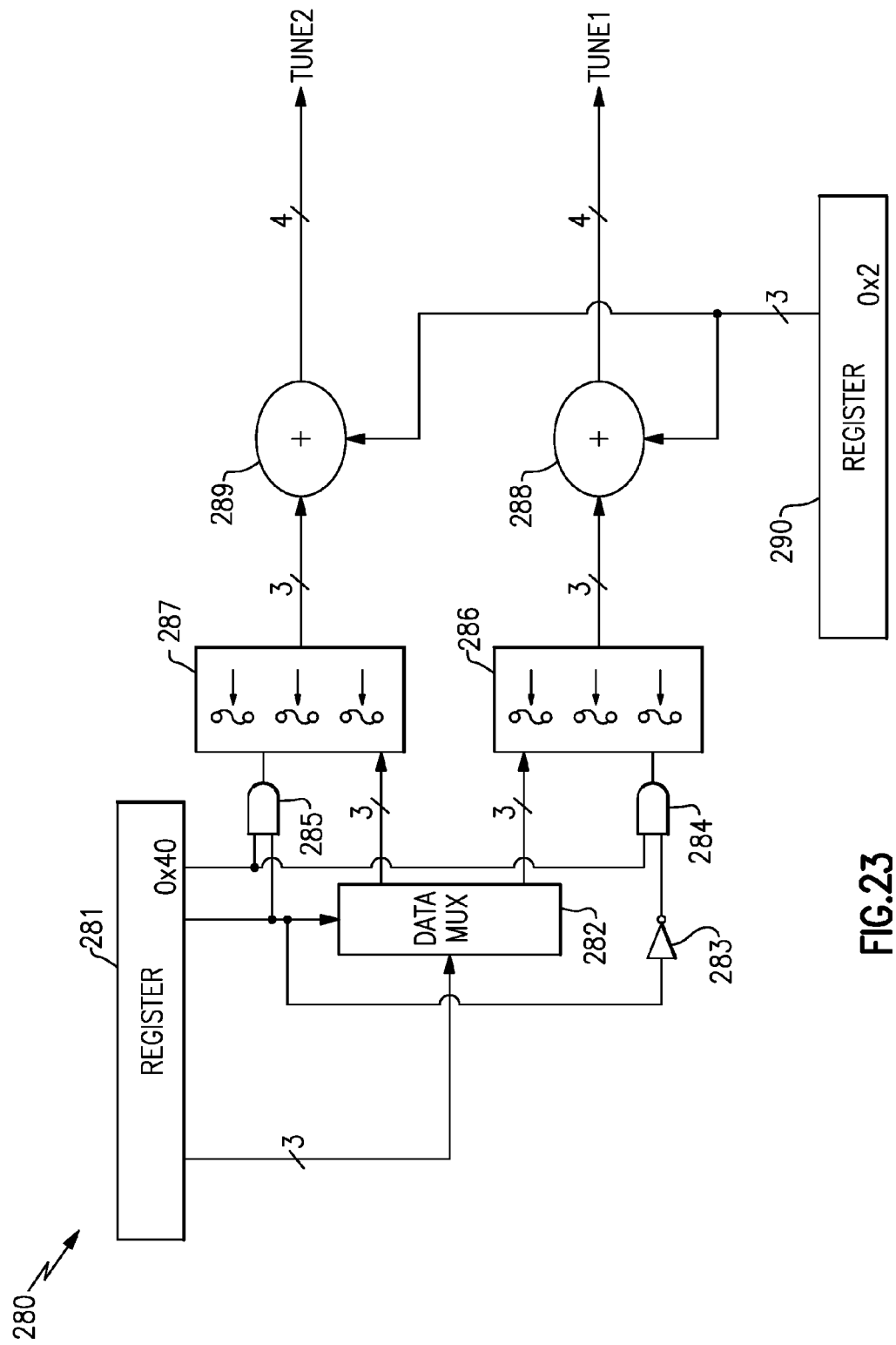
FIG. 23 is a schematic diagram of a trim and control circuit according to an embodiment.

FIG. 23 is a schematic diagram of a trim and control circuit 280 according to an embodiment. The trim and control circuit 280 is an example of the trim and control circuit 272 of FIG. 22 and can be implemented in connection with any of the tunable filters and/or tunable circuits discussed herein. The trim and control circuit 280 can set the state of a tunable impedance circuit, such as the tunable capacitance circuit of the tunable filter 220 of FIG. 17C, based on trim data and tuning state data. A trim and control circuit can implement any suitable number of trim states and any suitable number of notch tuning states.

As illustrated, the trim and control circuit 280 includes a first register 281, a data multiplexer 282, an inverter 283, an AND gate 284, an AND gate 285, a first fuse block 286, a second fuse block 287, a first adder 288, a second adder 289, and a second register 290. The first register 281 can provide signals to the data mux 282 and control logic including the inverter 283 and AND gates 284 and 285 to store the trim data to the first fuse block 286 or the second fuse block 287. The fuse blocks 286 and 287 each include fuse elements (e.g., fuses and/or anti-fuses). In certain implementations, the fuse elements can be implemented using semiconductor-on-insulator, such as silicon-on-insulator technology. Such fuse elements can be implemented by eFUSE technology. According to some other implementations, the trim data can be stored in another suitable type of non-volatile memory.

The illustrated trim and control circuit 280 can set a tunable notch filter into 16 states. Each of the fuse blocks 286 and 287 shown in FIG. 23 is arranged to store 3 bits of trim data. Accordingly, this trim data stored by each fuse block can implement eight process trim states. The second register 290 can provide signals for notch tune states. As illustrated, the second register provides three bits of notch tuning data. Accordingly, this notch tuning data can implement eight notch tuning states. Tuning data can be generated by adding trim data from a fuse block with notch tuning data. By adding the trim data with the notch tuning data, the tuning data can shift a frequency response of the tunable filter by an offset represented by the trim data. This can improve performance of the tunable filter. Adding the trim data with the notch tuning data to generate tuning data can be efficiently implemented without more complicated circuitry such as a multiplier. As shown in FIG. 23, the first adder 288 can add 3 bits of trim data from the first fuse block 286 with 3 bits of notch tuning data from the second register 290 to generate 4 bits first tuning data TUNE1. The 4 bits of first tuning data TUNE1 can set an adjustable impedance circuit of a tunable notch filter into 16 different states. For instance, each bit of the first tuning data TUNE1 can control a switch of the tunable capacitance circuit of the tunable filter 220 of FIG. 17C.

A trim and control circuit can be implemented in connection with any suitable number of tunable notch filters. Any of the principles and advantages discussed herein can be implemented in connection with a device having two or more tunable notch filters. For instance, trim data can be provided to two notch filters. As an example, the two notch filters can be associated with two antennas, such as a primary antenna and a diversity antenna. As shown in FIG. 23, the second adder 289 can add 3 bits of trim data from the second fuse block 87 with 3 bits of notch tuning data from the second register 290 to generate 4 bits second tuning data TUNE2 for a second tunable notch filter associated with a different antenna than the first tuning data TUNE1. Any of the principles and advantages discussed herein can be implemented in connection with a device having two or more antennas. Any of the principles and advantages of the trim and control circuits discussed herein can be implemented in connection with any suitable tunable circuit, such as any of the contour tuning circuits discussed herein.

Figure 24:
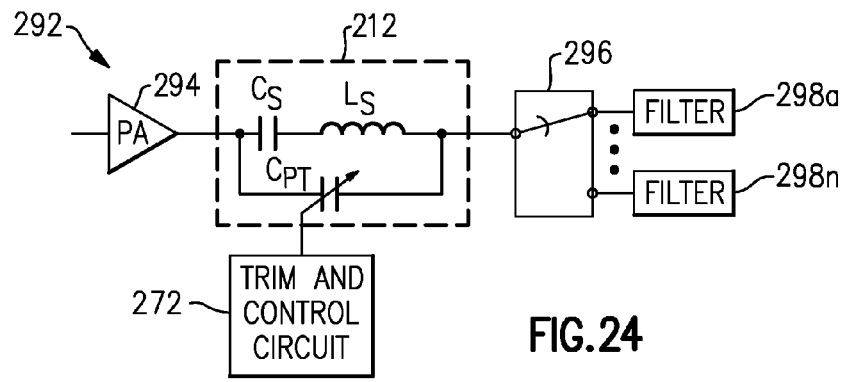
FIG. 24 is a schematic diagram of a radio frequency system with a tunable notch filter according to an embodiment.
Figure 25:
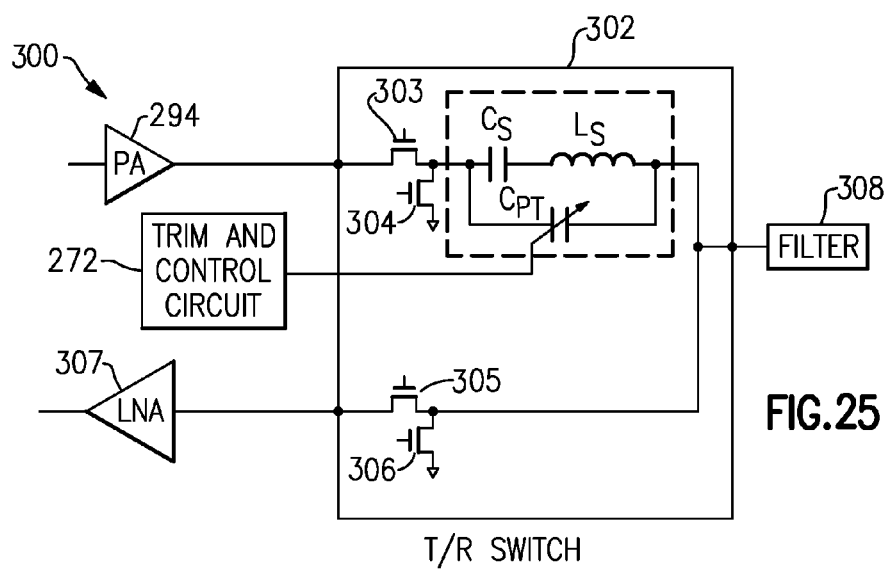
FIG. 25 is a schematic diagram of a radio frequency system with a tunable notch filter according to another embodiment.

Any of principles and advantages of the tunable notch filters discussed herein can be implemented in any suitable application that could benefit from a tunable notch filter, such as applications in which a tunable notch filter is in a radio frequency signal path associated with a common port of a multi-throw switch. For instance, a tunable notch filter can be arranged to filter out harmonics associated with a radio frequency signal amplified by a power amplifier. Such a tunable notch filter can be implemented in a transmit signal path such that the tunable notch filter should not add insertion loss to a receive path. FIGS. 24 and 25 illustrate example radio frequency systems in which a tunable notch filter can filter out a harmonic of an amplified radio frequency signal provided by a power amplifier. Any combination of features of the tunable notch filters discussed herein can be implemented in connection with any suitable principles and advantages discussed with reference to the radio frequency systems of FIGS. 24 and/or 25.

FIG. 24 is a schematic diagram of a radio frequency system 292 with a tunable notch filter 212 according to an embodiment. As illustrated, the RF system 292 includes a tunable notch filter 212, a trim and control circuit 272, a power amplifier 294, a multi-throw switch 296, and filters 298a to 298n. The tunable notch filter 212 of FIG. 24 is in series in a signal path between the power amplifier 294 and a common port of the multi-throw switch 296. The power amplifier 294 can be any suitable power amplifier. For instance, the power amplifier 294 can be arranged to amplify radio frequency signals in a plurality of different frequency bands. An amplified RE signal provided by the power amplifier 294 can have a harmonic frequency component due to non-linearities of a power amplifier transistor. The power amplifier transistor can be, for example, a gallium arsenide (GaAs) transistor, a metal oxide semiconductor (MOS) transistor, or a silicon germanium (SiGe) transistor. Moreover, any of the power amplifiers discussed herein can be implemented by field effect transistors and/or bipolar transistors, such as heterojunction bipolar transistors.

The trim and control circuit 272 can set the state of the tunable notch filter 12 to correspond to a frequency band of radio frequency signal being amplified by the power amplifier. Accordingly, a harmonic frequency component such as a second harmonic of an amplified RF signal provided by the power amplifier 294 can be suppressed by the tunable notch filter 212. The tunability of the tunable notch filter 212 can enable the harmonic frequency components associated with several frequency bands to be selectively filtered out using one filter. This can filter out unwanted harmonics near a source that creates such unwanted harmonics.

The multi-throw switch 296 can selectively electrically couple the output of the power amplifier 294 to a particular filter of the illustrated filters 298a to 298n. The multi-throw switch 296 can be a hand select switch and two or more of the filters 298a to 298n can be associated with different frequency bands. The filters 298a to 298n can represent transmit filters of respective duplexers. With the tunable notch filter 212, the filters 298a to 298n can be simplified and/or have less stringent specifications due to notch filtering in the signal path from the output of the power amplifier 294 to the common port of the multi-throw switch 296. The multi-throw switch 296 can have any suitable number of throws and a corresponding number of filters 298a to 298n can be coupled to I/O ports of the multi-throw switch 296.

FIG. 25 is a schematic diagram of a radio frequency system 300 with a tunable notch filter 212 according to another embodiment. As illustrated, the RF system 300 includes a tunable notch filter 212, a trim and control circuit 272, a power amplifier 294, a multi-throw switch 302 including series switches 303 and 305 and shunt switches 304 and 306, a low noise amplifier 307, and a filter 308. The tunable notch 212 of FIG. 25 is in a transmit signal path between the power amplifier 294 and the filter 308. Accordingly, the tunable notch filter 212 should not add insertion loss to the illustrated receive path. The illustrated multi-throw switch 302 is a transmit/receive switch that can selectively electrically connect the filter 308 to either a transmit path or a receive path. The filter 308 can be in a signal path between the common port of the multi-throw switch 302 and an antenna port.

Any of the multi-throw switches discussed herein can include a series switch and a shunt switch for each throw. As shown in FIG. 25, the series switch 303 and the shunt switch 304 implement a first throw the multi-throw switch 302 and the series switch 305 and the shunt switch 306 implement a second throw the multi-throw switch 302. As also shown in FIG. 25, the series switch and the shunt switch for each throw can be implemented by a field effect transistor. In the illustrated electronic system 300, the tunable notch filter can be implemented in a signal path between the series switch 303 of the first throw and the common port of the multi-throw switch 302. Accordingly, the tunable notch filter 212 of FIG. 25 can suppress harmonics from the power amplifier 294 and the series switch 303.

Figure 26A:
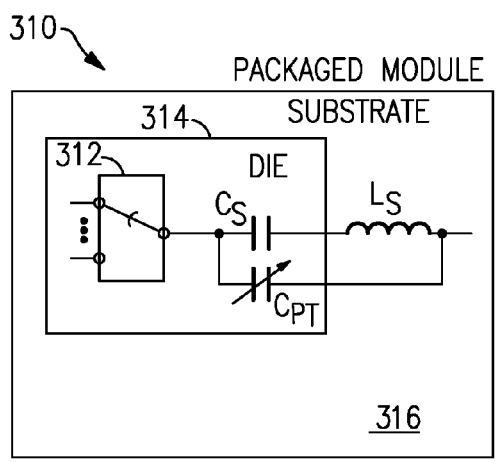
FIG. 26A is a schematic diagram of a packaged module that includes a tunable notch filter according to an embodiment.
Figure 26B:
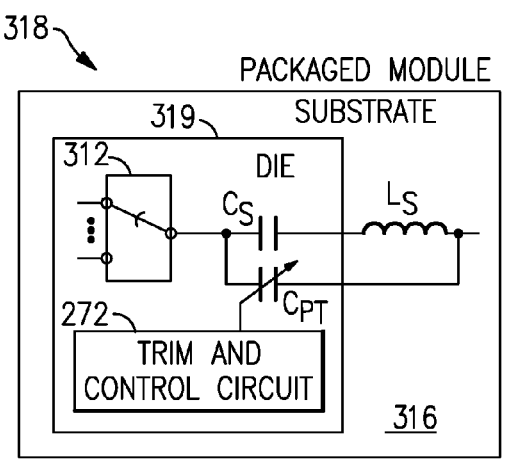
FIG. 26B is a schematic diagram of a packaged module that includes a tunable notch filter according to an embodiment.

FIGS. 26A and 26B are schematic diagrams of illustrative packaged modules. Such packaged modules can include a semiconductor die and one or more passive components on a packaging substrate enclosed within a common package. Some such packaged modules can be multi-chip modules. The semiconductor die can be manufactured using any suitable process technology. As one example, the semiconductor die can be a semiconductor-on-insulator die, such as a silicon-on-insulator die.

FIG. 26A is a schematic diagram of a packaged module 310 that includes a tunable notch filter according to an embodiment. As shown in FIG. 26A, the packaged module 310 can include a semiconductor die 314 and the inductor $L_S$ of a tunable notch filter on a packaging substrate 316. The semiconductor die 314 can include a multi-throw switch 312, the series capacitor $C_S$ of the tunable filter, and the tunable capacitance circuit $C_{PT}$ of the tunable filter. The multi-throw switch 312 can be arranged, for example, as an antenna switch or as a band select switch. The inductor $L_S$ can be implemented as a spiral trace on the packaging substrate 316 or in any other suitable manner to provide desired characteristics for a tunable notch filter.

FIG. 26B is a schematic diagram of a packaged module 318 that includes a tunable notch filter according to an embodiment. The packaged module 318 is like the packaged module 310 except that the semiconductor die 319 of packaged module 318 includes a trim and control circuit 272.

Figure 27:
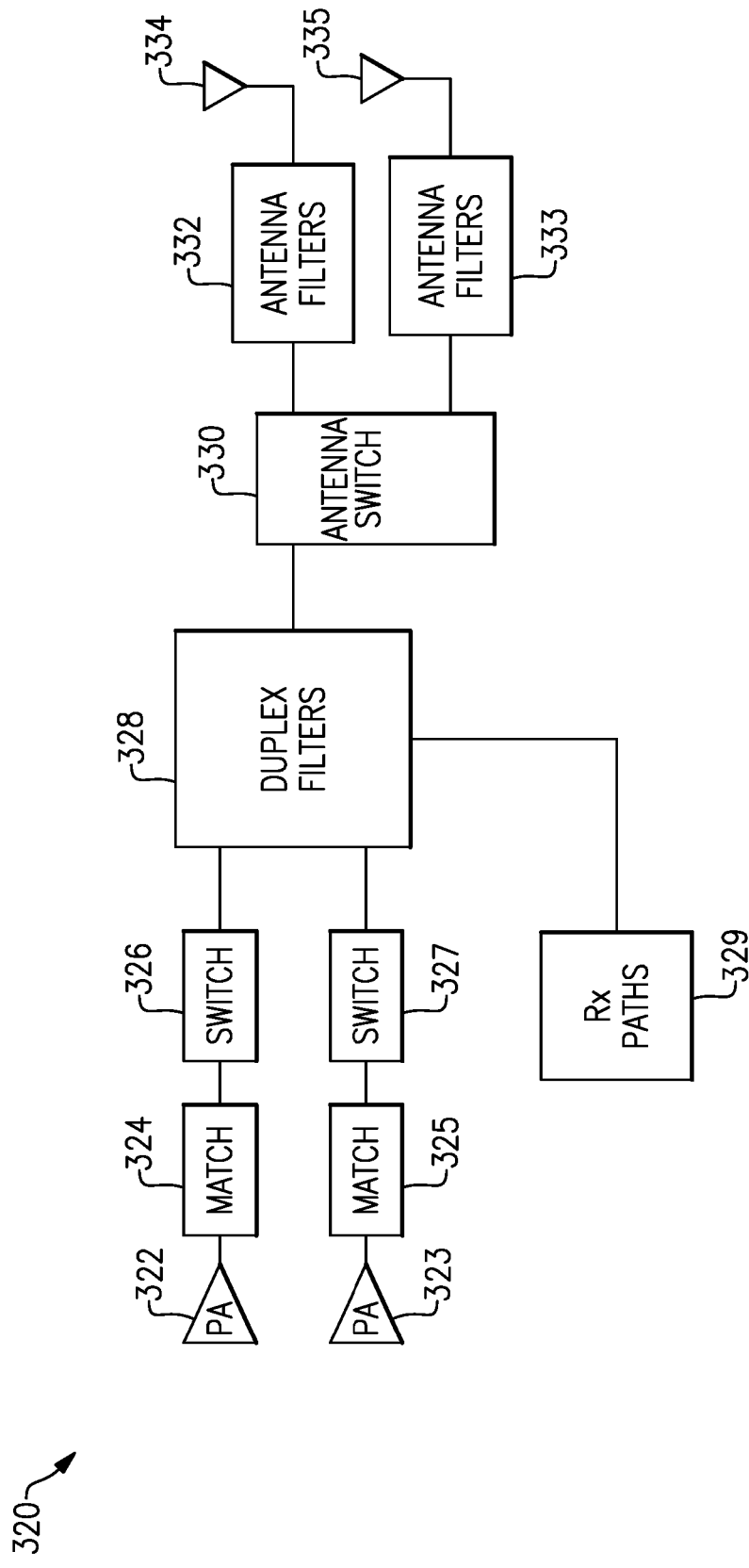
FIG. 27 is a schematic diagram of an RF system according to an embodiment.

FIG. 27 is a schematic diagram of an RF system 320 according to an embodiment. The RF system 320 can be referred to as an RF front end. An RF front end can include circuitry coupled between a baseband processor and an antenna. For instance, an RF front end can include circuitry coupled between a mixer and an antenna. The RF system 320 can include one or more tunable notch filters in accordance with the any principles and advantages discussed herein.

As illustrated, the RF system 320 includes power amplifiers 322 and 323, matching networks 324 and 325, RF switches 326 and 327, duplex filters 328, receive signal paths 329, an antenna switch 330, antenna filters 332 and 333, and antennas 334 and 335, The first power amplifier 322 and the second power amplifier 323 can be associated with different frequency bands and/or different triodes of operation. Each of these power amplifiers can amplify RF signals. Matching networks 324 and 325 provide impedance matching for outputs of power amplifiers 322 and 323, respectively, to reduce reflections and to improve signal quality.

In certain embodiments, a tunable notch filter can be implemented in connection with the matching network 324 and/or the matching network 325, for example, as described with reference to FIG. 24. The RF switch 326 can electrically connect the output of the first power amplifier 322 to a selected transmit filter of the duplex filters 328. Similarly, the RF switch 327 can electrically connect the output of the second power amplifier 323 to a selected transmit filter of the duplex filters 328. The RF switches 326 and/or the RF switch 327 can be multi-throw switches.

The receive paths 329 can include a low noise amplifier and a multi-throw switch to electrically connect the low noise amplifier to a selected receive filter of the duplex filers 328. A tunable notch filter can be coupled between a common port of the multi-throw switch of the receive paths 329 and the low noise amplifier.

An antenna switch 330 can be coupled between the duplex filters 328 and antenna filters 332. The antenna switch 330 can include a multi-throw switch and control functionality to electrically couple a selected duplexer in the duplex filters 328 to the antenna 334. The duplex filters 328 can include a plurality of duplexers. Each of these duplexers can include a transmit filter and a receive filter. The antenna filters 332 are coupled between the duplex filters 328 and a first antenna 334. The antenna 334 can be a primary antenna. The antenna 334 can be an antenna of a mobile device, such as a mobile phone.

The antenna filters 332 can filter radio frequency signals propagating between the antenna switch 330 and the antenna 334. The antenna filters 332 can include a tunable notch filter. Accordingly, the tunable notch filter can filter radio frequency signals propagating between the antenna switch 330 and the antenna 334. The antenna filters 332 can also include another filter, such as a low pass filter, in series with the tunable notch filter in a signal path between the antenna switch 330 and the antenna 334.

The antenna switch 330 can include a multi-throw multi-pole switch. In the RF system 320, the antenna switch 330 includes two poles. The first pole is associated with the first antenna 334 and the second pole is associated with the second antenna 336. The antenna filters 333 can include a tunable notch filter. The antenna filters 333 can include one or more features of the antenna filters 332.

Figure 28A:
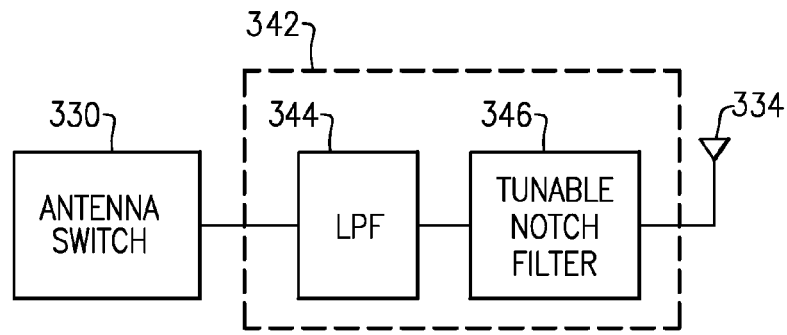
FIG. 28A is a schematic block diagram showing more details of antenna filters according to an embodiment.

FIG. 28A is a schematic block diagram showing more details of antenna filters according to an embodiment. The antenna filters 342 of FIG. 28A are an example of the antenna filters 332 of FIG. 27. The antenna filters 342 can include a notch filter for providing a zero at a second harmonic of a carrier and also provide a frequency trap at third harmonics of the carrier between the antenna switch module 330 and the antenna 334. The second harmonic zero can be tuned with the tunable impedance circuit of the tunable notch filter. The antenna filters 342 are coupled between the antenna switch module 330 and the antenna 334. As illustrated, the antenna filters 342 include a low pass filter 344 and a tunable notch filter 346. The low pass filter 243 of FIG. 18A is an example of the low pass filter 344. The tunable notch filter 346 can implement any of the principles and advantages of the tunable notch filters discussed herein. As shown in FIG. 28A, the tunable notch filter 346 can be in the signal path between the low pass filter 344 and the antenna 334.

Figure 28B:
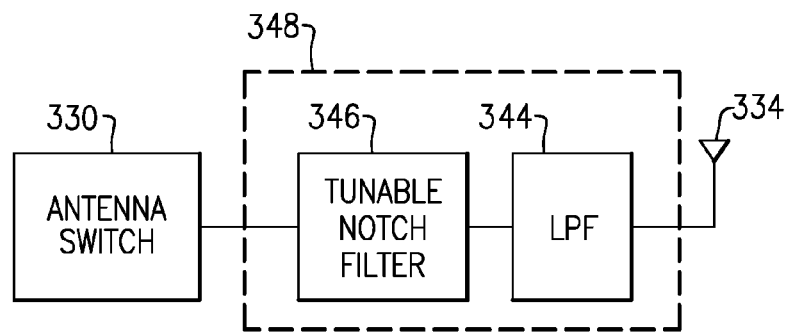
FIG. 28B is a schematic block diagram showing more details of antenna filters according to another embodiment.

FIG. 28B is a schematic block diagram showing more details of antenna filters according to another embodiment. The antenna filters 348 of FIG. 28B are like the antenna filters 344 of FIG. 28A except that the low pass filter 344 is coupled between the tunable notch filter 346 and the antenna 334. As shown in FIG. 28B, the tunable notch filter 346 can be in the signal path between the antenna switch module 330 and the low pass filter 344. While FIG. 28A and FIG. 28B illustrate a tunable notch filter 346 in series with a low pass filter 344, a tunable notch filter in accordance with any of the principles and advantages discussed herein can be implemented in series with a band pass filter or a high pass filter in some other embodiments.

Figure 29:
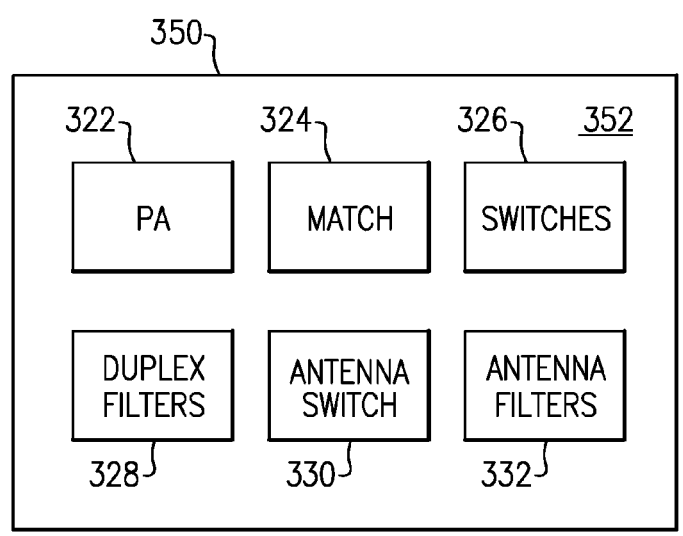
FIG. 29 is a schematic block diagram of a module according to an embodiment.

FIG. 29 is a schematic block diagram of a module 350 according to an embodiment. The illustrated module 350 includes a packaging substrate 352 on which a power amplifier 322, a matching network 324, a switch (e.g., a band select switch) 326, duplex filters 328, an antenna switch 330, and antenna filters 332 that include a tunable notch filter are arranged. The illustrated elements can be enclosed within a common package. In some other embodiments, the antenna filters 332 can be implemented in a module and packaged with one or more of the illustrated elements of FIG. 29. Switches of the antenna switch 330 and/or of embodiments of the tunable notch filter of the antenna filters 332 can be implemented in semiconductor-on-insulator technology such as silicon-on-insulator technology.

Tunable Notch Filter and Contour Tuning Circuit

A radio frequency system can include a contour tuning circuit and a tunable notch filter. Such a radio frequency system can be implemented in accordance with any suitable principles and advantages discussed herein, such as any of the principles and advantages related to tuning a shunt impedance and/or to a tunable notch filter. In certain embodiments, combining features related to contour tuning and a tunable notch filter can synergistically create an improved radio frequency system. For instance, an impedance associated with a selected radio frequency signal path coupled to a tunable notch filter by way of a radio frequency switch can be matched using a contour tuning circuit. The contour tuning circuit can match different impedances associated with different radio frequency signal paths with a consolidated tunable matching network. The tunable notch filter can also be tuned to reject a harmonic of a radio frequency associated with the selected radio frequency signal path to prevent the harmonic from degrading receiver sensitivity. The circuit topology of the tunable notch filter can also reduce a large signal amplitude presented to a tunable impedance circuit of the tunable notch filter.

Figure 30:
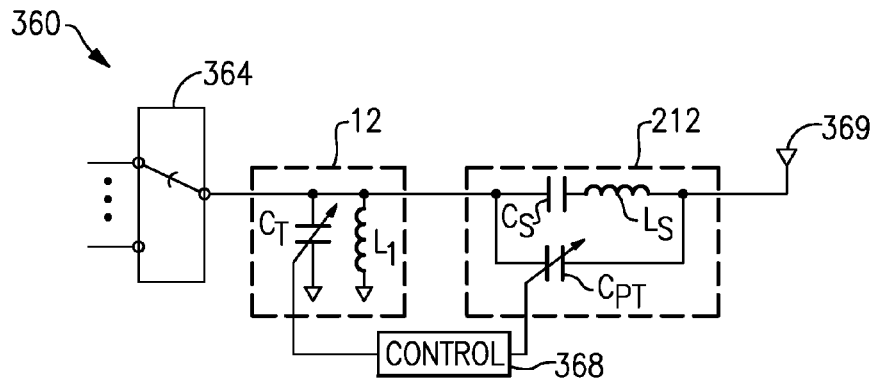
FIG. 30 is a schematic diagram of a radio frequency system that includes a tunable notch filter and a contour tuning circuit according to an embodiment.
Figure 31:
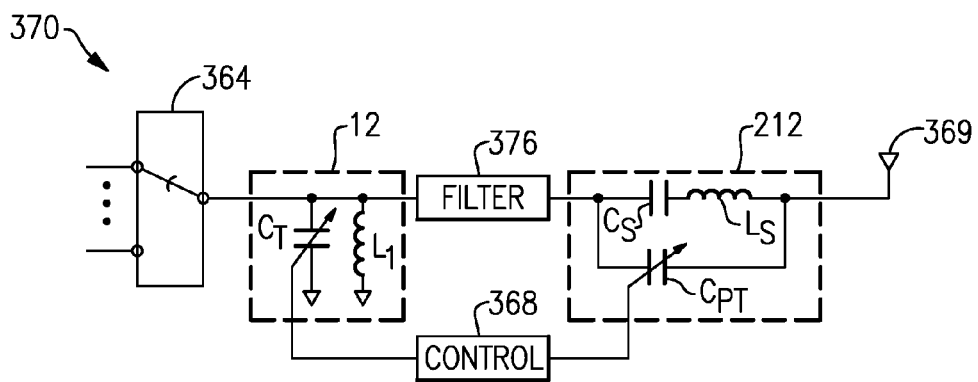
FIG. 31 is a schematic diagram of a radio frequency system that includes a tunable notch filter and a contour tuning circuit according to another embodiment.
Figure 32:
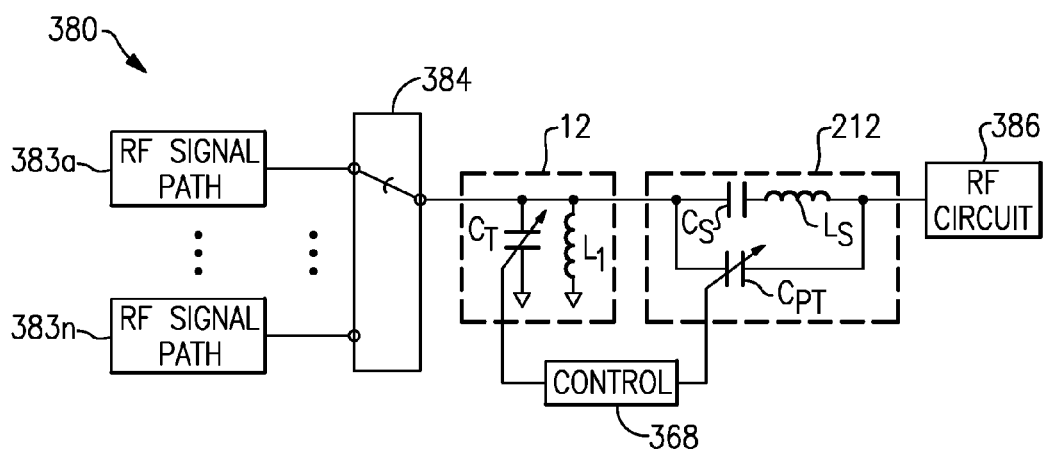
FIG. 32 is a schematic diagram of a radio frequency system that includes a tunable notch filter and a contour tuning circuit according to another embodiment.

FIGS. 30, 31, and 32 illustrate example radio frequency systems that include a contour tuning circuit and a tunable notch filter. The contour tuning circuit and tunable notch filter in each of these systems are coupled in a signal path between a common port of a multi-throw switch and either an antenna or a radio frequency circuit. The contour tuning circuit and/or the tunable notch filter can be tuned based on which radio signal path the multi-throw switch couples to the contour tuning circuit and the tunable notch filter. Accordingly, the contour tuning circuit can provide impedance matching for a selected radio frequency signal path and the tunable notch filter can be adjusted to reject a frequency corresponding to the selected radio frequency signal path.

FIG. 30 is a schematic diagram of a radio frequency system 360 according to an embodiment. As illustrated, the radio system 360 includes a contour tuning circuit 12, a tunable notch filter 212, an antenna switch 364, a control circuit 368, and an antenna 369 arranged to transmit and receive radio frequency signals.

The antenna switch 364 can be implemented in accordance with any suitable principles and advantages discussed herein in connection with multi-throw switches. As illustrated, antenna switch 364 has multiple throws. The antenna switch 364 can have any suitable number of throws, such as least 8 throws in certain embodiments. The antenna switch 364 is illustrated as having a single pole and a single common port. In some other embodiments, the antenna switch 364 can have two or more poles.

The contour tuning circuit 12 can be implemented in accordance with any suitable principles and advantages discussed herein in connection with tunable circuits. The illustrated contour tuning circuit 12 is a tunable circuit configured to adjust an effective shunt impedance in a signal path from the antenna switch 364 to the antenna 369 in association with a state of the antenna switch 364 changing. For instance, the contour tuning circuit 12 can adjust the effective shunt impedance before, during, or after the state of the antenna switch 364 changes. This can adjust the effective shunt impedance for providing different impedance matching for different respective states of the antenna switch 364. As illustrated, the tunable circuit includes a shunt inductor $L_1$ in parallel with a tunable capacitance circuit $C_T$.

The tunable note filter 212 can be implemented in accordance with any suitable principles and advantages discussed herein in connection with tunable notch filters. The tunable notch filter 212 is coupled in series between the antenna switch 364 and the antenna 369. The tunable notch filter 212 is configured to filter a radio frequency signal propagating between the antenna switch 364 and the antenna 369. For instance, the radio frequency signal can propagate from the antenna switch 364 to the antenna 369 to transmit the radio frequency signal from the antenna 369. As another example, the radio frequency signal can propagate from the antenna 369 to antenna switch 364 to the facilitate processing a signal received from the antenna 369. The tunable notch filter 212 can be tuned so as to have a frequency response with a notch at a second harmonic frequency of a radio frequency signal propagating between the antenna switch 364 and the antenna 369. As illustrated, the tunable notch filter 212 includes a series LC circuit in parallel with a a tunable capacitance circuit $C_{PT}$. The series LC circuit can be inductive at frequencies above a resonant frequency of the series LC circuit so as to create a parallel resonance with the tunable capacitance circuit $C_{PT}$.

The control circuit 368 can control the tunable capacitance circuit $C_{PT}$ such that an effective capacitance in parallel with the series LC circuit of the tunable notch filter 212 corresponds to a frequency of the radio frequency signal propagating between the radio frequency switch 364 and the antenna 369.

The control circuit 368 can the tunable capacitance circuit $C_T$ of the contour tuning circuit 12 on as to provide a first effective shunt impedance when a first throw of the antenna switch 364 is active and to provide a second effective impedance when a second throw of the antenna switch 364 is active. This can provide impedance matching tailored to a selected radio frequency signal path being coupled to the common port of the antenna switch 364. For instance, the control circuit 368 can set a state of the tunable capacitance circuit $C_T$ based on an impedance associated with a trace arranged to route from a duplexer to a throw of the antenna switch 364 that is activated.

In some embodiments, a trim and control circuit including non-volatile memory storing trim data can set a state of the tunable capacitance circuit $C_T$ of the contour tuning circuit 12 and/or the tunable capacitance circuit $C_{PT}$ the tunable notch filter 212. Such a trim and control circuit can implement any suitable combination of features of the trim and control circuits discussed herein.

FIG. 31 is a schematic diagram of a radio frequency system 370 that includes a tunable notch filter 212 and a contour tuning circuit 12 according to another embodiment. The radio frequency system 370 is like the radio frequency system 360 of FIG. 30 except that the radio frequency system 370 includes another filter 376 in a signal path between the antenna switch 364 and the antenna 369. The filter 376 can be any suitable filter. The filter 376 can be a low pass filter, a bandpass filter, or a high pass filter. In certain embodiments, the filter 376 can be implemented in accordance with any of the principles and advantages of the filter 46 of FIG. 5 and/or the 243 filter of FIG. 18A. As illustrated, the filter 376 can be coupled in a signal path between the contour tuning circuit 12 and the tunable notch filter 376 in certain embodiments.

FIG. 32 is a schematic diagram of a radio frequency system 380 that includes a tunable notch filter 212 and a contour tuning circuit 12 according to another embodiment. The radio frequency system 380 is like the radio frequency system 360 of FIG. 30 except that the radio frequency system 380 includes (1) RF signal paths 383a to 383n coupled to a multi-throw switch 386 and (2) a radio frequency circuit 386 in place of the antenna 369 of FIG. 30. FIG. 32 illustrates that a contour tuning circuit can be implemented with a tunable notch filter in a different context that between an antenna switch and an antenna port. The RF signal paths 383a to 383n can be any suitable RF signal paths. For instance, the RF signal paths 383a to 383 can each include a duplexer and a signal route coupled to a port of the multi-throw switch 364. The radio frequency circuit 386 can be any suitable radio frequency circuit configured to process a radio frequency signal. As one example, the radio frequency circuit 386 can include a power amplifier 386 configured to provide an amplified radio frequency signal to the multi-throw switch 384.

According to some other embodiments, a tunable notch filter can be implemented in a transmit path and a contour tuning circuit can be implemented in a receive path. For instance, a tunable notch filter can be coupled between an output of a power amplifier and a duplexer (for example, as show in FIG. 24 or FIG. 25) and a contour tuning circuit can be coupled between a multi-throw receive switch and a low noise amplifier (for example, as shown in FIG. 11B).

Figure 33:
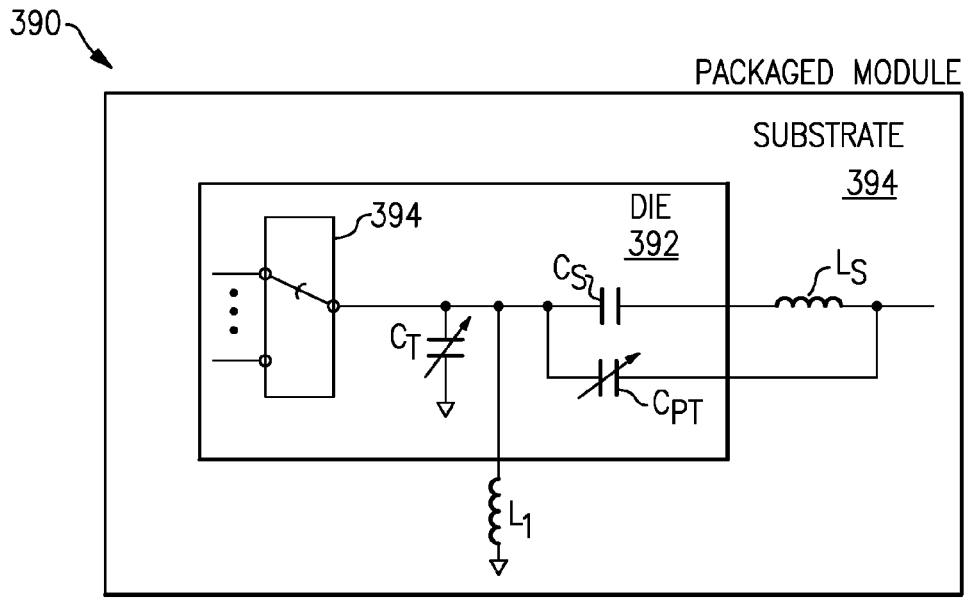
FIG. 33 is a schematic diagram of a packaged module that includes a tunable notch filter and a contour tuning circuit according to an embodiment.
Figure 34:
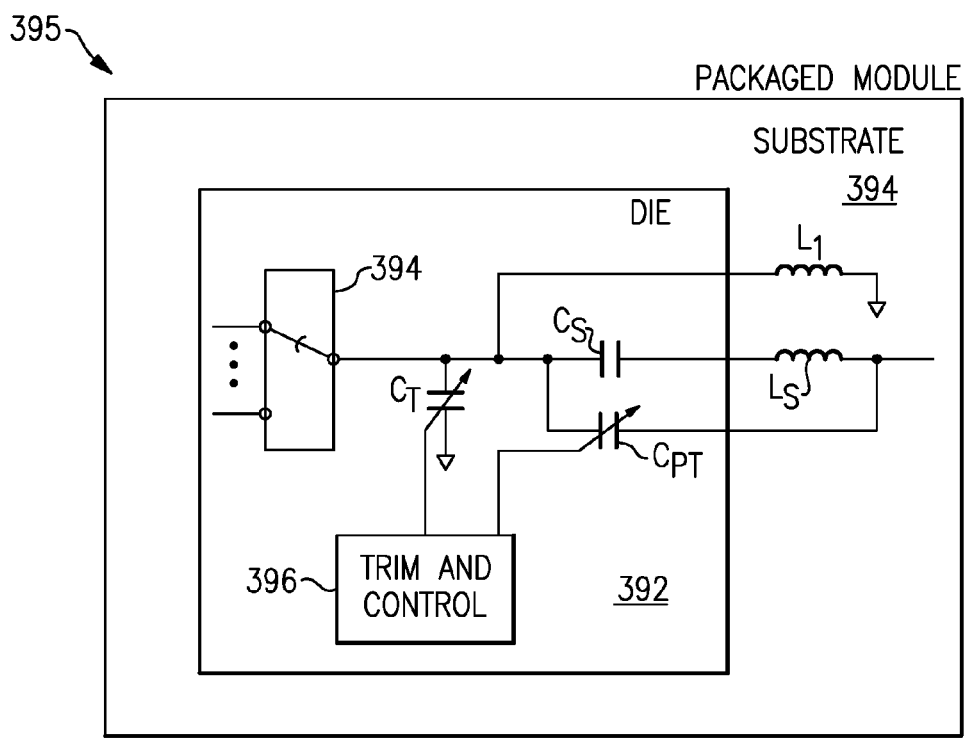
FIG. 34 is a schematic diagram of a packaged module that includes a tunable notch filter and a contour tuning circuit according to another embodiment.

FIGS. 33 and 34 illustrate example packaged modules that include a contour tuning circuit and a tunable notch filter. The contour tuning circuit and the tunable notch filter can be implemented with any suitable principles and advantages discussed herein. These packaged modules include a semiconductor die and passive components on a packaging substrate enclosed within a common package. Some such packaged modules can be multi-chip modules. The semiconductor die can be manufactured using any suitable process technology. As one example, the semiconductor die can be a semiconductor-on-insulator die, such as a silicon-on-insulator die.

A packaged module can include a multi-throw switch configured to electrically connect a selected one of its input/output ports to a common port, a tunable circuit configured to adjust an effective shunt impedance coupled to the common port in association with a state of the multi-throw switch changing, and a tunable notch filter coupled in series in a radio frequency signal path associated with the common port. The multi-throw switch, the tunable circuit, and the tunable notch filter being can be included within a common package. Some such packaged modules can also include a power amplifier within the common package.

FIG. 33 is a schematic diagram of a packaged module 390 that includes a tunable notch filter and a contour tuning circuit according to an embodiment. As shown in FIG. 33, the packaged module 390 can include a semiconductor die 392, an inductor $L_1$ of a contour tuning circuit, and an inductor $L_S$ of a tunable notch filter on a packaging substrate 394. The semiconductor die 392 can include a multi-throw switch 394, the series capacitor $C_S$ of the tunable filter, and the tunable capacitance circuit $C_{PT}$ of the tunable notch filter. The multi-throw switch 394 can be arranged, for example, as an antenna switch. The illustrated inductor $L_S$ and/or $L_1$ can be implemented as a spiral trace on the packaging substrate 394 or/or in any other suitable manner to provide desired characteristics for such inductors.

FIG. 34 is a schematic diagram of a packaged module 395 that includes a tunable notch filter and a contour tuning circuit according to another embodiment. The packaged module 390 is like the packaged module 390 of FIG. 34 except that the semiconductor die 392 of packaged module 395 includes a trim and control circuit 396. The trim and control circuit 396 can include memory, such as non-volatile memory, arranged to store trim data. The trim and control circuit 396 can set a state of the tunable notch filter and/or on the contour tuning circuit based on the trim data.

Wireless Communication Device

Figure 35:
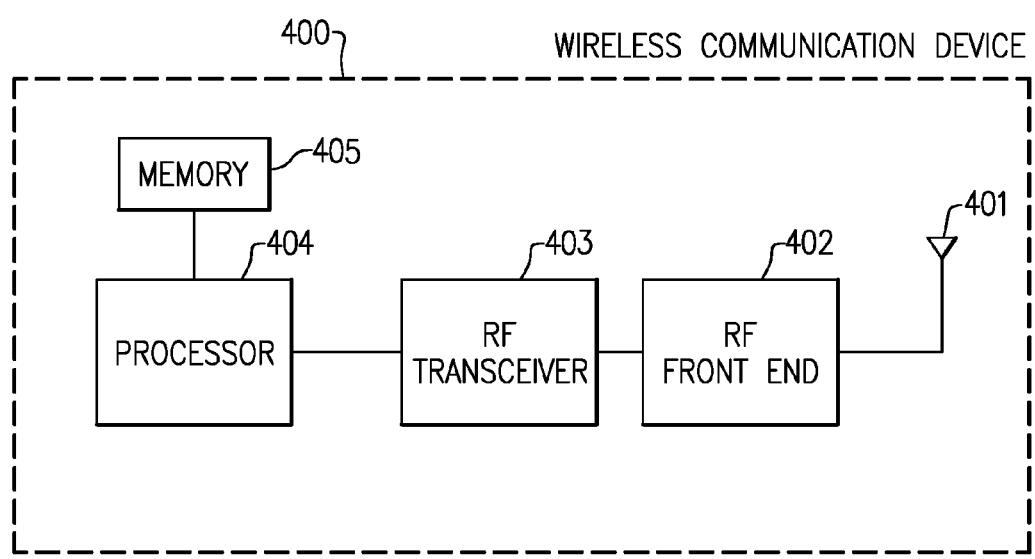
FIG. 35 is a schematic block diagram of illustrative wireless communication device that includes a tuning circuit and/or a tunable notch filter in accordance with one or more embodiments.

FIG. 35 is a schematic block diagram of illustrative wireless communication device 400 that includes a tunable notch filter and/or a contour tuning circuit in accordance with one or more embodiments. The wireless communication device 400 can be any suitable wireless communication device. For instance, a wireless communication device 400 can be a mobile phone, such as a smart phone. As illustrated, the wireless communication device 400 includes an antenna 401, an RF front end 402, an RF transceiver 403, a processor 404, and a memory 405. The antenna 401 can transmit RF signals provided by the RF front end 402. The antenna 401 can provided received RF signals to the RF front end 402 for processing.

The RF front end 402 can include one or more power amplifiers, one or more low noise amplifiers, RF switches, receive filters, transmit filters, duplex filters, or any combination thereof. The RF front end 402 can be configured to transmit and receive RF signals associated with any suitable communication standards.

Any of the tunable notch filters discussed herein can be implemented in the RF front end 402. For instance, a tunable notch filter can be included in antenna filters of the RF front end 402 in a signal path between an antenna switch and the antenna 401. Alternatively or additionally, a tunable notch filter can be in a signal path between a power amplifier of the RF front end 402 and an RF switch of the RF front end 402.

Any of the contour tuning circuits discussed herein can be implemented in the RF front end 402. For instance, a contour tuning circuit can be included in antenna filters of the RF front end 402 in a signal path between an antenna switch and the antenna 401. Alternatively or additionally, a contour tuning circuit can be in a signal path between a common port of a multi-throw receive switch of the RF front end 402 and a low noise amplifier of the RF front end 407.

According to certain embodiments, the RF front end 402 includes a tunable notch filter and a contour tuning circuit. As an example, a contour tuning circuit and a tunable notch filter can be included in antenna filters of the RF front end 402 in a signal path between an antenna switch and the antenna 401.

The RF transceiver 403 can provide RF signals to the RF front end 40 for amplification and/or other processing. The RF transceiver 403 can also process an RF provided by a low noise amplifier of the RF front end 402. The RF transceiver 403 is in communication with the processor 404. The processor 404 can be a baseband processor. The processor 404 can provide any suitable base band processing functions for the wireless communication device 400. The memory 405 can be accessed by the processor 404. The memory 405 can store any suitable data for the wireless communication device 400.

Applications

Any of the principles and advantages discussed herein can be applied to other systems, not just to the systems described above. The elements and operations of the various embodiments described above can be combined to provide further embodiments. Some of the embodiments described above have provided examples in connection with antenna filters, RF modules and/or wireless communications devices. However, the principles and advantages of the embodiments can be used in connection with any other systems, apparatus, or methods that benefit could from any of the teachings herein. For instance, any suitable principles and advantages discussed herein can be implemented in an electronic system that coupled benefit from a contour tuning circuit and/or a shunt inductor in parallel with a tunable capacitance circuit. As another example, any suitable principles and advantages discussed herein can be implemented in an electronic system that could benefit from a tunable notch filter have one or more features discussed herein. Any of the principles and advantages discussed herein can be implemented in RF circuits configured to process radio frequency signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or a packaged radio frequency module, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, an electronic book reader, a personal digital assistant (PDA), a microwave, a refrigerator, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

CONCLUSION

Unless the context requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "electrically coupled", as generally used herein, refer to two or more elements that may be either directly electrically coupled, or electrically coupled by way of one or more intermediate elements. Likewise, the word "connected", as generally used herein, refers to two or more elements that may be either directly connected, or connected by way of one or more intermediate elements. A radio frequency signal can have a frequency in the range from 300 MHz to 300 GHz, such as in a range from about 450 MHz to about 6 GHz. Additionally, where appropriate, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. The word "or" in reference to a list of two or more items, where context permits, covers all of the following interpretations of the word: any of the items in the list, all of the items in the list, and any combination of the items in the list. The term "based on," as generally used herein, encompasses the following interpretations of the term: solely based on, or based at least partly on.

Moreover conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms. Furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. For example, circuit blocks described herein may be deleted, moved, added, subdivided, combined, and/or modified. Each of these circuit blocks may be implemented in a variety of different ways. Any of the circuits disclosed herein can be implemented by logically and/or functionally equivalent circuits. Any suitable combination of the elements and acts of the various embodiments described above can be combined to provide further embodiments.

What is claimed is:

1. A radio frequency circuit comprising:
an antenna switch having multiple throws;
a tunable circuit configured to adjust an effective shunt impedance in a signal path from the antenna switch to an antenna port in association with a state of the antenna switch changing;

a tunable notch filter coupled in series between the antenna switch and the antenna port, the tunable notch filter being configured to filter a radio frequency signal propagating between the antenna switch and the antenna port; and a control circuit configured to set a state of the tunable circuit based on an impedance associated with a trace arranged to route from a duplexer to a throw of the antenna switch that is activated.

2. The radio frequency circuit of claim 1 wherein the tunable notch filter includes a series LC circuit in parallel with a tunable capacitance circuit.

3. The radio frequency circuit of claim 2 wherein the series LC circuit is inductive at frequencies above a resonant frequency of the series LC circuit so as to create a parallel resonance with the tunable capacitance circuit.

4. The radio frequency circuit of claim 2 wherein the control circuit is further configured to control the tunable capacitance circuit such that an effective capacitance in parallel with the series LC circuit corresponds to a frequency of the radio frequency signal.

5. The radio frequency circuit of claim 2 wherein the tunable capacitance circuit and the antenna switch are integrated on a common semiconductor die.

6. The radio frequency circuit of claim 1 wherein the tunable notch filter is arranged to have a frequency response with a notch at a second harmonic frequency of the radio frequency signal.

7. The radio frequency circuit of claim 1 wherein the tunable circuit includes a shunt inductor in parallel with a tunable capacitance circuit.

8. The radio frequency circuit of claim 1 wherein the control circuit is configured to control the tunable circuit so as to provide a first effective shunt impedance when a first throw of the antenna switch is active and to provide a second effective impedance when a second throw of the antenna switch is active.

9. The radio frequency circuit of claim 1 wherein the antenna switch has at least 8 throws.

10. The radio frequency circuit of claim 1 further comprising a trim and control circuit including non-volatile memory storing trim data, the trim and control circuit configured to set a state of the tunable notch filter based on the trim data.

11. A packaged module comprising:
a multi-throw switch including input/output ports and a common port, the multi-throw switch configured to electrically connect a selected one of the input/output ports to the common port;
a tunable circuit configured to adjust an effective shunt impedance coupled to the common port in association with a state of the multi-throw switch changing;
a control circuit configured to set a state of the tunable circuit based on an impedance associated with a trace coupled to a selected throw of the multi-throw switch; and
a tunable notch filter coupled in series in a radio frequency signal path associated with the common port; the multi-throw switch, the tunable circuit, the control circuit, and the tunable notch filter being included within a common package.

12. The packaged module of claim 11 wherein the tunable circuit includes a shunt inductor in parallel with a tunable capacitance circuit.

13. The packaged module of claim 11 wherein the tunable notch filter includes a series LC circuit in parallel with a tunable capacitance circuit.

14. The packaged module of claim 11 wherein the tunable notch filter is configured to provide rejection at a second harmonic of a radio frequency signal propagating between the common port and the tunable notch filter.

15. The packaged module of claim 11 further comprising a trim and control circuit including memory arranged to store trim data, the trim and control circuit configured to set a state of the tunable notch filter based on the trim data.

16. The packaged module of claim 11 further comprising a power amplifier included within the common package.

17. A wireless communication device comprising:
an antenna configured to receive a radio frequency signal;
an antenna switch configured to electrically couple a first radio frequency signal path to the antenna in a first state and to electrically couple a second radio frequency signal path to the antenna in a second state;
a tunable circuit configured to adjust an effective shunt impedance in a signal path from the antenna switch to the antenna in association with a state of the antenna switch changing;
a control circuit configured to control the tunable circuit such that the effective shunt impedance is based on an impedance of the first radio frequency signal path between a duplexer and the antenna switch when the antenna switch is in the first state; and
a tunable notch filter coupled in series between the antenna switch and the antenna.

18. The wireless communication device of claim 17 wherein the tunable circuit is configurable into at least 8 states.

19. The wireless communication device of claim 17 configured as a mobile phone.

20. The wireless communication device of claim 17 further comprising duplexers coupled to the antenna switch by respective traces, the duplexers including the duplexer.

* * * * *